US010784414B2

(12) United States Patent
Umehara et al.

(10) Patent No.: US 10,784,414 B2
(45) Date of Patent: Sep. 22, 2020

(54) LIGHT SOURCE UNIT, LAMINATED MEMBER, AND DISPLAY AND LIGHTING APPARATUS INCLUDING THEM

(71) Applicant: Toray Industries, Inc., Tokyo (JP)

(72) Inventors: Masaaki Umehara, Otsu (JP); Takayuki Uto, Otsu (JP); Wataru Gouda, Otsu (JP); Jun Sakamoto, Shizuoka (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 16/086,694

(22) PCT Filed: Mar. 21, 2017

(86) PCT No.: PCT/JP2017/011153

§ 371 (c)(1),
(2) Date: Sep. 20, 2018

(87) PCT Pub. No.: WO2017/164155

PCT Pub. Date: Sep. 28, 2017

(65) Prior Publication Data

US 2019/0103521 A1 Apr. 4, 2019

(30) Foreign Application Priority Data

Mar. 25, 2016 (JP) ................................ 2016-061328
Mar. 25, 2016 (JP) ................................ 2016-061334
Nov. 18, 2016 (JP) ................................ 2016-224730

(51) Int. Cl.
*H01L 33/50* (2010.01)
*F21S 2/00* (2016.01)
(Continued)

(52) U.S. Cl.
CPC .............. *H01L 33/502* (2013.01); *F21S 2/00* (2013.01); *G02B 5/20* (2013.01); *G02F 1/1336* (2013.01);
(Continued)

(58) Field of Classification Search
CPC ...... H01L 33/502; H01L 33/505; H01L 33/50
See application file for complete search history.

(56) References Cited

U.S. PATENT DOCUMENTS 5,446,157 A 8/1995 Morgan et al.
5,623,375 A * 4/1997 Floch .................. G02B 5/0833 359/871
(Continued)

FOREIGN PATENT DOCUMENTS

CN 101451673 A 6/2009
CN 103053223 A 4/2013
(Continued)

OTHER PUBLICATIONS

Fedors, R., "A Method for Estimating Both the Solubility Parameters and Molar Volumes of Liquids", Polymer Engineering and Science, Feb. 1974, vol. 14, No. 2, pp. 147-154.
(Continued)

*Primary Examiner* — Donald L Raleigh
(74) *Attorney, Agent, or Firm* — RatnerPrestia

(57) ABSTRACT

A light source unit includes: a light source; a color conversion film containing an organic luminous material that converts incident light made incident from the light source into light with a longer wavelength than that of the incident light; and a laminated film comprising a constitution in which 11 or more layers of different thermoplastic resins are alternately laminated with each other.

23 Claims, 7 Drawing Sheets

(51) Int. Cl.

| | |
|---|---|
| ***G02B 5/20*** | (2006.01) |
| ***G09F 9/00*** | (2006.01) |
| ***G02F 1/13357*** | (2006.01) |
| ***H01L 27/146*** | (2006.01) |
| *F21Y 115/10* | (2016.01) |

(52) U.S. Cl.

CPC .......... *G02F 1/133605* (2013.01); *G09F 9/00* (2013.01); *H01L 27/14621* (2013.01); *H01L 33/50* (2013.01); *H01L 33/505* (2013.01); *F21Y 2115/10* (2016.08); *G02F 1/133603* (2013.01); *G02F 2001/133614* (2013.01)

(56) References Cited

U.S. PATENT DOCUMENTS

| | | | | |
|---|---|---|---|---|
| 6,921,589 | B2 * | 7/2005 | Kohama | H01L 51/0061 257/102 |
| 8,075,148 | B2 | 12/2011 | Nada | |
| 9,239,458 | B2 * | 1/2016 | Yoon | G02B 26/02 |
| 2001/0048492 | A1 * | 12/2001 | Natsuyama | G02F 1/13452 349/58 |
| 2003/0021851 | A1 | 1/2003 | Goswami et al. | |
| 2004/0145895 | A1 * | 7/2004 | Ouderkirk | H01L 33/46 362/260 |
| 2009/0147497 | A1 | 6/2009 | Nada | |
| 2009/0161037 | A1 | 6/2009 | Lazarev | |
| 2012/0138874 | A1 * | 6/2012 | Yuan | C09K 11/02 252/582 |
| 2013/0141681 | A1 | 6/2013 | Takahashi et al. | |
| 2013/0147345 | A1 | 6/2013 | Maeda et al. | |
| 2014/0175481 | A1 * | 6/2014 | Tischler | H01L 24/96 257/98 |
| 2016/0069538 | A1 | 3/2016 | Chang et al. | |
| 2017/0137706 | A1 | 5/2017 | Fujita et al. | |
| 2019/0103521 | A1 | 4/2019 | Umehara et al. | |

FOREIGN PATENT DOCUMENTS

| | | | |
|---|---|---|---|
| JP | 08509471 | A | 10/1996 |
| JP | 2000208262 | A | 7/2000 |
| JP | 2001164245 | A | 6/2001 |
| JP | 2007273440 | A | 10/2007 |
| JP | 2007307893 | A | 11/2007 |
| JP | 2009140822 | A | 6/2009 |
| JP | 2010061824 | A | 3/2010 |
| JP | 2010159411 | A | 7/2010 |
| JP | 2011118187 | A | 6/2011 |
| JP | 2011241160 | A | 12/2011 |
| JP | 2012009242 | A | 1/2012 |
| JP | 2012022028 | A | 2/2012 |
| JP | 2012032661 | A | 2/2012 |
| JP | 2014067580 | A | 4/2014 |
| JP | 2015065142 | A | 4/2015 |
| JP | 2016027613 | A | 2/2016 |
| TW | 1662728 | B | 6/2019 |

OTHER PUBLICATIONS

International Search Report and Written Opinion for International Application No. PCT/JP2017/011153, dated Jun. 20, 2017—9 pages.
Chinese Office Action for Chinese Application No. 201780018044.9, dated May 22, 2019, 8 pages.
Korean Grant of Patent for Korean Application No. 10-2018-7027179, dated Aug. 22, 2019, 4 pages.
English Translation of Taiwan Office Action for Taiwan Application No. 108115963, dated Mar. 25, 2020, 7 pages.

* cited by examiner

LIGHT SOURCE UNIT, LAMINATED MEMBER, AND DISPLAY AND LIGHTING APPARATUS INCLUDING THEM

CROSS REFERENCE TO RELATED APPLICATIONS

This is the U.S. National Phase application of PCT/JP2017/011153, filed Mar. 21, 2017, which claims priority to Japanese Patent Application No. 2016-061328, filed Mar. 25, 2016, Japanese Patent Application No. 2016-061334, filed Mar. 25, 2016 and Japanese Patent Application No. 2016-224730, filed Nov. 18, 2016, the disclosures of these applications being incorporated herein by reference in their entireties for all purposes.

FIELD OF THE INVENTION

The present invention relates to a light source unit, a laminated member, and a display and a lighting apparatus including them.

BACKGROUND OF THE INVENTION

A multicoloring technique by a color conversion system has been energetically studied to be applied to liquid crystal displays, organic EL displays, lighting apparatuses, and the like. The color conversion is converting emission from a light-emitting body into light with a longer wavelength, or converting blue emission into green or red emission, for example.

A composition (hereinafter, referred to as a "color conversion composition") having this color conversion function is made into a sheet form and is combined with a blue light source, for example, whereby the three primary colors of blue, green, and red can be extracted, that is, white light can be obtained from the blue light source. With a white light source obtained by combining such a blue light source and a film (hereinafter, referred to as a "color conversion film") having the color conversion function as a backlight unit, this backlight unit, a liquid crystal drive unit, and color filters are combined, whereby a full-color display can be manufactured. Without the liquid crystal drive unit, the backlight unit can be used as the white light source as it is, which can be applied as a white light source for LED lighting, for example.

Examples of problems of a liquid crystal display using the color conversion system include improvement in color reproducibility. To improve color reproducibility, narrowing the full width at half maximum of the respective emission spectra of blue, green, and red of the backlight unit to increase the color purity of the respective colors of blue, green, and red is effective. As means for solving this problem, a technique is developed that uses quantum dots formed of inorganic semiconductor fine particles as a component of the color conversion film (refer to Patent Literature 1, for example). The technique using the quantum dots is in fact narrow in the full width at half maximum of the respective emission spectra of green and red to improve color reproducibility, but on the other hand, the quantum dots are vulnerable to heat and water and oxygen in the air and are insufficient in durability.

Another technique is also developed that uses a luminous material formed of organic substances as a component of the color conversion film in place of the quantum dots. Known examples of the technique that uses the organic luminous material as the component of the color conversion film are one using coumarin derivatives (refer to Patent Literature 2, for example), one using rhodamine derivatives (refer to Patent Literature 3, for example), and one using pyrromethene derivatives (refer to Patent Literature 4, for example).

There is also a problem in that although color reproducibility improves using the quantum dot technique and the color conversion film, luminance decreases due to its color characteristics and the emission characteristics of the color conversion film. Known as a measure against the problem is the use of a light wavelength selective filter that reflects light emitted from a color conversion film containing the color conversion film, for example (refer to Patent Literature 5, for example).

PATENT LITERATURE

Patent Literature 1: Japanese Patent Application Laid-open No. 2012-22028

Patent Literature 2: Japanese Patent Application Laid-open No. 2007-273440

Patent Literature 3: Japanese Patent Application Laid-open No. 2001-164245

Patent Literature 4: Japanese Patent Application Laid-open No. 2011-241160

Patent Literature 5: Japanese Patent Application Laid-open No. 2009-140822

SUMMARY OF THE INVENTION

However, the techniques using these organic luminous materials are insufficient in achieving both improvement in color reproducibility and improvement in luminance. A technique that achieves a wide color gamut and high luminance using an organic luminous material indicating emission with high color purity is insufficient in particular. There is also a problem in that light is emitted from the color conversion film isotropically, and light is confined within the film in the first place, thereby reducing luminance.

The present invention has been made in view of the above problems, and an object thereof is to provide a light source unit achieving both improvement in color reproducibility and improvement in luminance in relation to a color conversion film for use in displays, lighting, and the like.

To solve the problem described above and achieve the object, a light source unit according to the present invention includes a light source, a color conversion film containing an organic luminous material that converts incident light made incident from the light source into light with a longer wavelength than that of the incident light, and a laminated film formed of 11 or more layers of different thermoplastic resins alternately laminated.

In the light source unit according to an aspect of the present invention, the laminated film is a laminated film having a reflectance of the light converted to have a longer wavelength than that of the incident light by the organic luminous material being 70% or higher at an incident angle of 60°.

In the light source unit according to an aspect of the present invention, the laminated film is a laminated film having a reflectance of incident light made incident from the light source on the laminated film being 20% or lower at an incident angle of 10°.

In the light source unit according to an aspect of the present invention, the organic luminous material contains a pyrromethene derivative.

In the light source unit according to an aspect of the present invention, the organic luminous material contains a compound represented by General Formula (1):

(1)

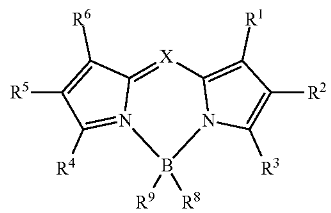

(X is C—$R^7$ or N; and $R^1$ to $R^9$ are optionally the same or different from each other and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, phosphine oxide group, and a condensed ring and an aliphatic ring formed between adjacent substituents).

In the light source unit according to an aspect of the present invention, in General Formula (1) X is C—$R^7$ in which $R^7$ is a group represented by General Formula (2);

(2)

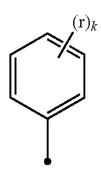

(r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, and phosphine oxide group; k is an integer of 1 to 3; and when k is 2 or more, r is optionally the same or different from each other).

In the light source unit according to an aspect of the present invention, in General Formula (1) $R^1$, $R^3$, $R^4$, and $R^6$ are optionally the same or different from each other and are each a substituted or unsubstituted phenyl group.

In the light source unit according to an aspect of the present invention, in General Formula (1) $R^1$, $R^3$, $R^4$, and $R^6$ are optionally the same or different from each other and are each a substituted or unsubstituted alkyl group.

In the light source unit according to an aspect of the present invention, exhibiting emission in which a peak wavelength of the organic luminous material is observed in a range of 500 nm or longer and 580 nm or shorter.

In the light source unit according to an aspect of the present invention, the organic luminous material includes the following organic luminous materials (a) and (b):

(a) an organic luminous material that exhibits emission a peak wavelength of which is observed in a range of 500 nm or longer and 580 nm or shorter by being excited by the incident light made incident from the light source; and (b) an organic luminous material that exhibits emission a peak wavelength of which is observed in a range of 580 nm or longer and 750 nm or shorter by being excited by at least one of the incident light made incident from the light source and the emission from the organic luminous material (a).

In the light source unit according to an aspect of the present invention, either the organic luminous material (a) or (b) or both are compounds represented by the General Formula (1).

In the light source unit according to an aspect of the present invention, the color conversion film is a laminate including at least the following layers (A) and (B):

(A) a layer containing organic luminous material (a) that exhibits emission a peak wavelength of which is observed in a range of 500 nm or longer and 580 nm or shorter by being excited by the incident light made incident from the light source; and (B) a layer containing organic luminous material (b) that exhibits emission a peak wavelength of which is observed in a range of 580 nm or longer and 750 nm or shorter by being excited by at least one of the incident light made incident from the light source and the emission from the organic luminous material (a).

The light source unit according to an aspect of the present invention, includes a laminate including the color conversion film and the laminated film.

In the light source unit according to an aspect of the present invention, a light diffusion film is laminated on either one side or both sides of the color conversion film.

In the light source unit according to an aspect of the present invention, a prism sheet is provided on or over a light exit face of the color conversion film.

The light source unit according to an aspect of the present invention, includes a functional layer provided on a surface of the color conversion film or the laminated film, a refractive index n3 of the functional layer being between n1 and n2, where n1 is a refractive index of the laminated film, and n2 is a refractive index of the color conversion film.

In the light source unit according to an aspect of the present invention, a surface of the laminated film or the color conversion film has an uneven shape. In the light source unit according to an aspect of the present invention, the uneven shape is a lenticular shape, a substantially triangular shape, or a substantially semicircular shape.

In the light source unit according to an aspect of the present invention, the laminated film or the color conversion film has a difference between an incident angle of the incident light made incident from the light source on the laminated film or the color conversion film and an exit angle of exit light being 5° or larger.

In the light source unit according to an aspect of the present invention, the laminated film has a reflectance of light with a wavelength of 300 nm or longer and 410 nm or shorter being 20% or higher at an incident angle of 10° or with an absorbance of light with a wavelength of 300 nm or longer and 410 nm or shorter being 10% or higher at an incident angle of 10°.

In the light source unit according to an aspect of the present invention, the laminated film contains an ultraviolet light absorbent.

The light source unit according to an aspect of the present invention, includes a resin layer containing an ultraviolet light absorbent on at least one side of the laminated film.

In the light source unit according to an aspect of the present invention, the ultraviolet light absorbent contains an ultraviolet light absorbent having a skeleton of any of anthraquinone, azomethine, indole, triazine, naphthalimide, and phthalocyanine.

In the light source unit according to an aspect of the present invention, the laminated film is provided between the light source and the color conversion film.

In the light source unit according to an aspect of the present invention, the light source is a light-emitting diode having maximum emission in a range of 400 nm or longer and 500 nm or shorter.

In the light source unit according to an aspect of the present invention, the light source is a light-emitting diode having maximum emission in a range of 430 nm or longer and 470 nm or shorter and having an emission wavelength range of 400 nm or longer and 500 nm or shorter, and an emission spectrum of the light source satisfies Numerical Formula (3):

$$1>\beta/\alpha\geq 0.15 \quad (3)$$

($\alpha$ is emission intensity at a peak emission wavelength of the emission spectrum, and $\beta$ is emission intensity at a wavelength of the peak emission wavelength +15 nm).

In the light source unit according to an aspect of the present invention, the light source has maximum emission in a range of 455 nm or longer and 465 nm or shorter.

A laminated member according to an aspect of the present invention includes a color conversion film containing an organic luminous material that converts incident light into light with a longer wavelength than that of the incident light and a laminated film comprising a constitution in which 11 or more layers of different thermoplastic resins are alternately laminated with each other.

A display according to an aspect of the present invention includes the light source unit according to the above invention.

A lighting apparatus according to an aspect of the present invention includes the light source unit according to the above invention.

Advantageous Effects of Invention

The light source unit and the laminated film according to the present invention can achieve an excellent color reproducibility and a low power consumption, and can be thereby suitably used for displays and lighting apparatuses.

DETAILED DESCRIPTION OF EMBODIMENTS OF THE INVENTION

The following describes preferred embodiments of a light source unit, a laminated member, and a display and a lighting apparatus including them according to the present invention in detail. The present invention is not interpreted as limited to the embodiments including the following examples, and various alterations to the extent achieving the object of the invention and not departing from the gist of the invention can be made as a matter of course.

Figure 1:
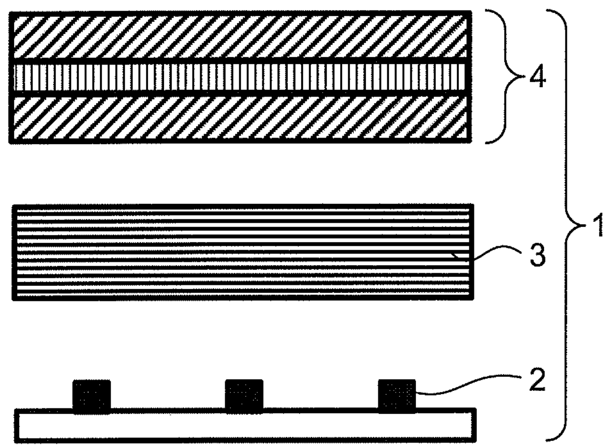
FIG. 1 is a schematic sectional view of an example of a light source unit according to an embodiment of the present invention.
Figure 2:
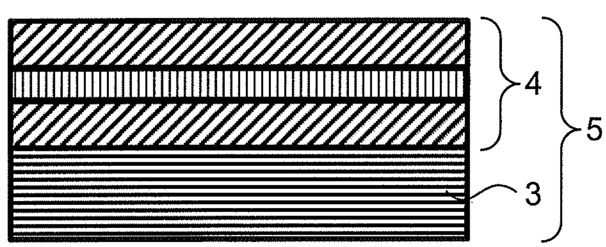
FIG. 2 is a schematic sectional view of an example of a laminated member according to the embodiment of the present invention.

FIG. 1 is a schematic sectional view of an example of a light source unit according to the embodiment. As illustrated in FIG. 1, this light source unit 1 of the present invention is required to include light sources 2, a laminated film 3, and a color conversion film 4. FIG. 2 is a schematic sectional view of an example of a laminated member according to the embodiment. As illustrated in FIG. 2, the laminated member 5 of the present invention is required to include the laminated film 3 and the color conversion film 4. The following describes these configurations.

Color Conversion Film

The color conversion film for use in the present invention contains at least one kind of organic luminous material and a binder resin and functions as a color conversion layer that converts incident light into light with a longer wavelength than the incident light.

The color conversion film for use in the present invention is a continuous layer. The continuous layer refers to a layer that is not divided. When layers containing the organic luminous material and the binder resin are patterned to be present on the same plane, for example, they are divided layers and do not correspond to the continuous layer referred to in the present invention. A configuration being integral as a whole, in which there are partially breaks or depressions, corresponds to the continuous layer.

The film thickness of the color conversion film, which is not limited to a particular film thickness, is preferably 10 μm to 1,000 μm in view of the toughness of the film and the easiness of forming. In view of improving heat resistance, the film thickness of the color conversion film is preferably 200 μm or thinner, more preferably 100 μm or thinner, and further preferably 50 μm or thinner.

The film thickness of the color conversion film in the present invention refers to a film thickness (an average film thickness) measured based on Method A for Measuring Thickness by Mechanical Scanning in JIS K 7130 (1999) Testing Methods for Thickness of Plastics Film and Sheeting. The same also holds true for the following description.

(A) Organic Luminous Material

The color conversion film for use in the laminated member and the light source unit according to the embodiment of the present invention contains an organic luminous material. The luminous material in the present invention refers to a material that, when irradiated with some light, emits light with a wavelength different from the light. The organic luminous material is a luminous material formed of organic substances.

To achieve highly efficient color conversion, the luminous material is preferably a material exhibiting emission characteristics with a high luminous quantum yield. Examples of the luminous material generally include known luminous materials such as inorganic fluorescent substances, fluorescent pigments, fluorescent dyes, and quantum dots; organic luminous materials are preferred in view of the uniformity of dispersion, a reduction in an amount used, and a reduction in environmental burden.

Examples of the organic luminous material are as follows; preferred examples thereof include, but are not limited to:

compounds having a condensed aryl ring such as naphthalene, anthracene, phenanthrene, pyrene, chrysene, naphthacene, triphenylene, perylene, fluoranthene, fluorene, and indene and derivatives thereof;

compounds having a heteroaryl ring such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine, and derivatives thereof;

borane derivatives;

stilbene derivatives such as 1,4-distyrylbenzene, 4,4'-bis(2-(4-diphenylaminophenyl)ethenyl)biphenyl, 4,4'-bis(N-(stilben-4-yl)-N-phenylamino)stilbene;

aromatic acetylene derivatives, tetraphenylbutadiene derivatives, aldazine derivatives, pyrromethene derivatives, and diketopyrolo[3,4-c]pyrrole derivatives;

coumarin derivatives such as coumarin 6, coumarin 7, and coumarin 153;

azole derivatives such as imidazole, thiazole, thiadiazole, carbazole, oxazole, oxadiazole, and triazole and metal complexes thereof;

cyanine-based compounds such as indocyanine green;

xanthene-based compounds such as fluorescein, eosine, and rhodamine and thioxanthene-based compounds;

polyphenylene-based compounds, naphthalimide derivatives, phthalocyanine derivatives and metal complexes thereof, and porphyrin derivatives and metal complexes thereof;

oxazine-based compounds such as Nile Red and Nile Blue;

helicene-based compounds;

aromatic amine derivatives such as N,N'-diphenyl-N,N'-di(3-methylphenyl)-4,4'-diphenyl-1,1'-diamine; and organometallic complex compounds of iridium (Ir), ruthenium (Ru), rhodium (Rh), palladium (Pd), platinum (Pt), osmium (Os), rhenium (Re), and the like.

At least one kind of organic luminous material may be contained in the color conversion film, or two or more kinds of organic luminous materials may be contained therein. The organic luminous material may be a fluorescent luminous material or a phosphorescent luminous material; the fluorescent luminous material is preferred in order to achieve high color purity. Among these, compounds having a condensed aryl ring or derivatives thereof are preferred, because they are high in thermal stability and photostability. As the organic luminous material, compounds having a coordinate bond are preferred in view of solubility and the variety of molecular structures. Also preferred are compounds containing boron such as boron fluoride complexes in that luminescence with a small full width at half maximum and high efficiency is enabled.

Among them, pyrromethene derivatives are preferred in that they give a high fluorescence quantum yield and that they are favorable in durability. More preferred is a compound represented by General Formula (1), that is, a pyrromethene compound.

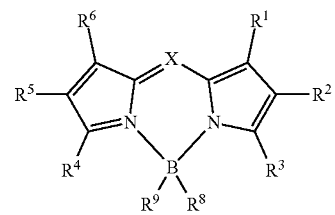

(1)

When the compound represented by General Formula (1) is contained as the organic luminous material, X is C—$R^7$ or N in General Formula (1). $R^1$ to $R^9$ may be the same or different from each other and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, phosphine oxide group, and a condensed ring and an aliphatic ring formed between adjacent substituents.

In all the above groups, hydrogen may be heavy hydrogen. The same also holds true for compounds or partial structures thereof described below.

In the following description, a substituted or unsubstituted $C_{6-40}$ aryl group is aryl group all the carbon number of which is 6 to 40 including a carbon number contained in a substituent substituting the aryl group, for example. The same also holds true for other substituents that determine their carbon numbers.

Preferred substituents when all the above groups are substituted are alkyl group, cycloalkyl group, heterocyclic group, alkenyl group, cycloalkenyl group, alkynyl group, hydroxy group, thiol group, alkoxy group, alkylthio group, aryl ether group, arylthio ether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, and phosphine oxide group, and besides specific substituents regarded as being preferred in the descriptions of the individual substituents are preferred. These substituents may be further substituted with the above substituents.

"Unsubstituted" in the wording "substituted or unsubstituted" means that a hydrogen atom or a heavy hydrogen atom substitutes the group.

The same as the above also holds true for the wording "substituted or unsubstituted" in the compounds or partial structures thereof described below.

Among all the above groups, the alkyl group indicates saturated aliphatic hydrocarbon group such as methyl group, ethyl group, n-propyl group, isopropyl group, n-butyl group, sec-butyl group, or tert-butyl group, which may or may not have a substituent. An additional substituent when being substituted is not limited to a particular substituent; examples thereof include alkyl group, halogen, aryl group, and heteroaryl group, and this point is common to the following description. The carbon number of the alkyl group, which is not limited to a particular number, is preferably 1 or more and 20 or less and more preferably 1 or more and 8 or less in view of availability and costs.

The cycloalkyl group indicates saturated aliphatic hydrocarbon group such as cyclopropyl group, cyclohexyl group, norbornyl group, or adamantyl group, which may or may not have a substituent. The carbon number of the alkyl group part, which is not limited to a particular number, is preferably 3 or more and 20 or less.

The heterocyclic group indicates an aliphatic ring having an atom other than carbon within the ring such as a pyrane ring, a piperidine ring, or a cyclic amide, which may or may not have a substituent. The carbon number of the heterocyclic group, which is not limited to a particular number, is preferably 2 or more and 20 or less.

The alkenyl group indicates an unsaturated aliphatic hydrocarbon group containing a double bond such as vinyl group, allyl group, or butadienyl group, which may or may not have a substituent. The carbon number of the alkenyl group, which is not limited to a particular number, is preferably 2 or more and 20 or less.

The cycloalkenyl group indicates unsaturated alicyclic hydrocarbon group containing a double bond such as cyclopentenyl group, cyclopentadienyl group, or cyclohexenyl group, which may or may not have a substituent.

The alkynyl group indicates unsaturated aliphatic hydrocarbon group containing a triple bond such as ethynyl group, which may or may not have a substituent. The carbon number of the alkynyl group, which is not limited to a particular number, is preferably 2 or more and 20 or less.

The alkoxy group indicates a functional group with aliphatic hydrocarbon group bonded via an ether bond such as methoxy group, ethoxy group, or propoxy group, in which this aliphatic hydrocarbon group may or may not have a substituent. The carbon number of the alkoxy group, which is not limited to a particular number, is preferably 1 or more and 20 or less.

The alkylthio group is a group with the oxygen atom of the ether bond of the alkoxy group substituted with a sulfur atom. The hydrocarbon group of the alkylthio group may or may not have a substituent. The carbon number of the alkylthio group, which is not limited to a particular number, is preferably 1 or more and 20 or less.

The aryl ether group indicates a functional group with aromatic hydrocarbon group bonded via an ether bond such as phenoxy group, in which the aromatic hydrocarbon group may or may not have a substituent. The carbon number of the aryl ether group, which is not limited to a particular number, is preferably 6 or more and 40 or less.

The arylthio ether group is a group with the oxygen atom of the ether bond of the aryl ether group substituted with a sulfur atom. The aromatic hydrocarbon group of the arylthio ether group may or may not have a substituent. The carbon number of the arylthio ether group, which is not limited to a particular number, is preferably 6 or more and 40 or less.

The aryl group indicates aromatic hydrocarbon group such as phenyl group, biphenyl group, terphenyl group, naphthyl group, fluorenyl group, benzofluorenyl group, dibenzofluorenyl group, phenanthryl group, anthracenyl group, benzophenanthryl group, benzoanthracenyl group, crycenyl group, pyrenyl group, fluoranthenyl group, triphenylenyl group, benzofluoranthenyl group, dibenzoanthracenyl group, perylenyl group, or helicenyl group.

Among them, preferred are phenyl group, biphenyl group, terphenyl group, naphthyl group, fluorenyl group, phenanthryl group, anthracenyl group, pyrenyl group, fluoranthenyl group, and triphenylenyl group. The aryl group may or may not have a substituent. The carbon number of the aryl group, which is not limited to a particular number, is preferably 6 or more and 40 or less and more preferably 6 or more and 30 or less.

When $R^1$ to $R^9$ are each a substituted or unsubstituted aryl group, the aryl group is preferably phenyl group, biphenyl group, terphenyl group, naphthyl group, fluorenyl group, phenanthryl group, or anthracenyl group, more preferably phenyl group, biphenyl group, terphenyl group, or naphthyl group, further preferably phenyl group, biphenyl group, or terphenyl group, and particularly preferably phenyl group.

When each of the substituents is further substituted with an aryl group, the aryl group is preferably phenyl group, biphenyl group, terphenyl group, naphthyl group, fluorenyl group, phenanthryl group, or anthracenyl group, more preferably phenyl group, biphenyl group, terphenyl group, or naphthyl group, and particularly preferably phenyl group.

The heteroaryl group indicates cyclic aromatic group having one or more atoms other than carbon within the ring such as pyridyl group, furanyl group, thienyl group, quinolinyl group, isoquinolinyl group, pyrazinyl group, pyrimidyl group, pyridazinyl group, triazinyl group, naphthyridinyl group, cinnolinyl group, phthalazinyl group, quinoxalinyl group, quinazolinyl group, benzofuranyl group, benzothienyl group, an indolyl group, a dibenzofuranyl group, dibenzothienyl group, carbazolyl group, benzocarbazolyl group, carbolinyl group, indolocarbazolyl group, benzofurocarbazolyl group, benzothienocarbazolyl group, dihydroindenocarbazolyl group, benzoquinolinyl group, acridinyl group, dibenzoacridinyl group, benzimidazolyl group, imidazopyridyl group, benzoxazolyl group, benzothiazolyl group, and phenanthrolinyl group, where the naphthyridinyl group indicates any of 1,5-naphthyridinyl group, 1,6-naphthyridinyl group, 1,7-naphthyridinyl group, 1,8-naphthyridinyl group, 2,6-naphthyridinyl group, and 2,7-naphthyridinyl group. The heteroaryl group may or may not have a substituent. The carbon number of the heteroaryl group, which is not limited to a particular number, is preferably 2 or more and 40 or less and more preferably 2 or more and 30 or less.

When $R^1$ to $R^9$ are each a substituted or unsubstituted heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

When each of the substituents is further substituted with a heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

Halogen indicates an atom selected from fluorine, chlorine, bromine, and iodine.

The carbonyl group, the carboxy group, the oxycarbonyl group, and the carbamoyl group may or may not have a substitute. Examples of the substituent include alkyl group, cycloalkyl group, aryl group, and heteroaryl group; these substituents may be further substituted.

The amino group is substituted or unsubstituted amino group. Examples of the substituent when being substituted include aryl group, hetero aryl group, linear alkyl group, and a branched alkyl group. The aryl group and the heteroaryl group are preferably phenyl group, naphthyl group, pyridyl group, or quinolinyl group. These substituents may be further substituted. The carbon number, which is not limited to a particular number, is preferably 2 or more and 50 or less, more preferably 6 or more and 40 or less, and particularly preferably 6 or more and 30 or less.

The silyl group indicates an alkylsilyl group such as trimethylsilyl group, triethylsilyl group, tert-butyldimethylsilyl group, propyldimethylsilyl group, or vinyldimethylsilyl group; and arylsilyl group such as phenyldimethylsilyl group, tert-butyldiphenylsilyl group, triphenylsilyl group, or trinaphthylsilyl group. A substituent on silicon may be further substituted. The carbon number of the silyl group, which is not limited to a particular number, is preferably 1 or more and 30 or less.

The siloxanyl group indicates an ether bond-containing silicon compound group such as trimethylsiloxanyl group. A substituent on silicon may be further substituted.

The boryl group is substituted or unsubstituted boryl group. Examples of the substituent when being substituted include aryl group, hetero aryl group, linear alkyl group, branched alkyl group, aryl ether group, alkoxy group, and hydroxy group, and among them, preferred are aryl group and aryl ether group.

The phosphine oxide group is a group represented by $—P(=O)R^{10}R^{11}$; $R^{10}$ and $R^{11}$ are selected from groups similar to those for $R^1$ to $R^9$.

The condensed ring formed between adjacent substituents refers to any adjacent two substituents ($R^1$ and $R^2$ in General Formula (1), for example) bonding to each other and forming a conjugated or non-conjugated cyclic skeleton. Elements forming such a condensed ring may contain elements selected from nitrogen, oxygen, sulfur, phosphor, and silicon other than carbon. The condensed ring may be further condensed with another ring.

The compound represented by General Formula (1) exhibits a high fluorescence quantum yield and has a small peak full width at half maximum in an emission spectrum, whereby both efficient color conversion and high color purity can be achieved.

Furthermore, the compound represented by General Formula (1) can adjust various characteristics and properties such as luminous efficacy, color purity, thermal stability, photostability, and dispersibility by introducing an appropriate substituent to an appropriate position.

Compared with a case in which $R^1$, $R^3$, $R^4$, and $R^6$ are all hydrogen, for example, a case in which at least one of $R^1$, $R^3$, $R^4$, and $R^6$ is substituted or unsubstituted alkyl group, substituted or unsubstituted aryl group, or substituted or unsubstituted heteroaryl group exhibits better thermal stability and photostability.

When at least one of $R^1$, $R^3$, $R^4$, and $R^6$ is substituted or unsubstituted alkyl group, the alkyl group is preferably a $C_{1-6}$ alkyl group such as methyl group, ethyl group, n-propyl group, isopropyl group, n-butyl group, sec-butyl group, tert-butyl group, pentyl group, or hexyl group. Furthermore, this alkyl group is preferably methyl group, ethyl group, n-propyl group, isopropyl group, n-butyl group, sec-butyl group, or tert-butyl group in view of excellence in thermal stability. In view of preventing concentration quenching and improving a fluorescence quantum yield, this alkyl group is more preferably tert-butyl group, which is sterically bulky. In view of the easiness of synthesis and the availability of raw materials, methyl group is also preferably used as this alkyl group.

When at least one of $R^1$, $R^3$, $R^4$, and $R^6$ is substituted or unsubstituted aryl group, the aryl group is preferably phenyl group, biphenyl group, terphenyl group, or naphthyl group, further preferably phenyl group or biphenyl group, and particularly preferably phenyl group.

When at least one of $R^1$, $R^3$, $R^4$, and $R^6$ is substituted or unsubstituted heteroaryl group, the heteroaryl group is preferably pyridyl group, quinolinyl group, or thienyl group, more preferably pyridyl group or quinolinyl group, and particularly preferably pyridyl group.

When $R^1$, $R^3$, $R^4$, and $R^6$ may all be the same or different from each other and are each a substituted or unsubstituted alkyl group, solubility in the binder resin and/or a solvent is favorable, which is preferred. In this case, the alkyl group is preferably methyl group in view of the easiness of synthesis and the availability of raw materials.

When $R^1$, $R^3$, $R^4$, and $R^6$ may all be the same or different from each other and are each a substituted or unsubstituted aryl group or a substituted or unsubstituted heteroaryl group, more favorable thermal stability and photostability are exhibited, which is preferred. In this case, more preferred is that $R^1$, $R^3$, $R^4$, and $R^6$ may all be the same or different from each other and are each a substituted or unsubstituted aryl group.

Although some substituents improve a plurality of properties, limited substituents exhibit sufficient performance in all the properties. In particular, it is difficult to achieve both high luminous efficacy and high color purity. Given these circumstances, a plurality of kinds of substituents are introduced to the compound represented by General Formula (1), whereby a compound that possesses a balance between luminous characteristic and color purity and the like can be obtained.

When $R^1$, $R^3$, $R^4$, and $R^6$ may all be the same or different from each other and are each a substituted or unsubstituted aryl group in particular, a plurality of kinds of substituents are preferably introduced so that $R^1 \neq R^4$, $R^3 \neq R^6$, $R^1 \neq R^3$ or $R^4 \neq R^6$ is satisfied. The symbol $\neq$ indicates that they are groups of mutually different structures. $R^1 \neq R^4$ indicates that $R^1$ and $R^4$ are groups having different structures from each other, for example. By introducing a plurality of kinds of substituents as described above, aryl group having an effect on color purity and aryl group having an effect on luminous efficacy can be simultaneously introduced, enabling fine adjustment.

Among them, preferred is that $R^1 \neq R^3$ or $R^4 \neq R^6$ is satisfied in view of improving luminous efficacy and color purity with a good balance. In this case, to the compound represented by General Formula (1), one or more aryl groups having an effect on color purity can be introduced to each of both pyrrole rings, while the aryl group having an effect on luminous efficacy can be introduce to any of the other positions, and both the properties can be improved to the maximum. When $R^1 \neq R^3$ or $R^4 \neq R^6$ is satisfied, more preferred is that $R^1 = R^4$ and $R^3 = R^6$ are satisfied in view of improving both heat resistance and color purity.

The aryl group having an effect mainly on color purity is preferably aryl group substituted with an electron donating group. Examples of the electron donating group include alkyl group and alkoxy group. In particular, preferred are a $C_{1-8}$ alkyl group and a $C_{1-8}$ alkoxy group, and more preferred are methyl group, ethyl group, tert-butyl group, and methoxy group. In view of dispersibility, tert-butyl group and methoxy group are particularly preferred, and when each of these groups is the electron donating group, extinction caused by the aggregation of molecules can be prevented in the compound represented by General Formula (1). The substitution position of the substituent is not limited to a particular position; a twist in bonding is required to be reduced in order to increase the photostability of the compound represented by General Formula (1), and the substituent is preferably bonded to the meta or para position relative to the bonding position with the pyrromethene skeleton.

The aryl group having an effect mainly on luminous efficacy is preferably aryl group having a bulky substituent such as tert-butyl group, adamantyl group, or methoxy group.

When $R^1$, $R^3$, $R^4$, and $R^6$ may all be the same or different from each other and are each a substituted or unsubstituted aryl group, $R^1$, $R^3$, $R^4$, and $R^6$ may all be the same or different from each other and are each preferably a substituted or unsubstituted phenyl group. In this case, $R^1$, $R^3$, $R^4$, and $R^6$ are each preferably selected from the following Ar-1 to Ar-6. In this case, examples of preferred combinations of $R^1$, $R^3$, $R^4$, and $R^6$ include, but are not limited to, combinations listed in Table 1-1 to Table 1-11.

Ar-1

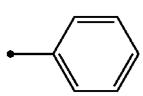

Ar-2

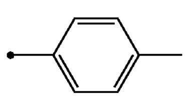

Ar-3

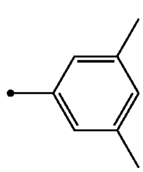

Ar-4

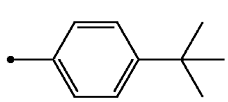

Ar-5

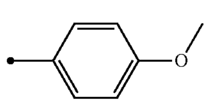

-continued

Ar-6

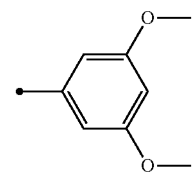

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |

TABLE 1-3-continued

| R1 | R3 | R4 | R6 |
|---|---|---|---|
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |

TABLE 1-4-continued

| R1 | R3 | R4 | R6 |
|---|---|---|---|
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |

TABLE 1-5-continued

| R1 | R3 | R4 | R6 |
|---|---|---|---|
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |

TABLE 1-6-continued

| R1 | R3 | R4 | R6 |
|---|---|---|---|
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |

TABLE 1-7-continued

| R1 | R3 | R4 | R6 |
|---|---|---|---|
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |

TABLE 1-8-continued

| R1 | R3 | R4 | R6 |
|---|---|---|---|
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |

TABLE 1-11-continued

| R1 | R3 | R4 | R6 |
|---|---|---|---|
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are each preferably any of hydrogen, alkyl group, carbonyl group, oxycarbonyl group, and aryl group. Among them, hydrogen and alkyl group are preferred in view of thermal stability, and hydrogen is more preferred in view of the easiness of obtaining a narrow full width at half maximum in an emission spectrum.

$R^8$ and $R^9$ are each preferably alkyl group, aryl group, heteroaryl group, fluorine, fluorine-containing alkyl group, fluorine-containing heteroaryl group, or fluorine-containing aryl group. In particular, $R^8$ and $R^9$ are each more preferably fluorine or fluorine-containing aryl group because of being stable against light from the light source and the capability of obtaining a higher fluorescence quantum yield. Furthermore, $R^8$ and $R^9$ are each further preferably fluorine in view of the easiness of synthesis.

The fluorine-containing aryl group is aryl group containing fluorine; examples thereof include fluorophenyl group, trifluoromethylphenyl group, and pentafluorophenyl group. The fluorine-containing heteroaryl group is heteroaryl group containing fluorine; examples thereof include fluoropyridyl group, trifluoromethylpyridyl group, and trifluoropyridyl group. The fluorine-containing alkyl group is alkyl group containing fluorine; examples thereof include trifluoromethyl group and pentafluoroethyl group.

In General Formula (1), X is preferably C—$R^7$ (C: carbon) in view of photostability.

When X is C—$R^7$, the substituent $R^7$ has a large effect on the durability of the compound represented by General Formula (1), that is, a temporal decrease in the emission intensity of this compound. Specifically, when $R^7$ is hydrogen, this hydrogen is high in reactivity, and this part easily reacts with water and oxygen in the air. This reaction causes the decomposition of the compound represented by General Formula (1). When $R^7$ is a substituent that is large in the degree of freedom of the motion of molecular chains such as alkyl group, although the reactivity decreases in fact, the compounds aggregate over time in the composition, resulting in a decrease in emission intensity caused by concentration quenching. Consequently, $R^7$ is preferably a substituent that is rigid and is small in the degree of freedom of motion making it difficult to cause aggregation, which is specifically preferably either substituted or unsubstituted aryl group or substituted or unsubstituted heteroaryl group.

X is preferably C—$R^7$ in which $R^7$ is substituted or unsubstituted aryl group in view of giving a higher fluorescence quantum yield, being more difficult to be thermally decomposed, and photostability. The aryl group is preferably phenyl group, biphenyl group, terphenyl group, naphthyl group, fluorenyl group, phenethyl group, or anthracenyl group in view of not impairing an emission wavelength.

Furthermore, to increase the photostability of the compound represented by General Formula (1), the twist of the carbon-carbon bond of $R^7$ and the pyrromethene skeleton is required to be moderately reduced. This is because when the twist is excessively large, reactivity against the light source increases, for example, thus reducing photostability. Given these circumstances, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

$R^7$ is preferably a moderately bulky substituent. $R^7$ having moderate bulkiness can prevent molecules from aggregating. Consequently, the luminous efficacy and the durability of the compound represented by General Formula (1) further improve.

More preferred examples of such a bulky substituent include the structure of $R^7$ represented by the following General Formula (2):

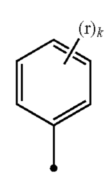

(2)

In General Formula (2), r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, and phosphine oxide group. The symbol k is an integer of 1 to 3. When k is 2 or more, r may be the same or different from each other.

In view of the capability of giving a higher fluorescence quantum yield, r is preferably a substituted or unsubstituted aryl group. Particularly preferred examples of the aryl group include phenyl group and naphthyl group. When r is aryl group, k in General Formula (2) is preferably 1 or 2, and k is more preferably 2 in view of further preventing molecules from aggregating. Furthermore, when k is 2 or more, at least one of r is preferably substituted with an alkyl group. Particularly preferred examples of the alkyl group in this case include methyl group, ethyl group, and tert-butyl group in view of thermal stability.

In view of controlling a fluorescence wavelength and an absorption wavelength and increasing compatibility with a solvent, r is preferably a substituted or unsubstituted alkyl group, a substituted or unsubstituted alkoxy group, or halogen and more preferably a methyl group, an ethyl group, a tert-butyl group, or a methoxy group. In view of dispersibility, a tert-butyl group and a methoxy group are particularly preferred. For the prevention of quenching caused by the aggregation of molecules, r being tert-butyl group or methoxy group is more effective.

As another form of the compound represented by General Formula (1), at least one of $R^1$ to $R^7$ is preferably an electron withdrawing group. Particularly preferred is that (1) at least one of $R^1$ to $R^6$ is an electron withdrawing group, (2) $R^7$ is an electron withdrawing group, or (3) at least one of $R^1$ to $R^6$ is an electron withdrawing group and $R^7$ is an electron withdrawing group. By thus introducing the electron withdrawing group to the pyrromethene skeleton of the compound, the electron density of the pyrromethene skeleton can be significantly reduced. Consequently, the stability against oxygen of the compound further improves, whereby the durability of the compound can be further improved.

The electron withdrawing group is also referred to as an electron accepting group and is an atomic group that attracts an electron from a substituted atomic group by the inductive effect and/or the resonance effect in the organic electron theory. Examples of the electron withdrawing group include ones having a positive substituent constant (σp (para)) of Hammett's rule. The substituent constant (σp (para)) of Hammett's rule can be cited from Handbook of Chemistry: Pure Chemistry, revised 5th ed. (II-p. 380).

Although phenyl group may also have a positive value as described above, the electron withdrawing group in the present invention does not include phenyl group.

Examples of the electron withdrawing group include —F (σp: +0.06), —Cl (σp: +0.23), —Br (σp: +0.23), —I (σp: +0.18), —$CO_2R^{12}$ (σp: +0.45 when $R^{12}$ is ethyl group), —$CONH_2$ (σp: +0.38), —$COR^{12}$ (σp: +0.49 when $R^{12}$ is methyl group), —$CF_3$ (σp: +0.50), —$SO_2R^{12}$ (σp: +0.69 when $R^{12}$ is methyl group), and —$NO_2$ (σp: +0.81). The symbol $R^{12}$ each independently represent a hydrogen atom, a substituted or unsubstituted ring-forming $C_{6-30}$ aromatic hydrocarbon group, a substituted or unsubstituted ring-forming $C_{5-30}$ heterocyclic group, a substituted or unsubstituted $C_{1-30}$ alkyl group, or a substituted or unsubstituted $C_{1-30}$ cycloalkyl group. Specific examples of these groups are similar to those described above.

Preferred examples of the electron withdrawing group include fluorine, fluorine-containing aryl group, fluorine-containing heteroaryl group, fluorine-containing alkyl group, substituted or unsubstituted acyl group, substituted or unsubstituted ester group, substituted or unsubstituted amide group, and substituted or unsubstituted sulfonyl group, and cyano group. This is because these groups are difficult to be chemically decomposed.

More preferred examples of the electron withdrawing group include fluorine-containing alkyl group, substituted or unsubstituted acyl group, substituted or unsubstituted ester group, and cyano group. This is because these groups cause an effect of preventing concentration quenching and improving the luminous quantum yield. A particularly preferred electron withdrawing group is substituted or unsubstituted ester group.

A particularly preferred example of the compound represented by General Formula (1) is a case in which $R^1$, $R^3$, $R^4$, and $R^6$ may all be the same or different from each other and are each a substituted or unsubstituted alkyl group; X is C—$R^7$; and $R^7$ is a group represented by General Formula (2). In this case, $R^7$ is particularly preferably the group represented by General Formula (2) in which r is contained as substituted or unsubstituted phenyl group.

Another particularly preferred example of the compound represented by General Formula (1) is a case in which $R^1$, $R^3$, $R^4$, and $R^6$ may all be the same or different from each other and are each selected from Ar-1 to Ar-6 described above; X is C—$R^7$; and $R^7$ is a group represented by General Formula (2). In this case, $R^7$ is preferably the group represented by General Formula (2) in which r is contained as tert-butyl group or methoxy group and is particularly preferably the group represented by General Formula (2) in which r is contained as methoxy group.

Although the following describes examples of the compound represented by General Formula (1), this compound is not limited to compounds listed below:

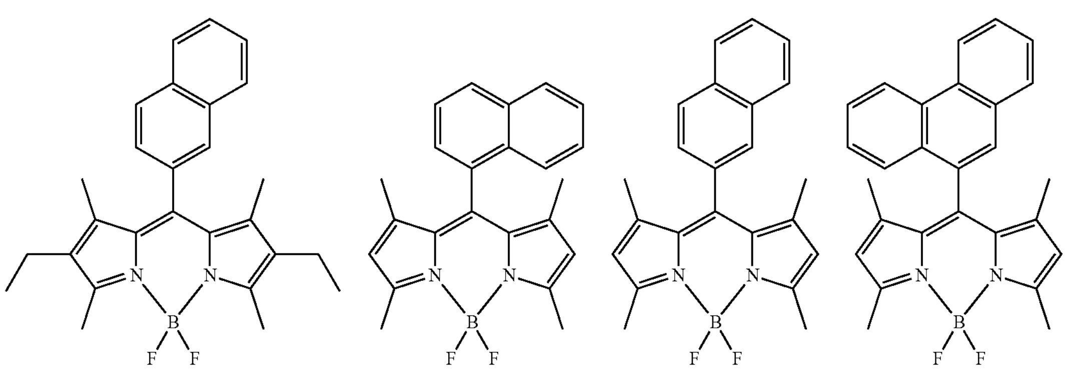

-continued
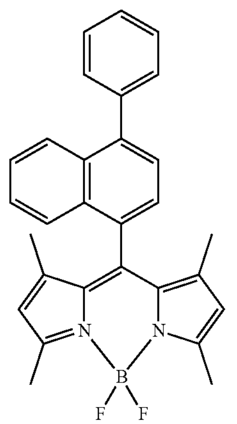
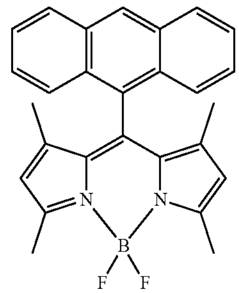
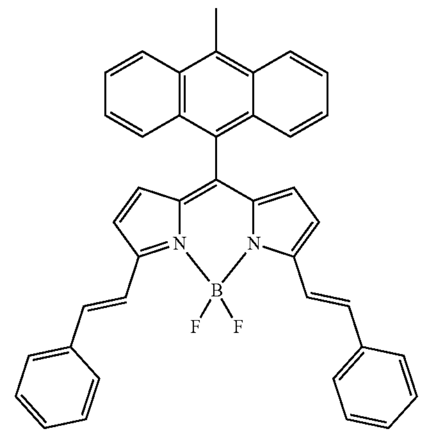
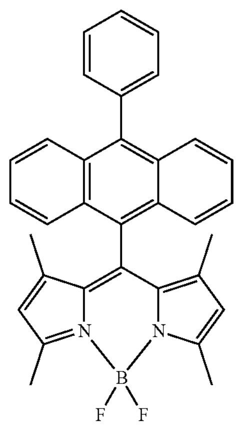
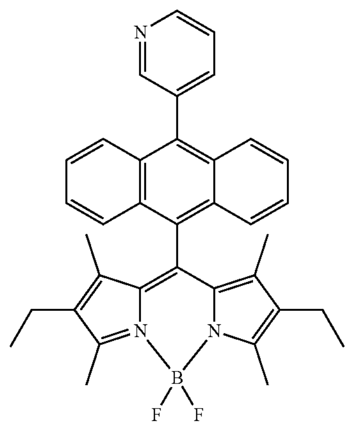
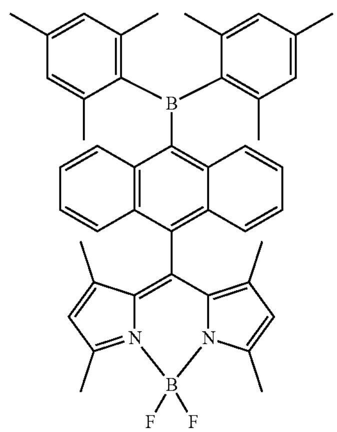
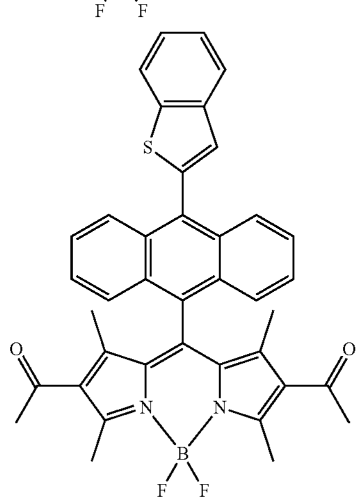
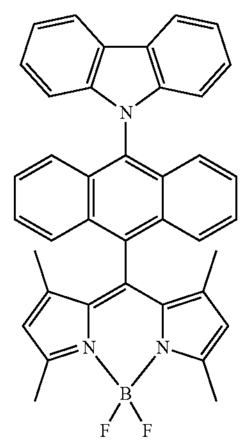
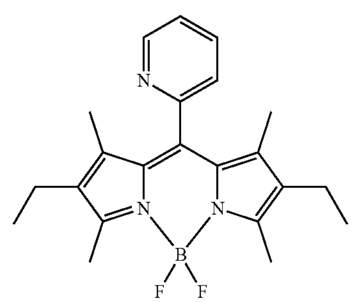
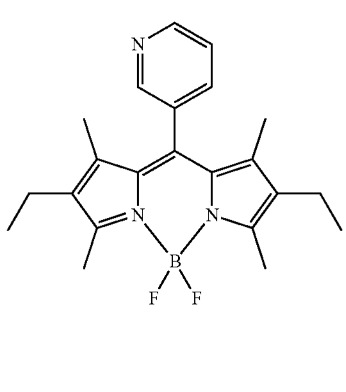
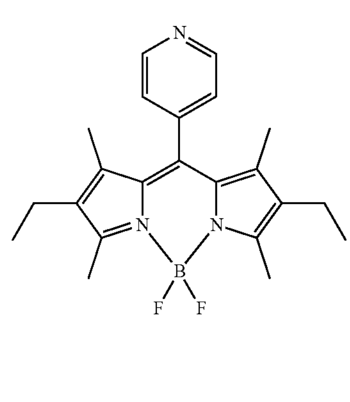
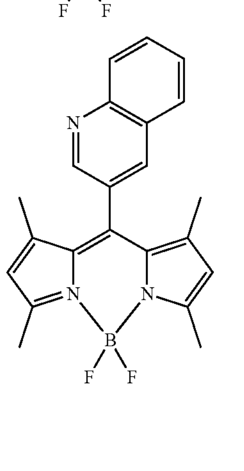

-continued
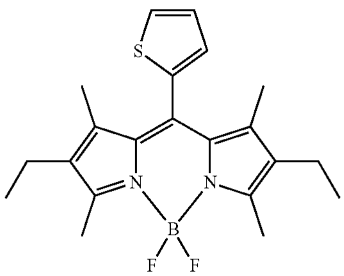
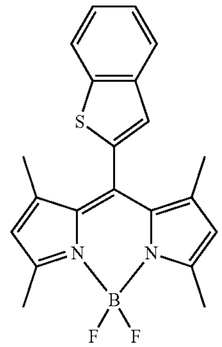
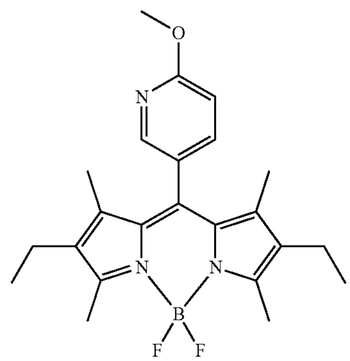
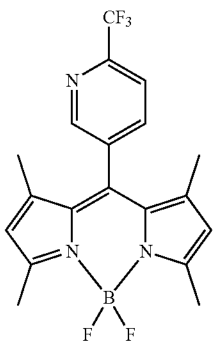
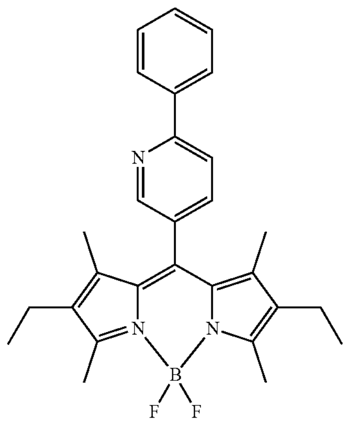
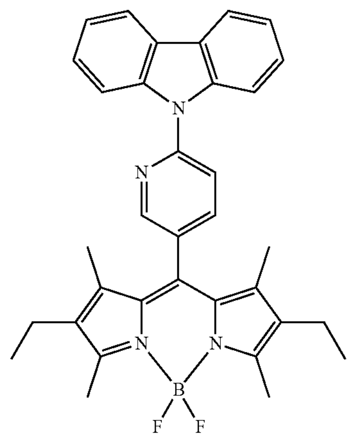
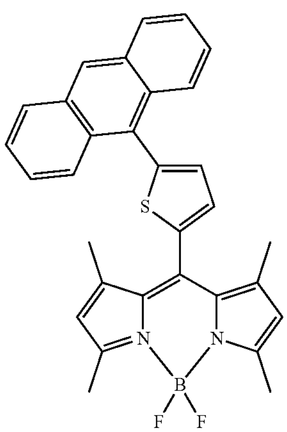
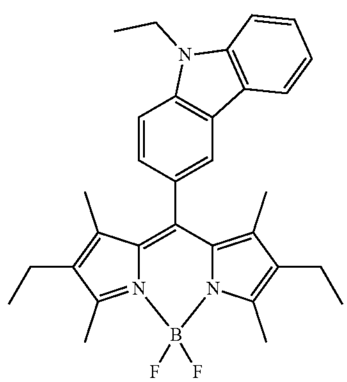
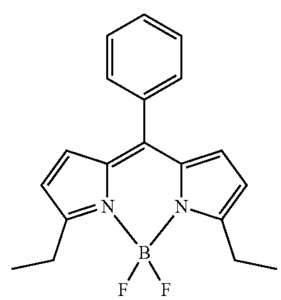
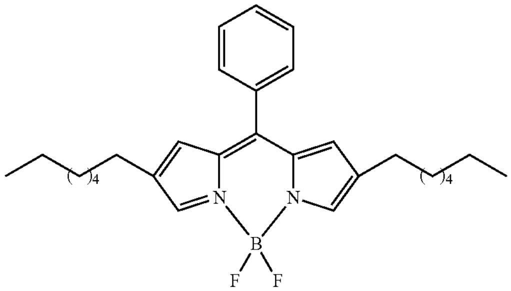
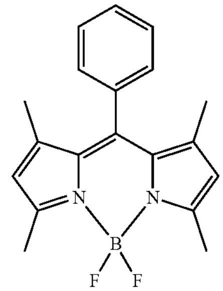
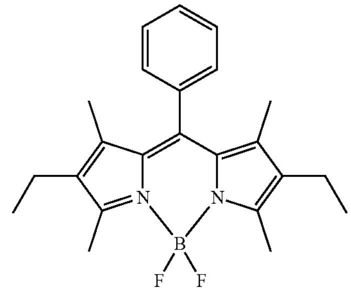

-continued
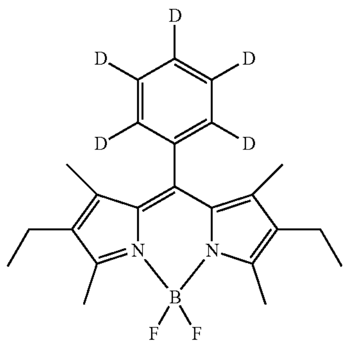
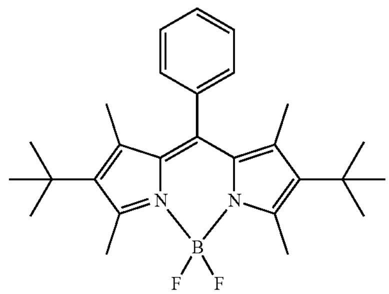
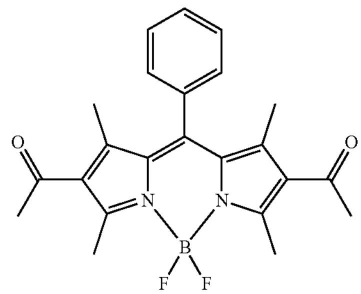
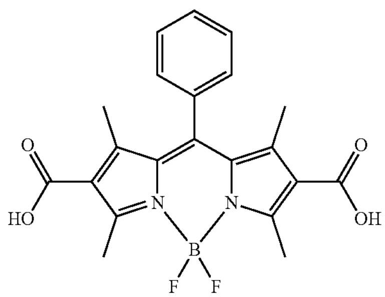
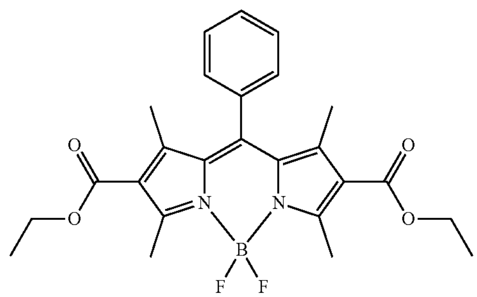
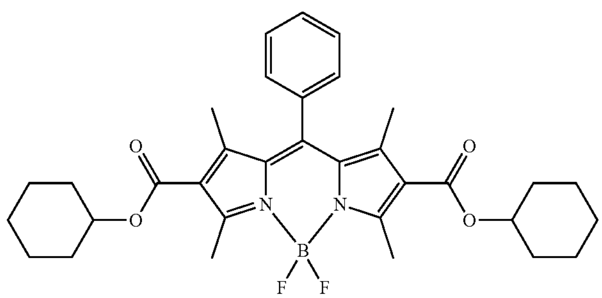
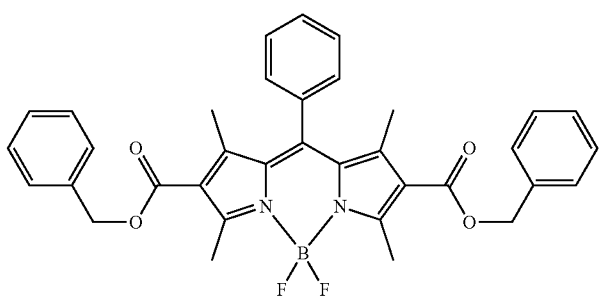
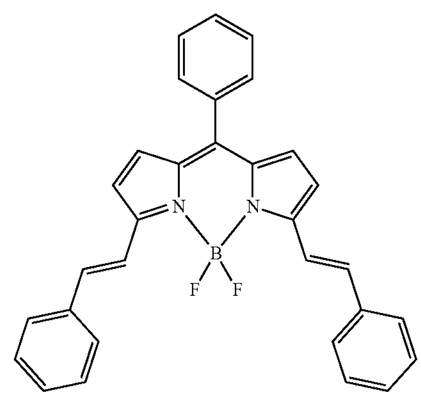
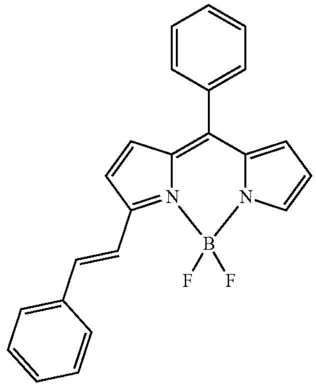
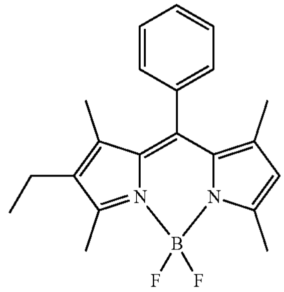
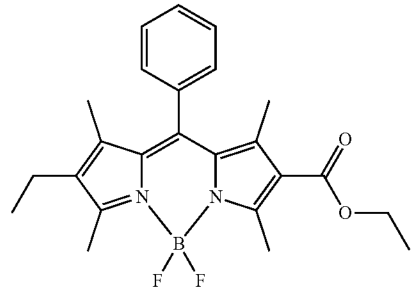

-continued
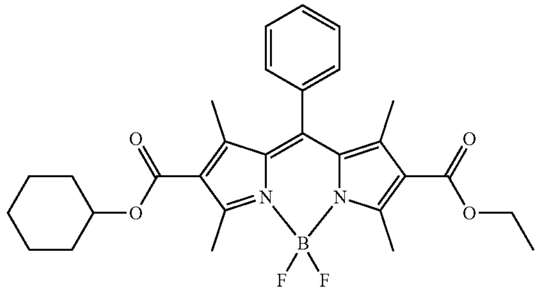
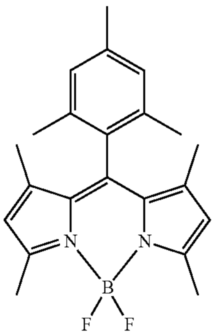
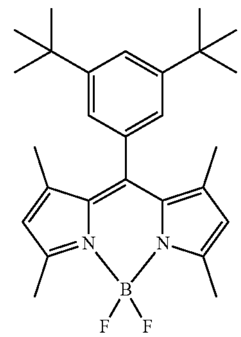
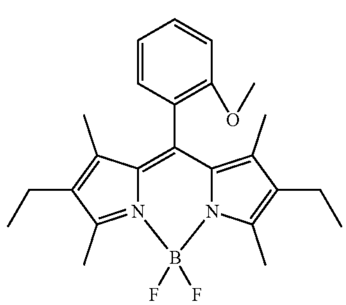
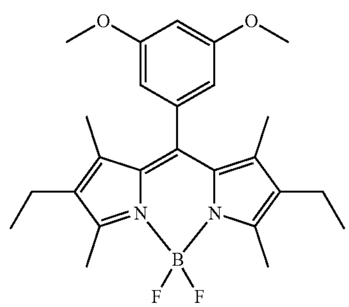
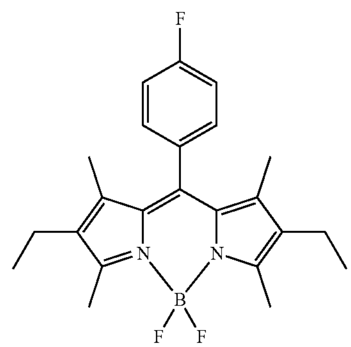
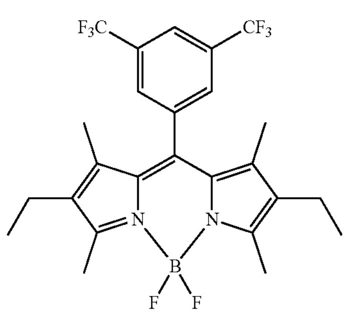
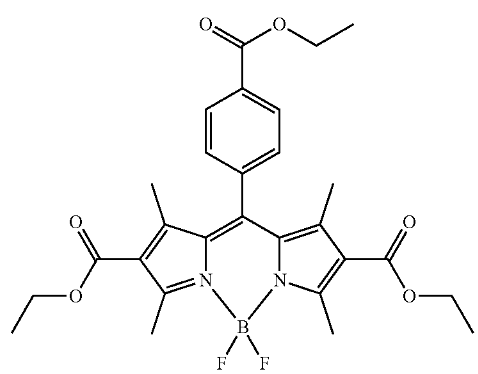
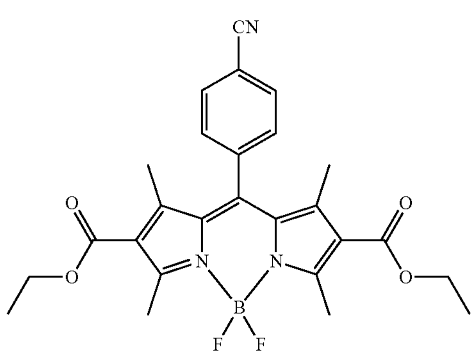
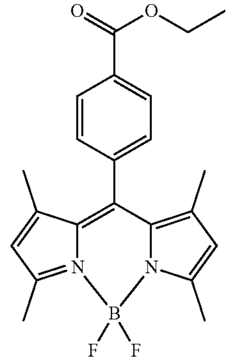
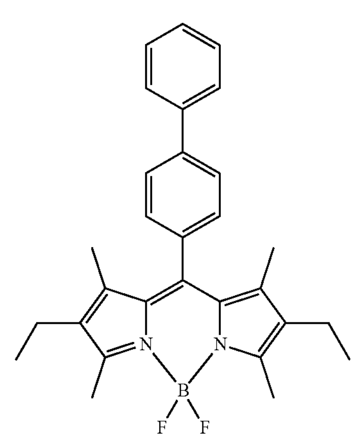

-continued
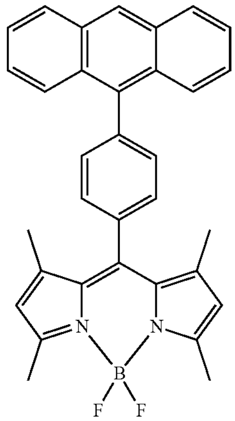
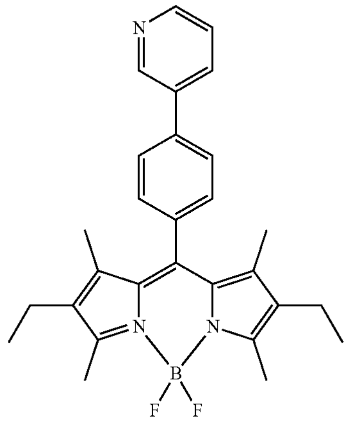
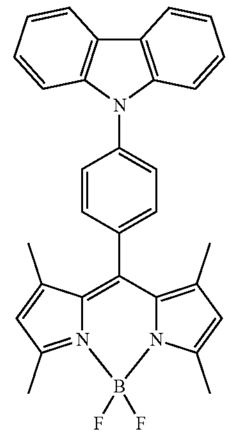
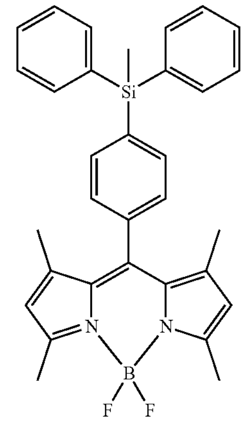
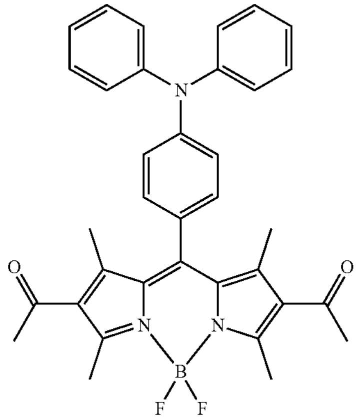
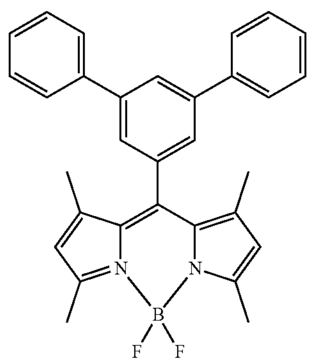
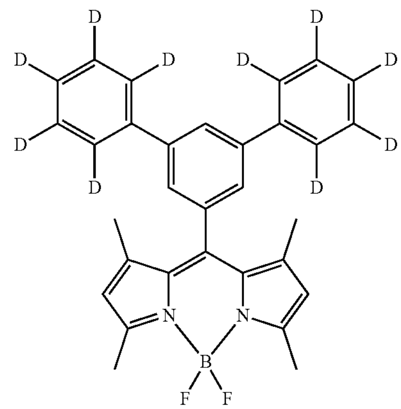
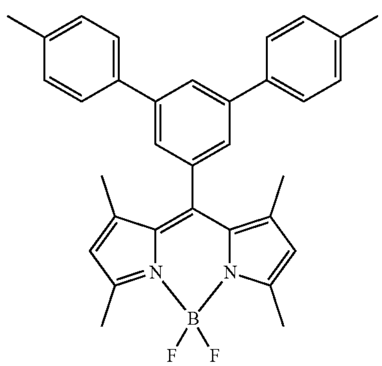
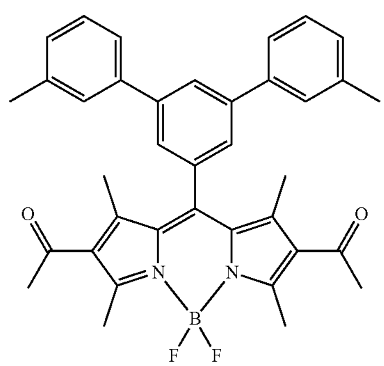
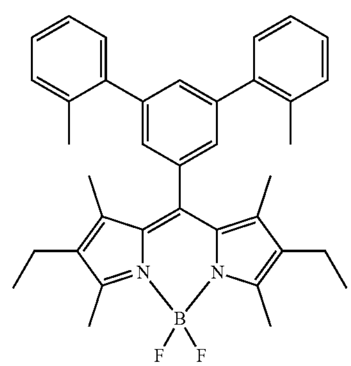
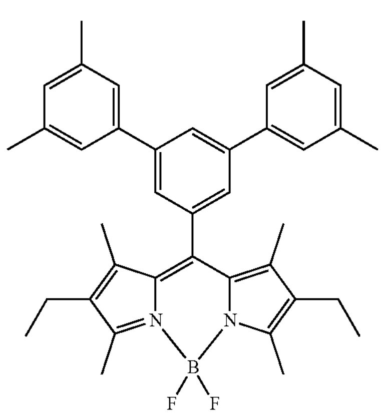
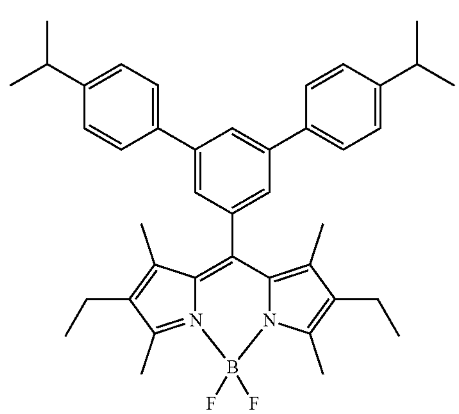

-continued
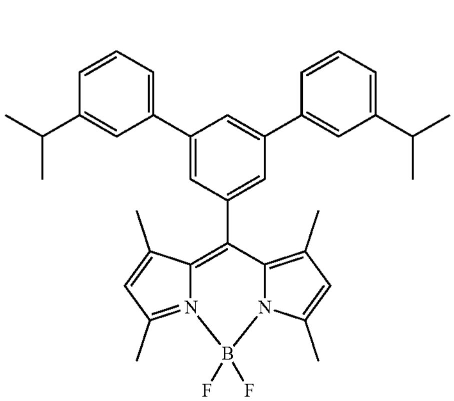
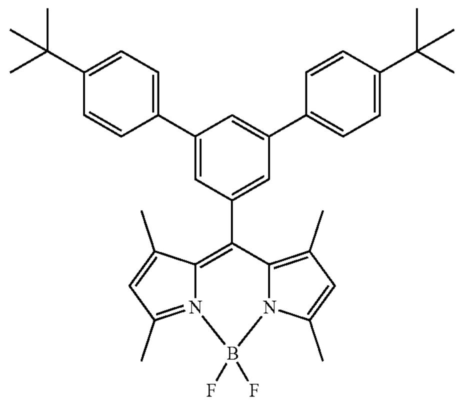
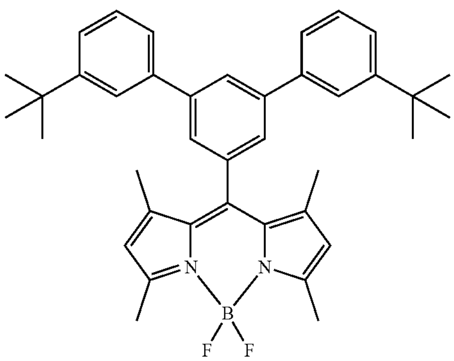
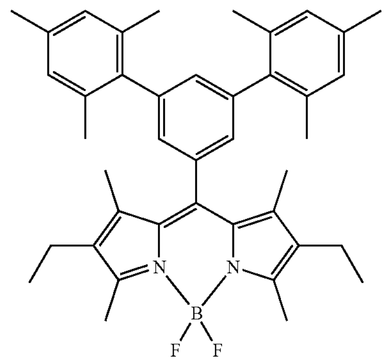
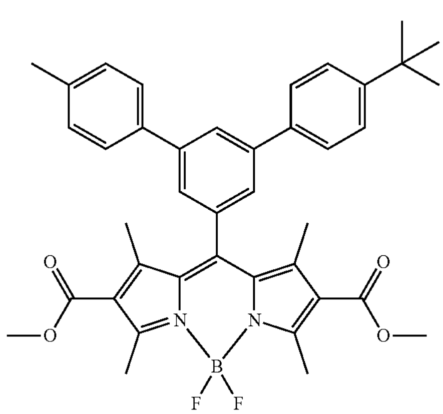
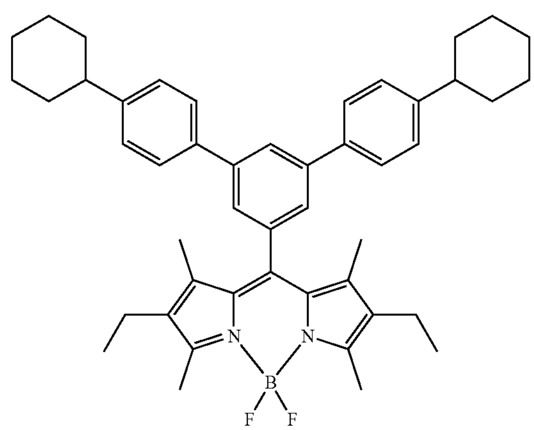
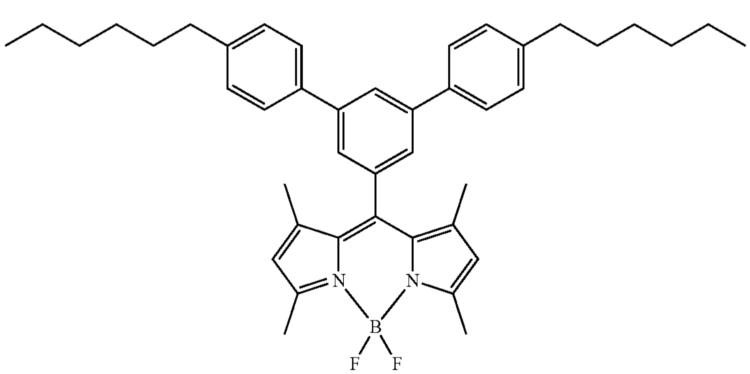
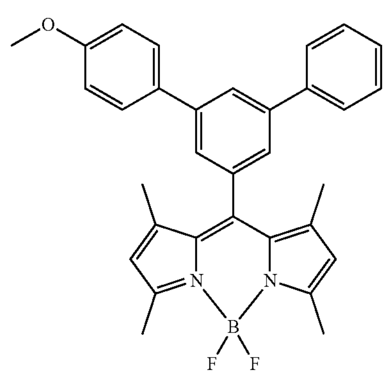

-continued
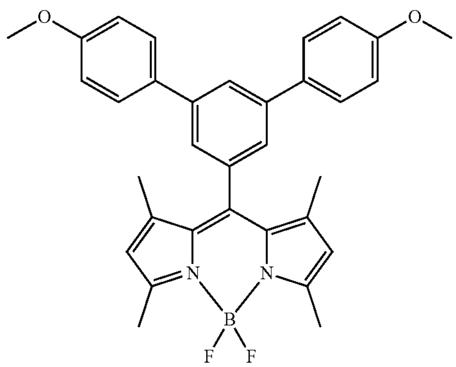
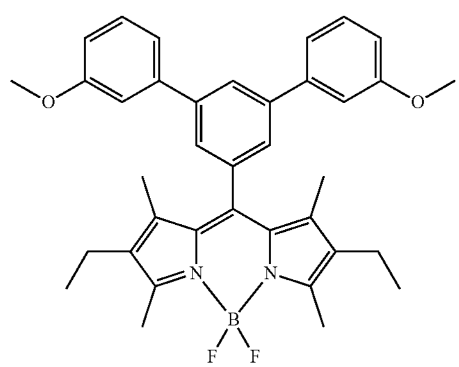
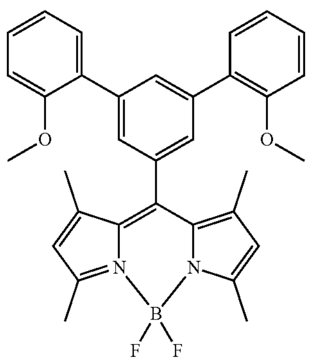
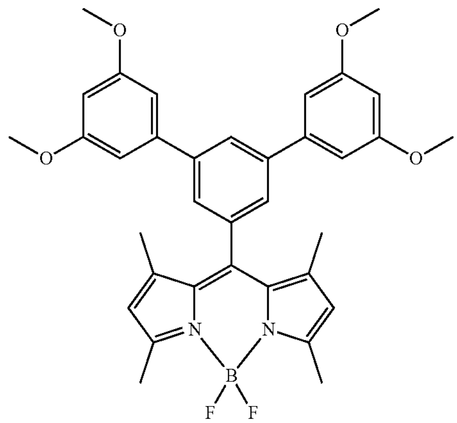
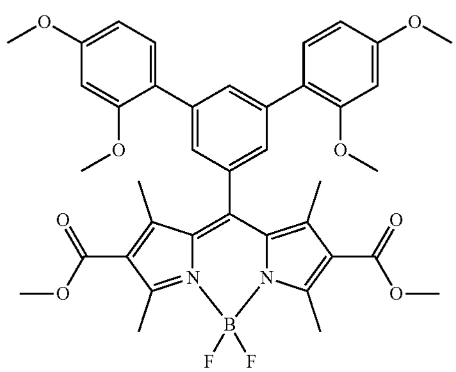
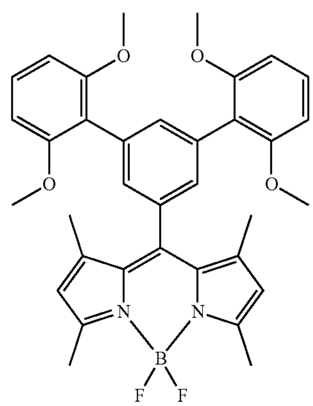
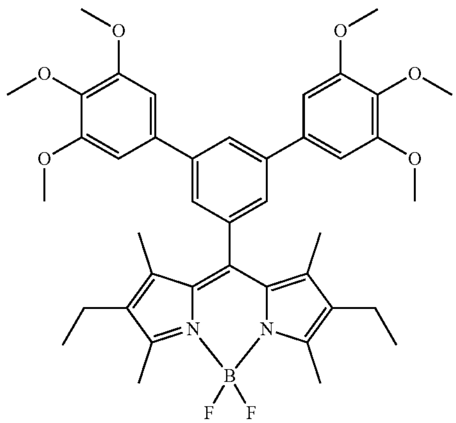
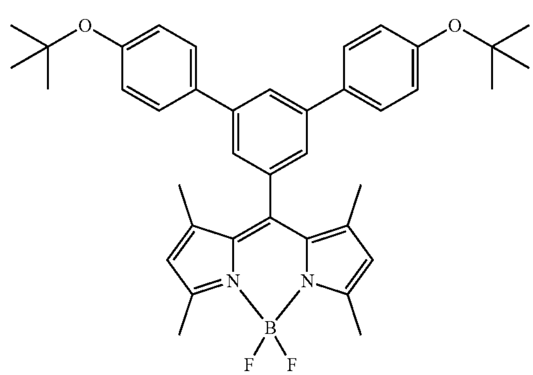

-continued
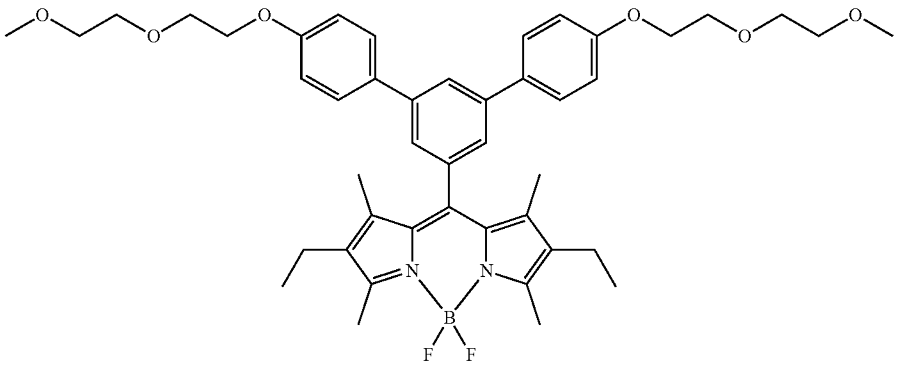
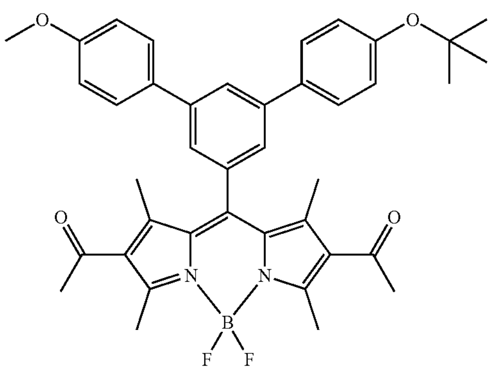
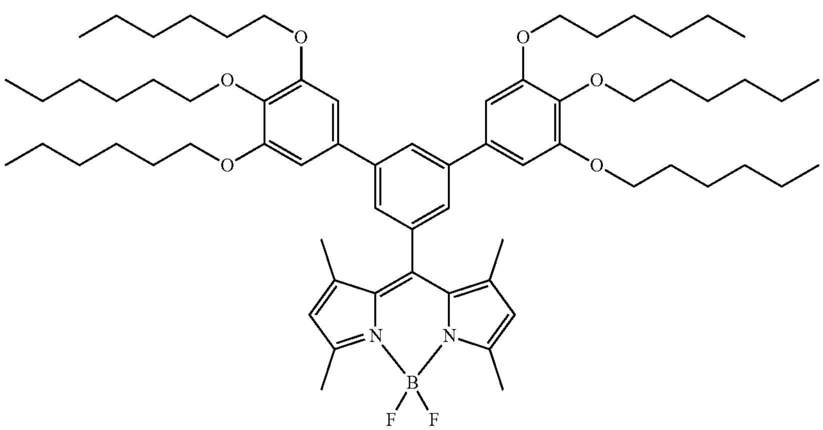
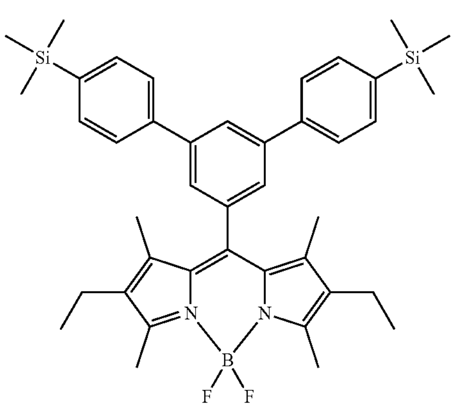
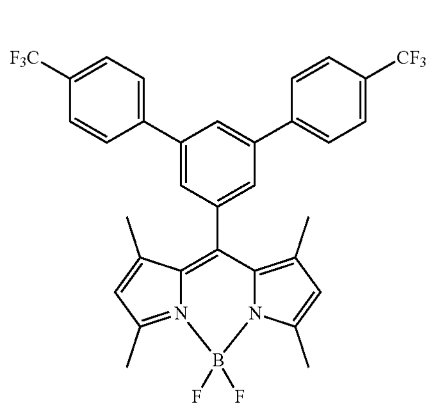

-continued
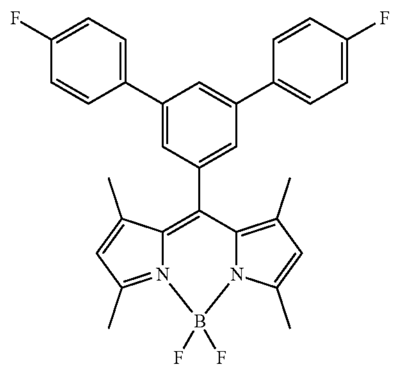
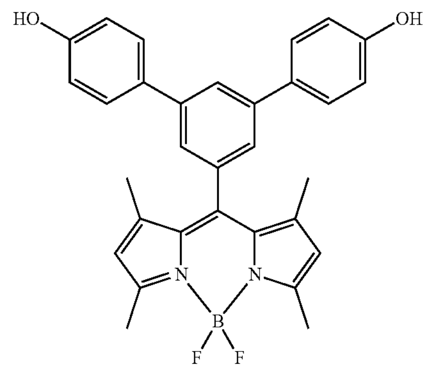
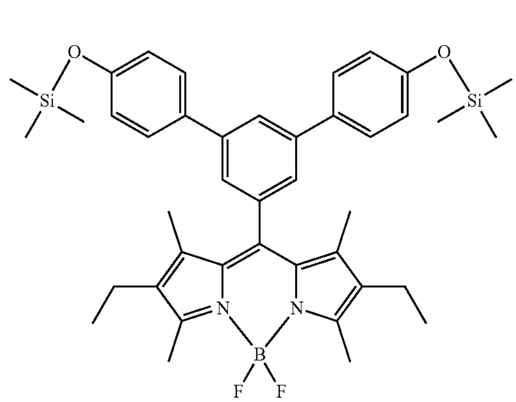
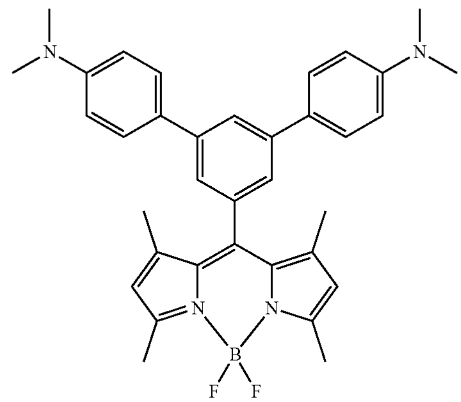
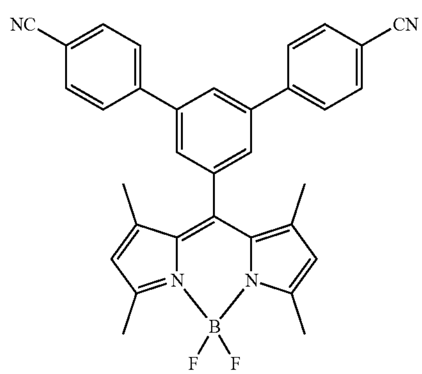
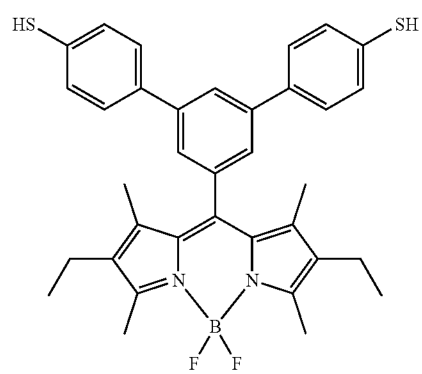
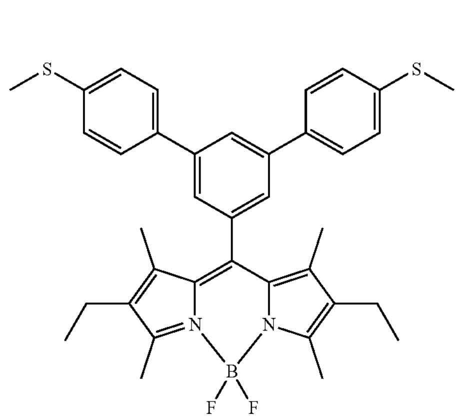
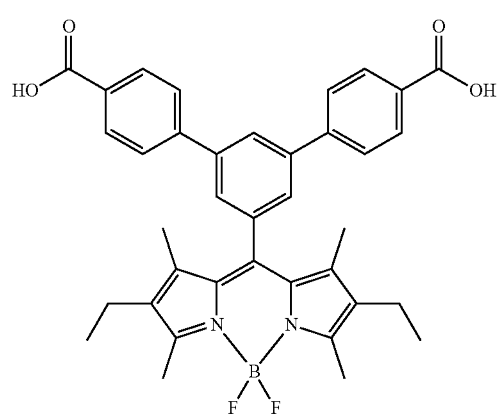

-continued
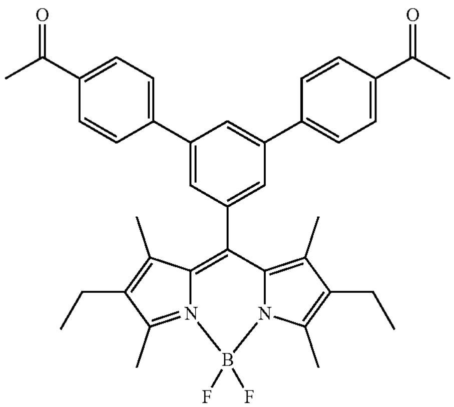
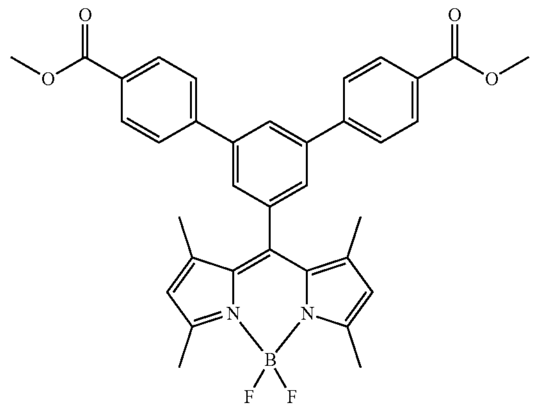
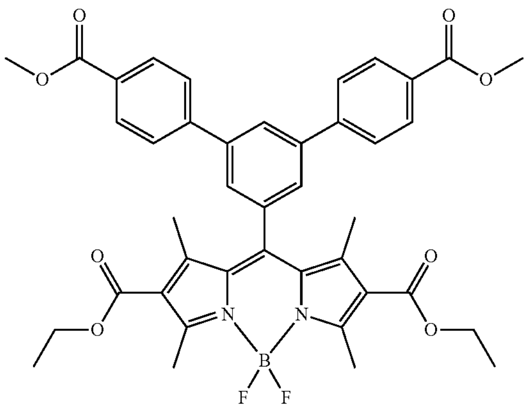
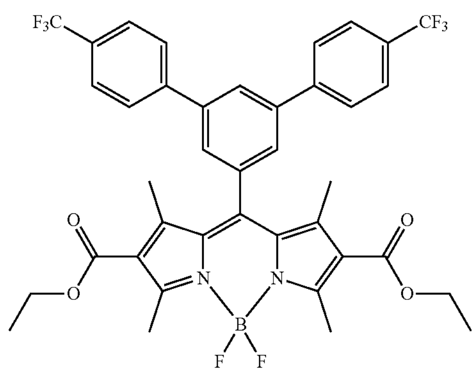
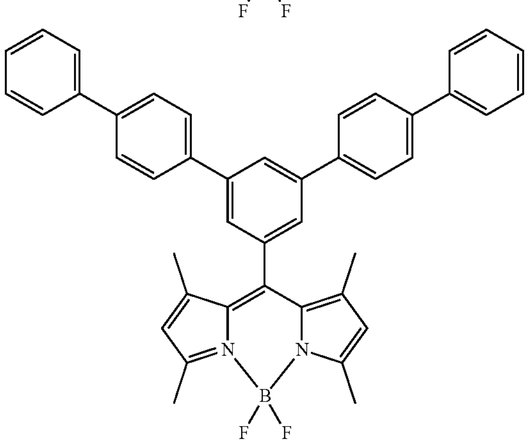
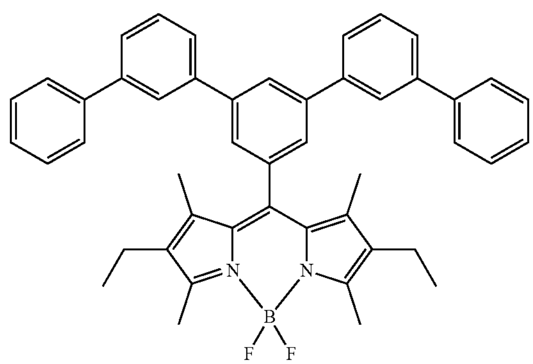
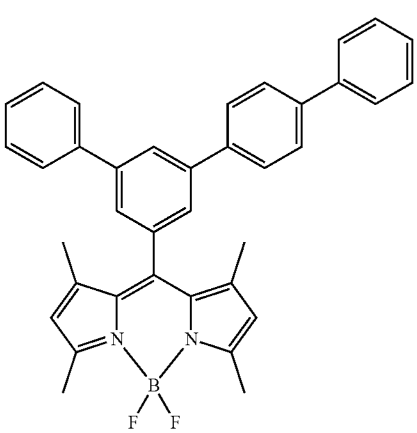
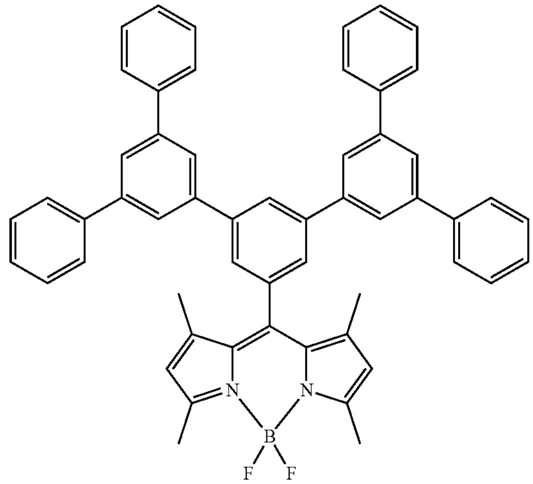

-continued
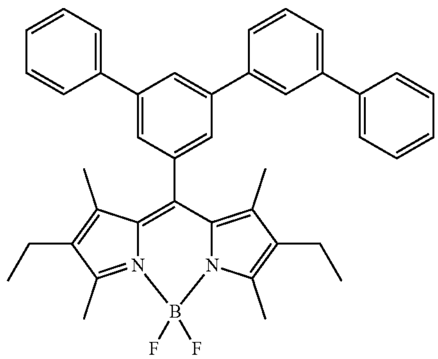
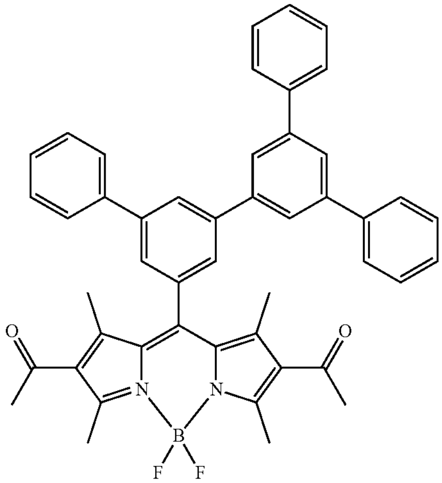
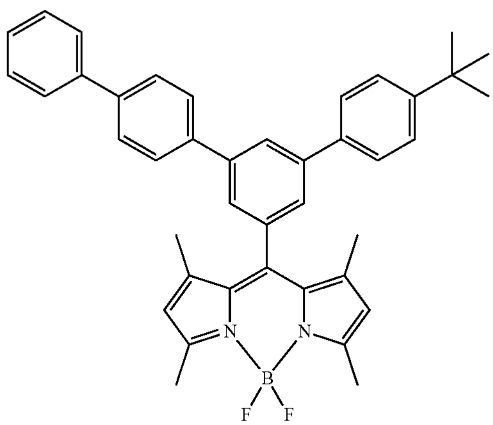
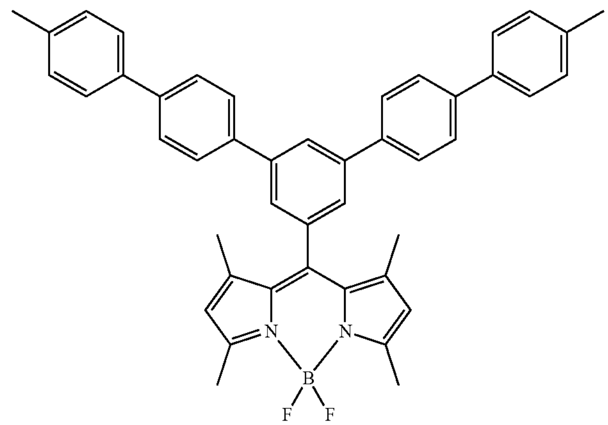
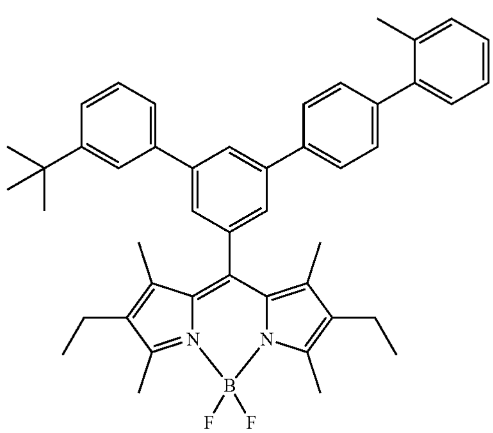
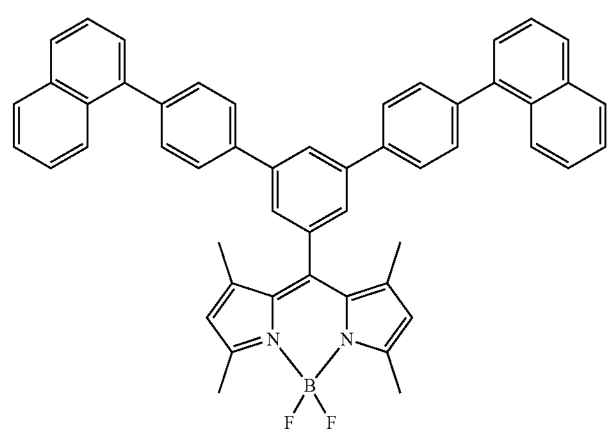

-continued
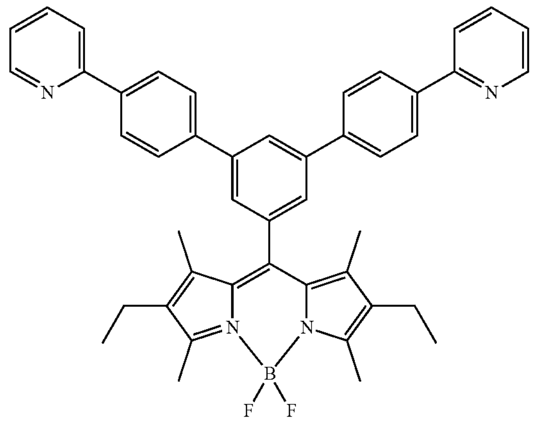
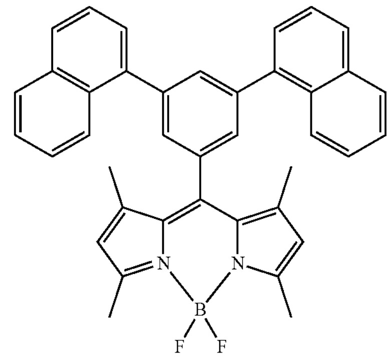
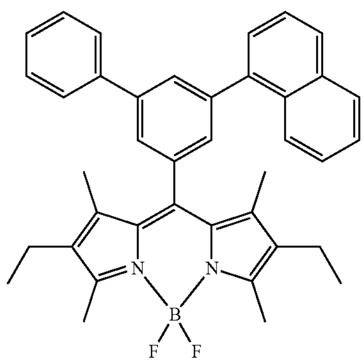
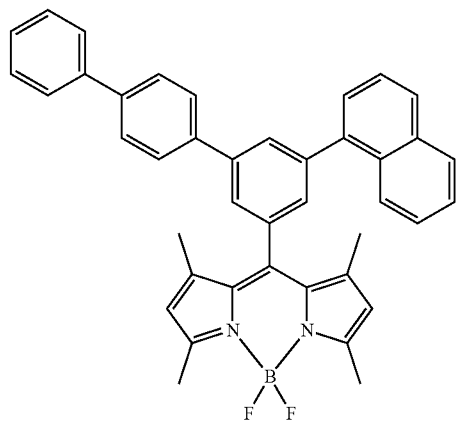
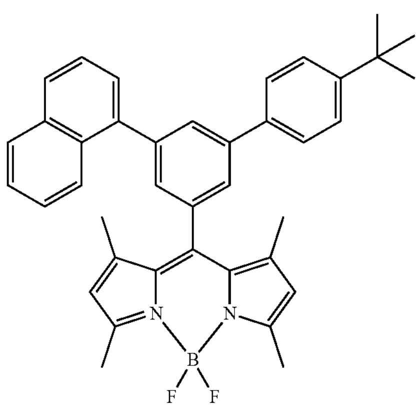
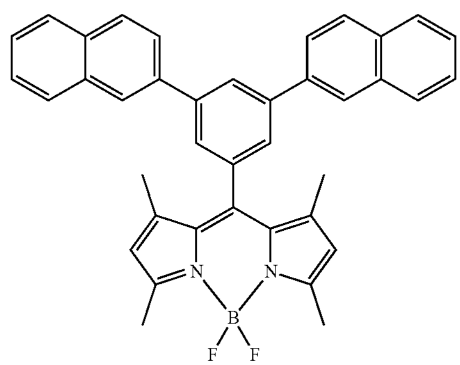
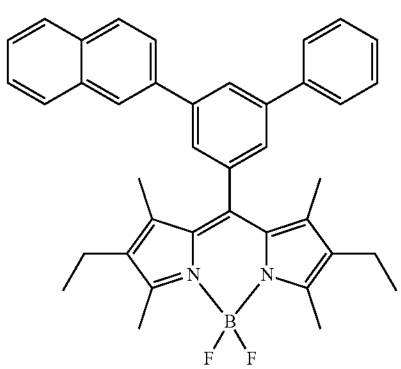
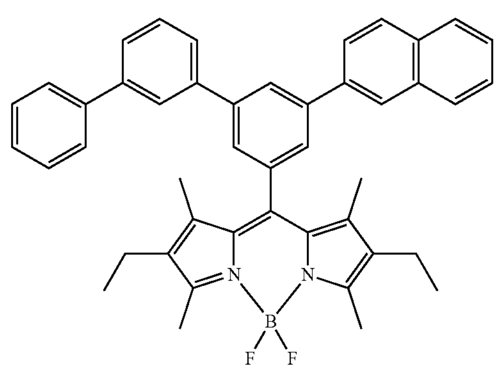

-continued
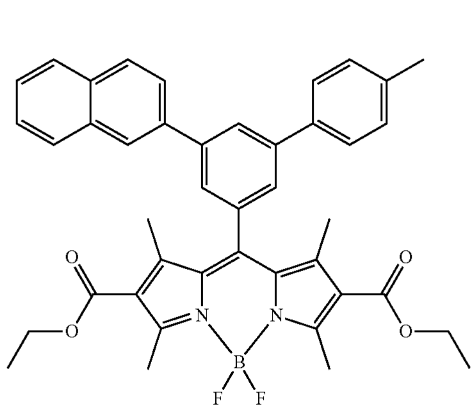
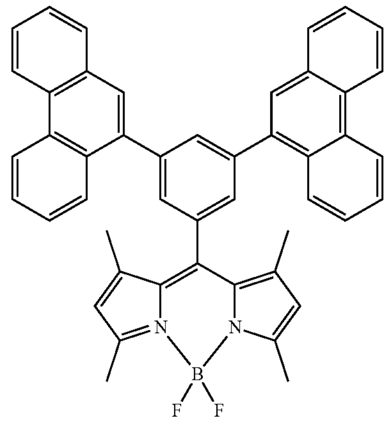
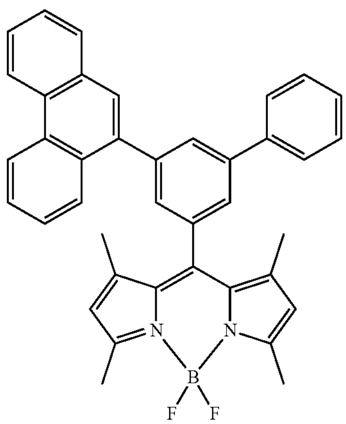
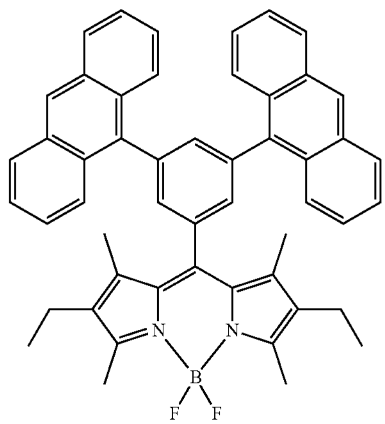
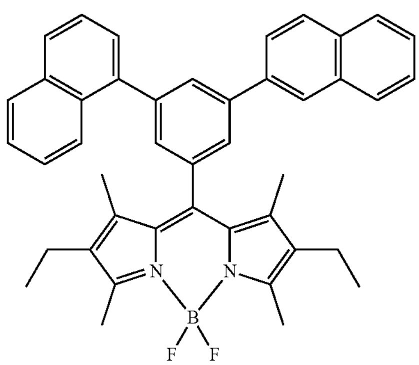
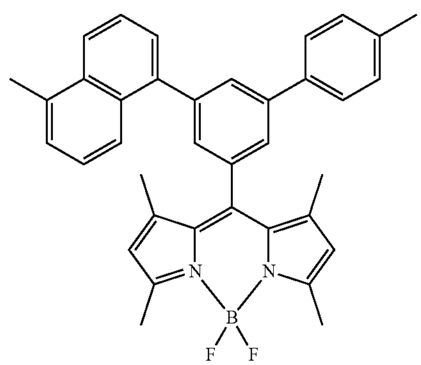
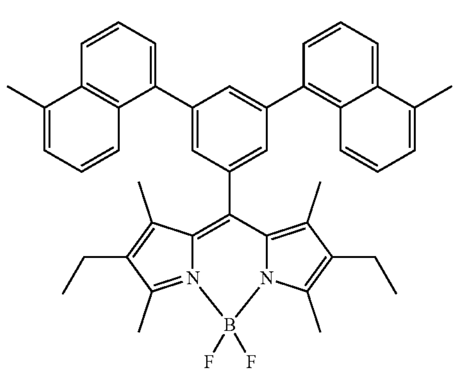
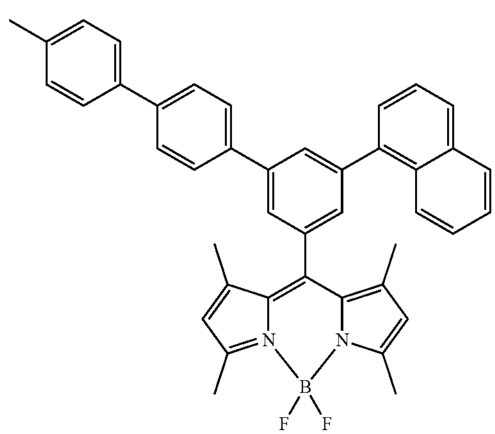

-continued
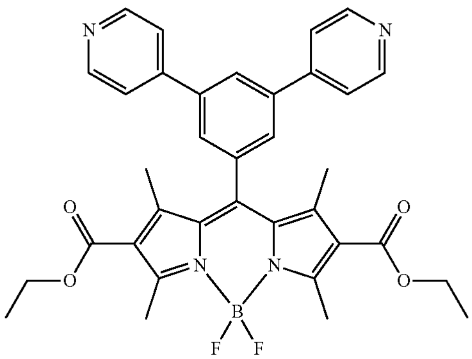
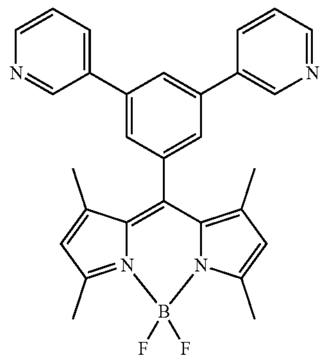
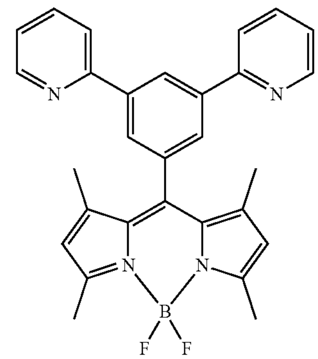
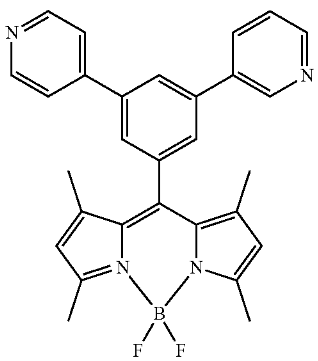
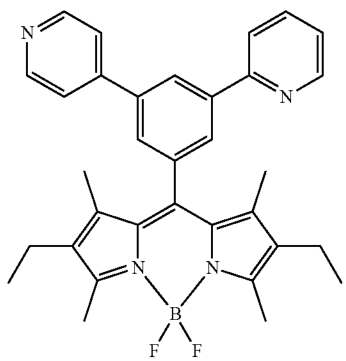
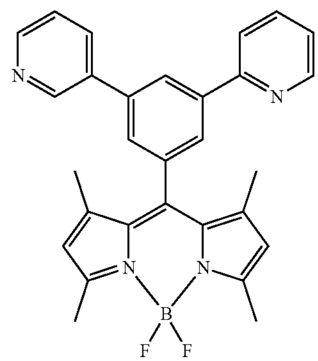
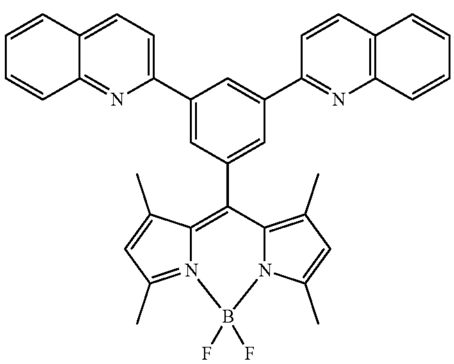
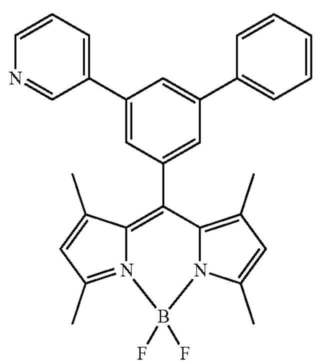
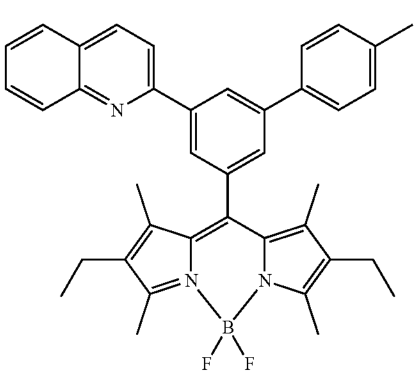
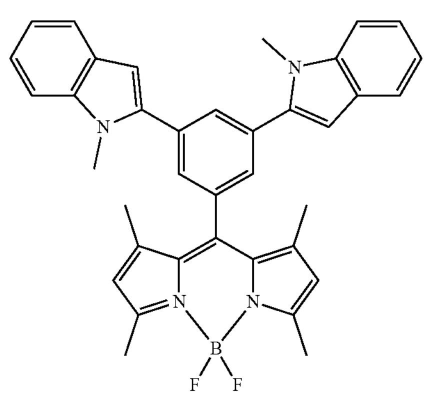

-continued
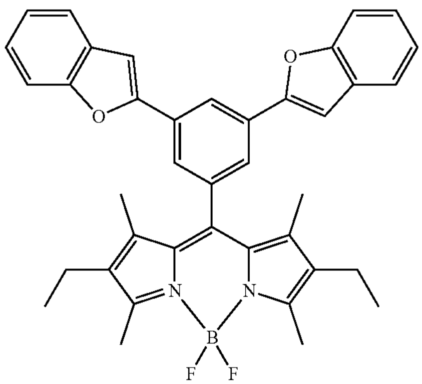
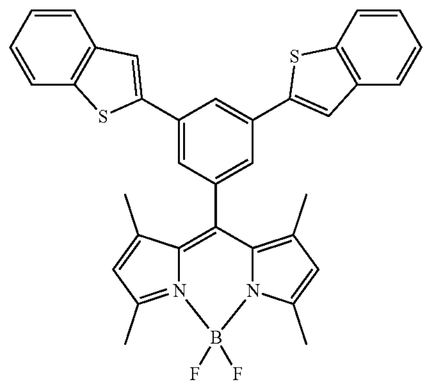
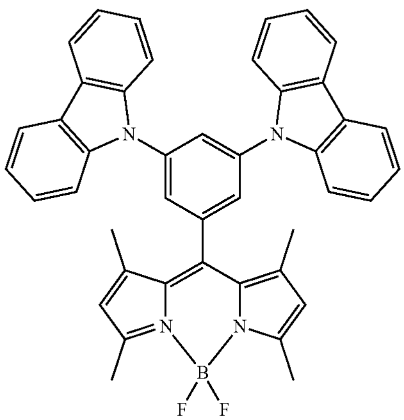
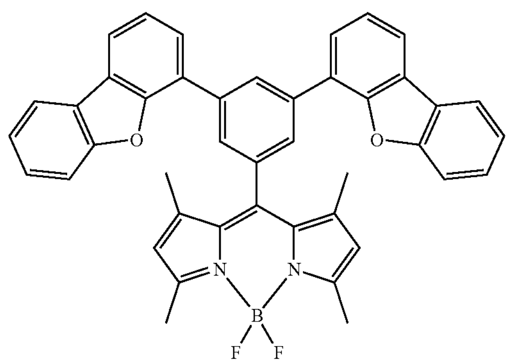
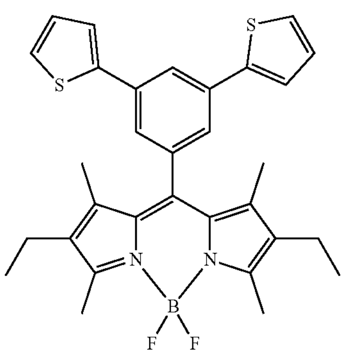
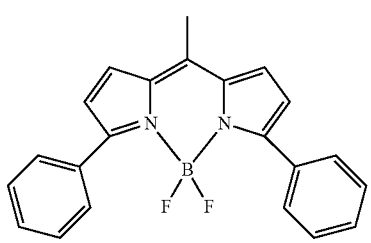
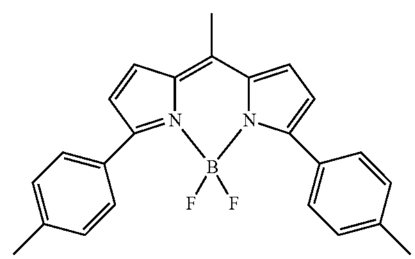
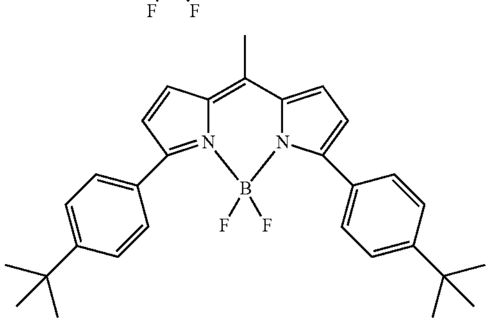
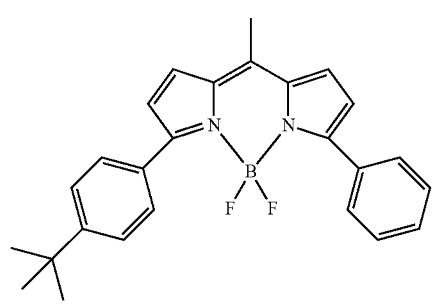
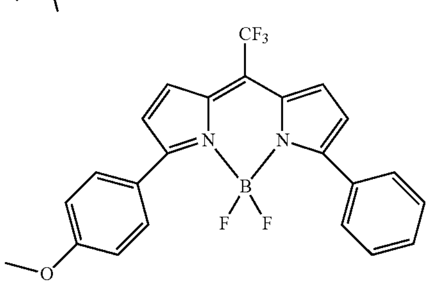
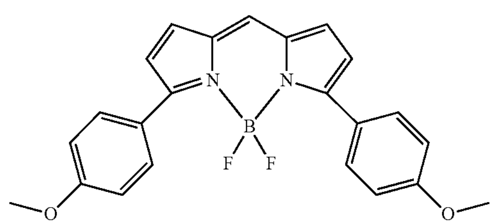

-continued
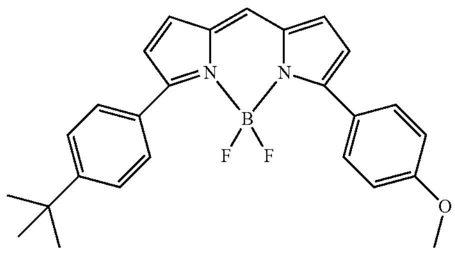
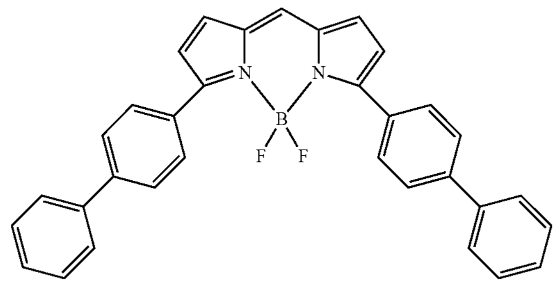
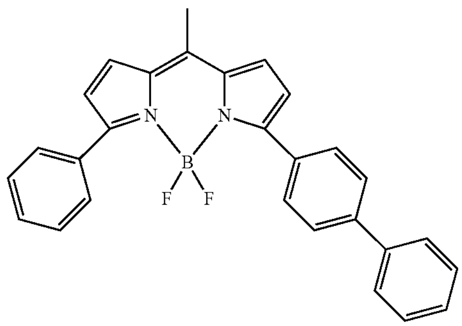
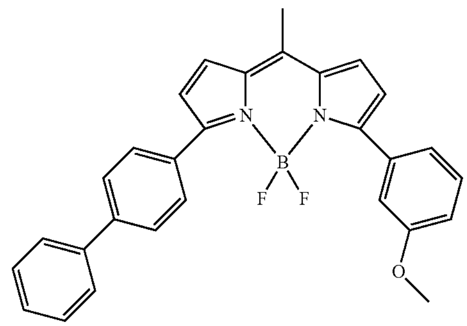
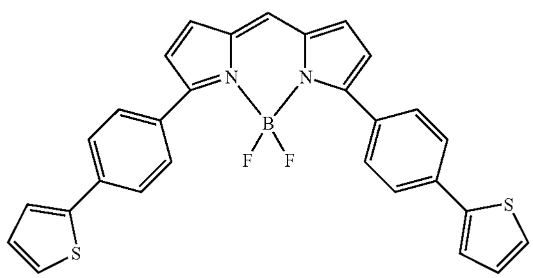
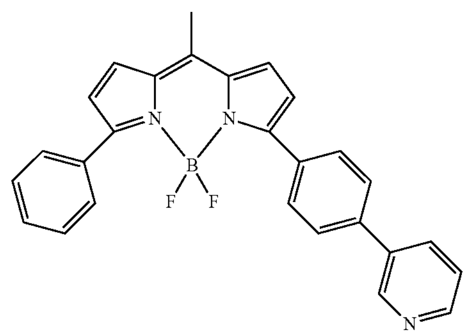
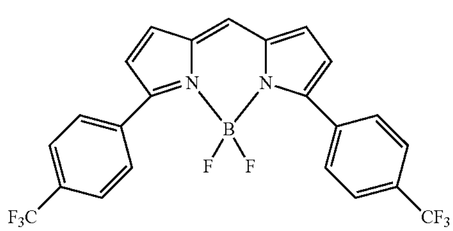
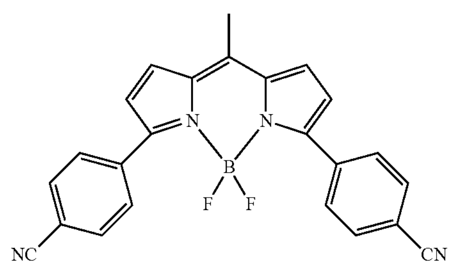
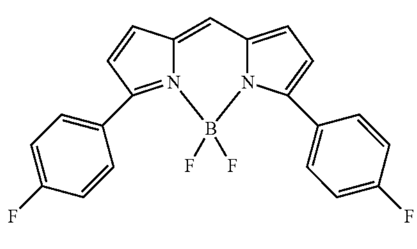
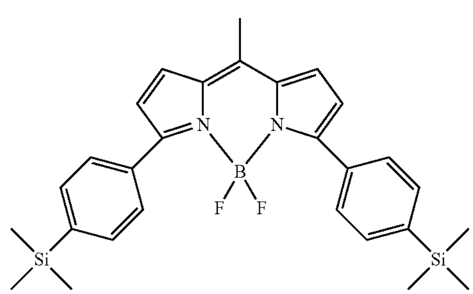

-continued
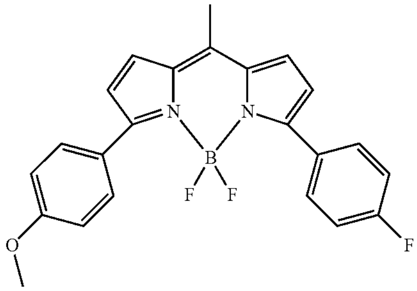
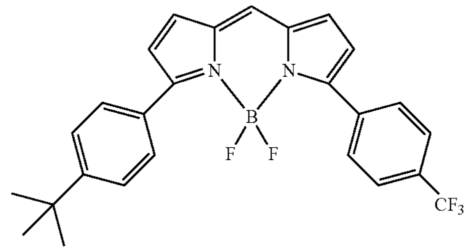
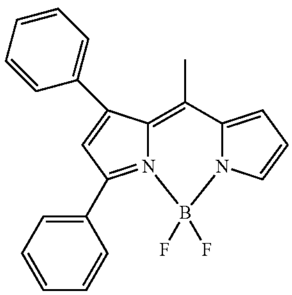
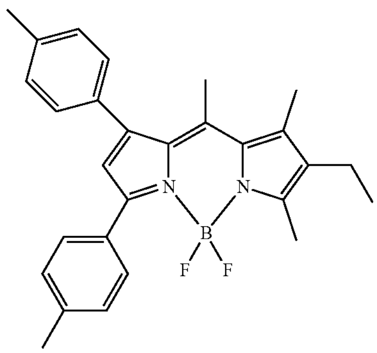
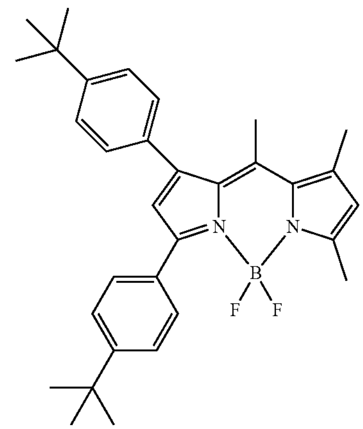
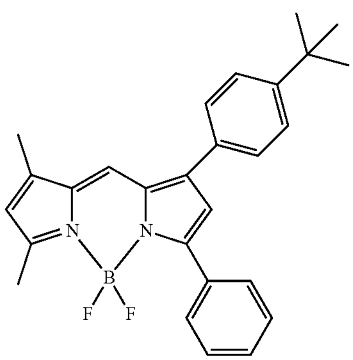
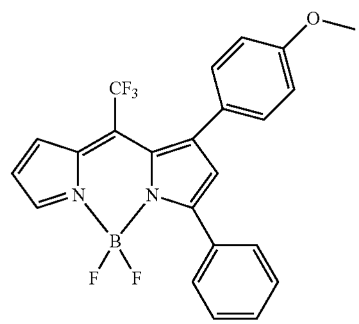
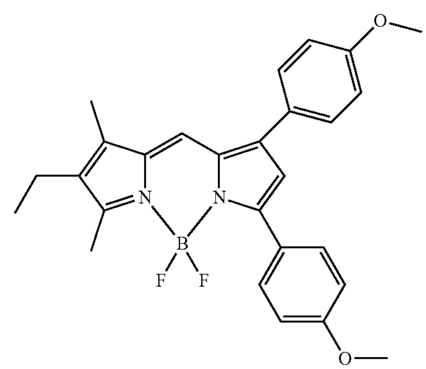
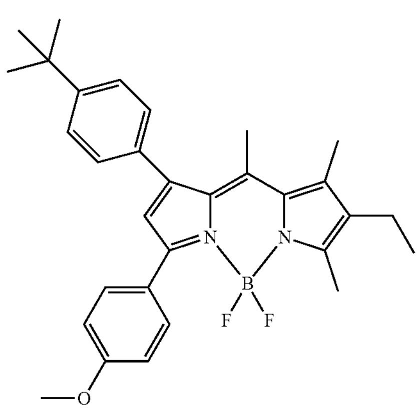
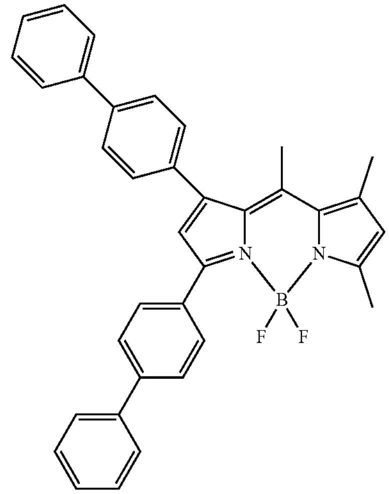

-continued
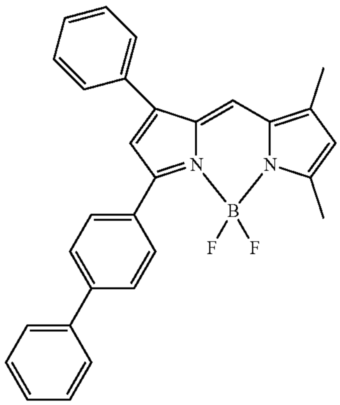
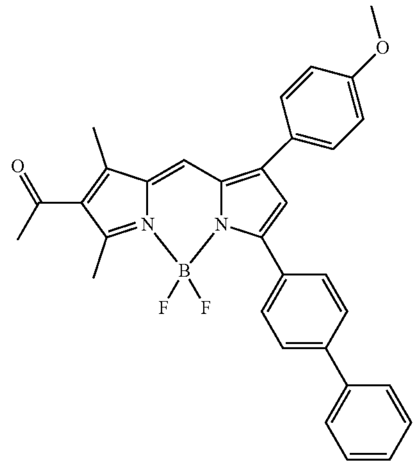
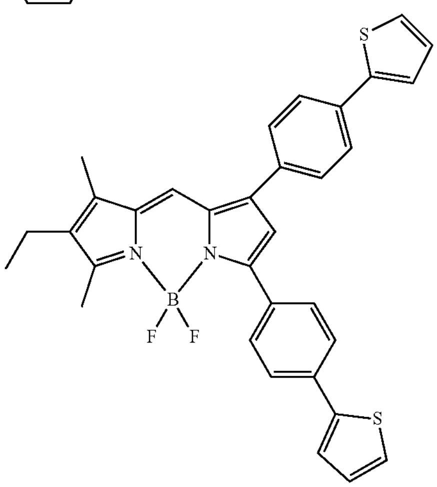
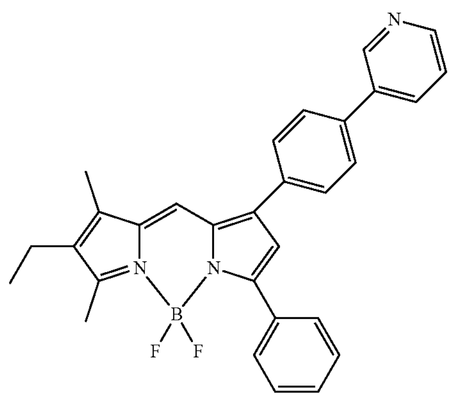
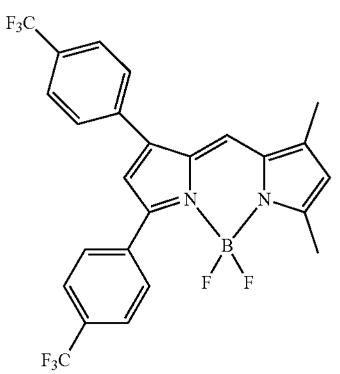
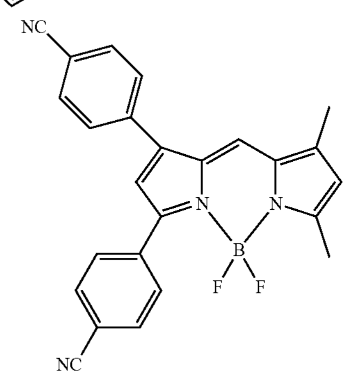
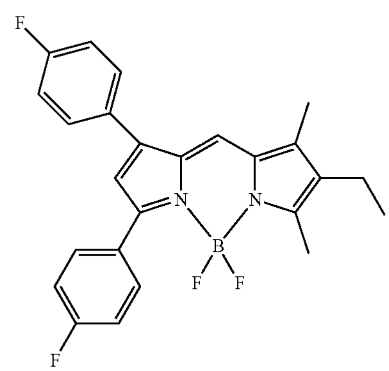
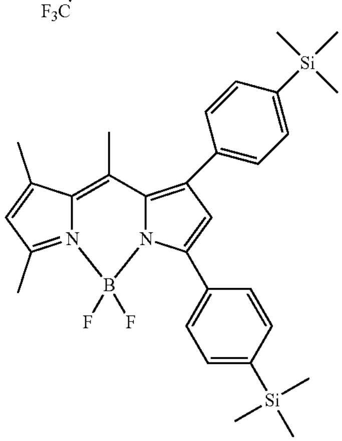
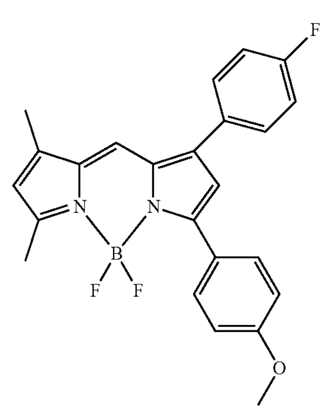
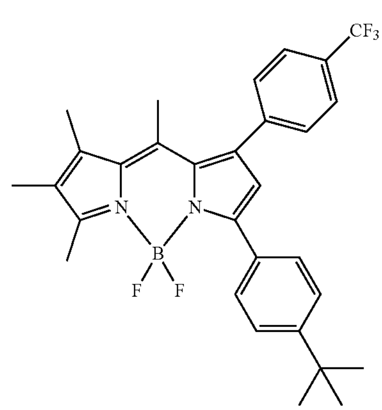

-continued
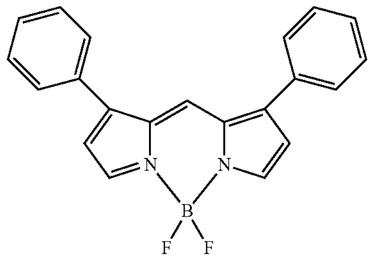
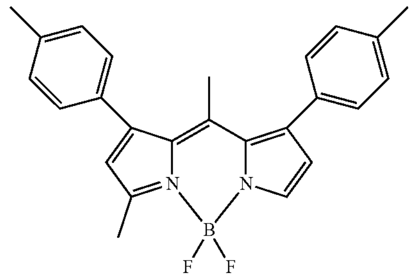
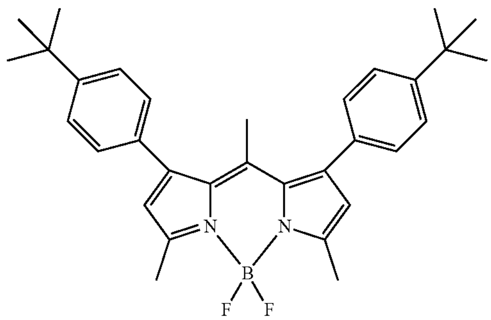
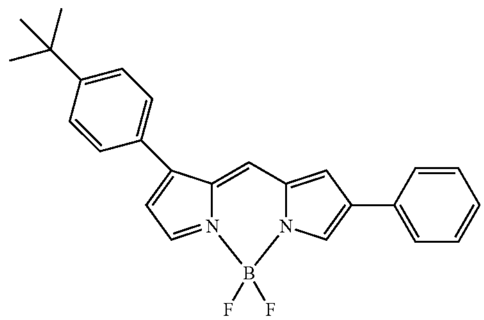
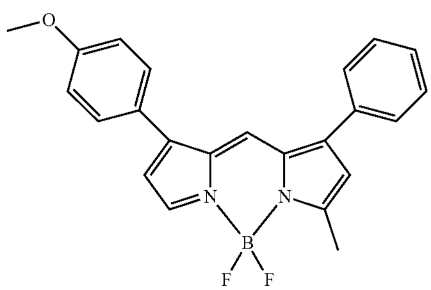
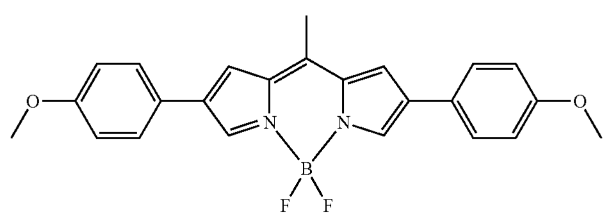
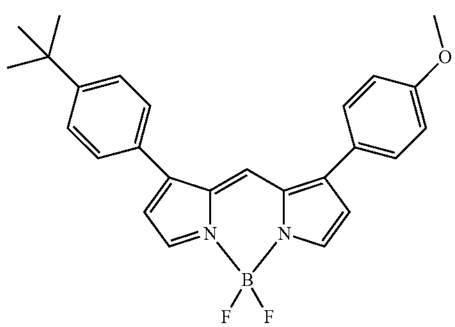
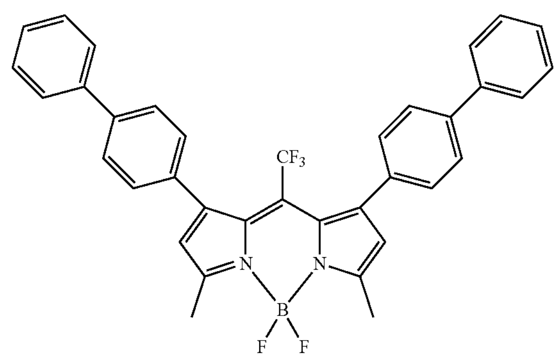
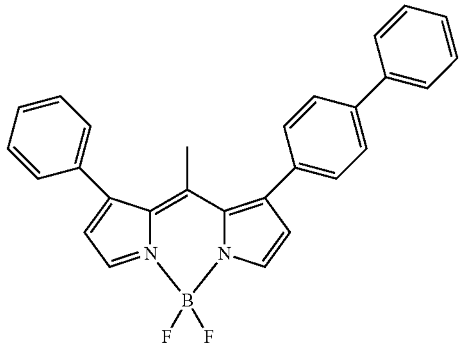
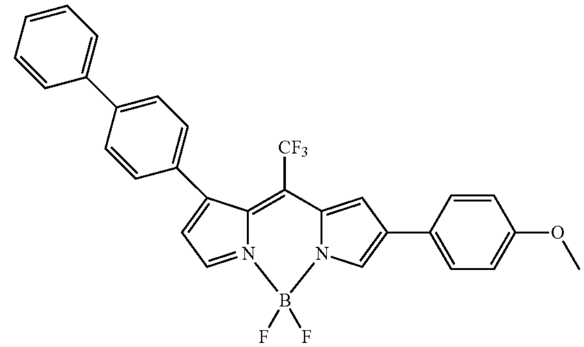

-continued
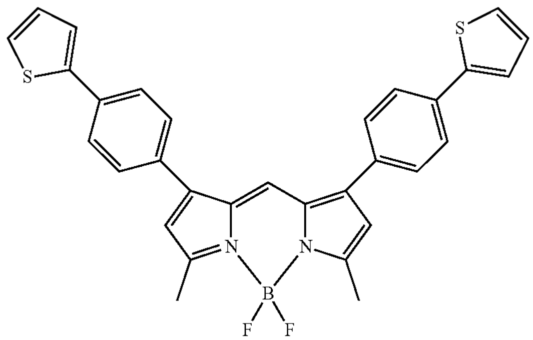
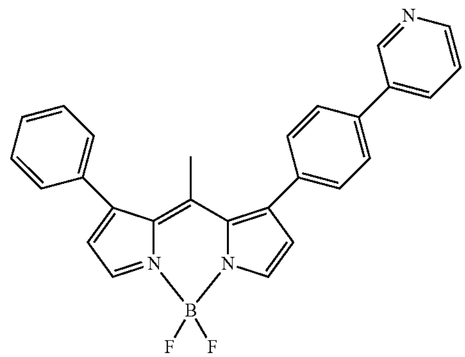
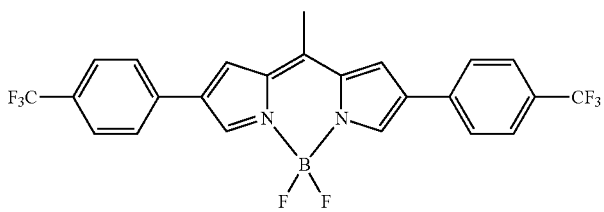
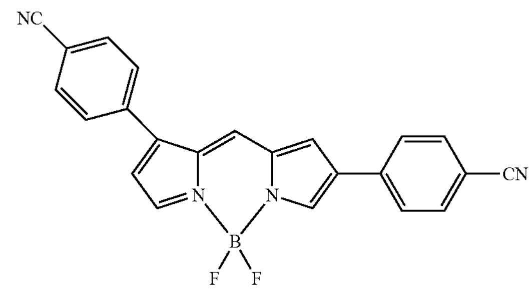
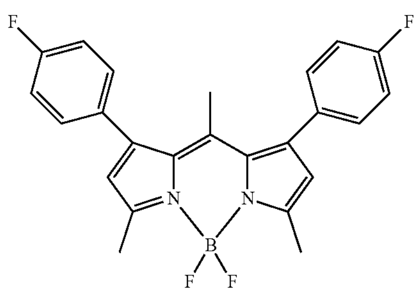
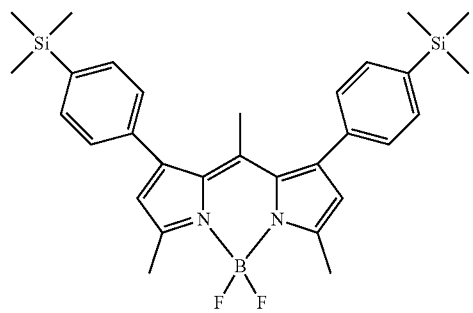
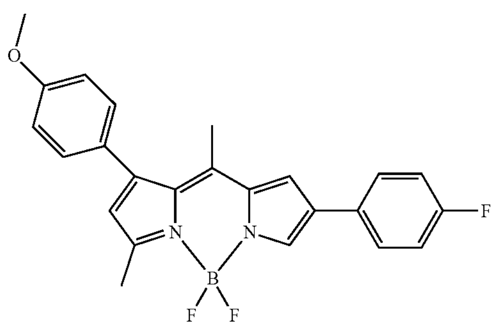
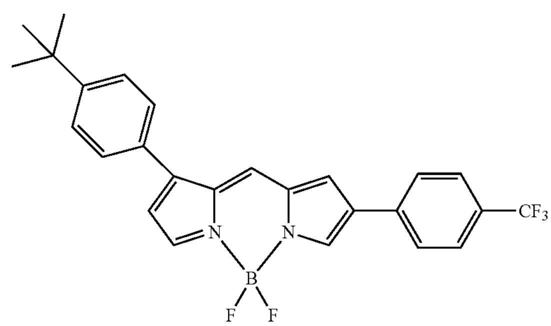
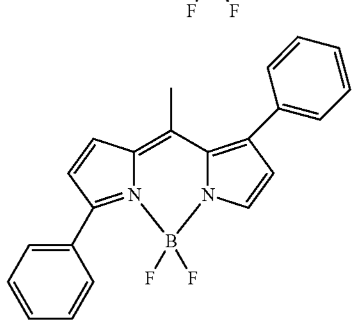
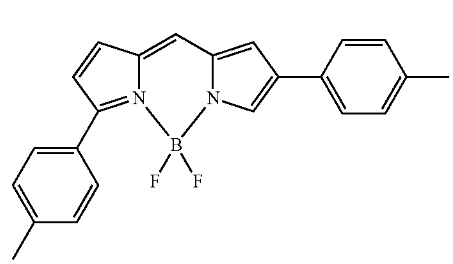

-continued
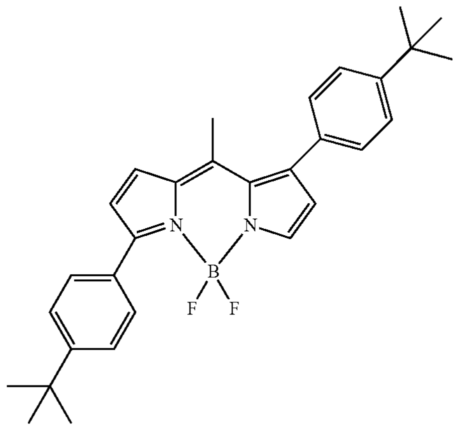
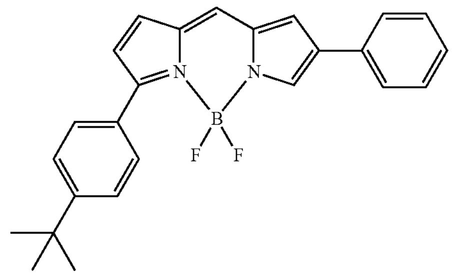
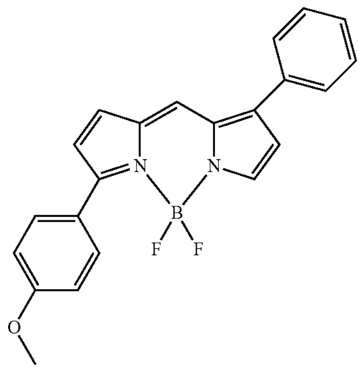
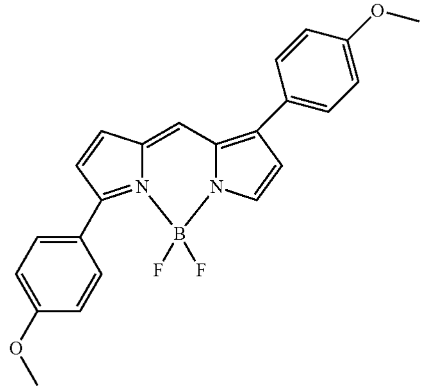
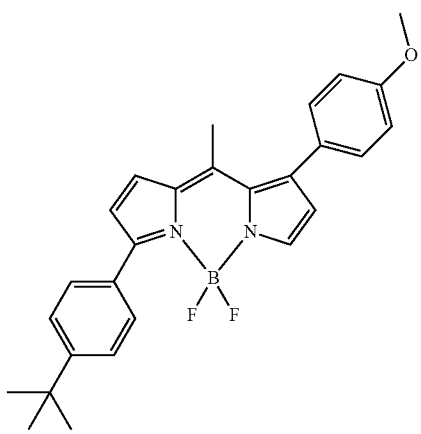
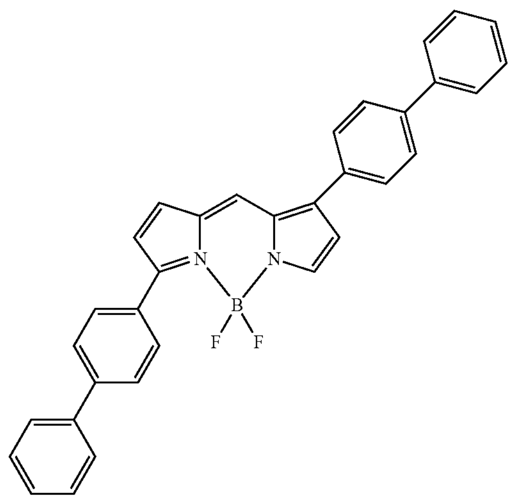
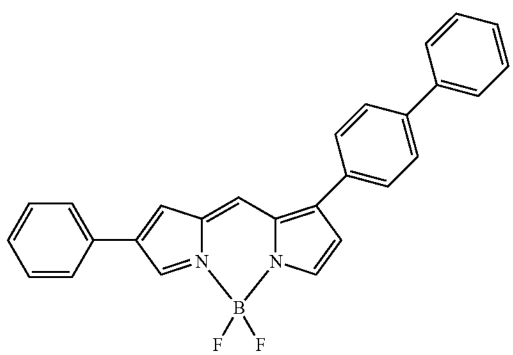
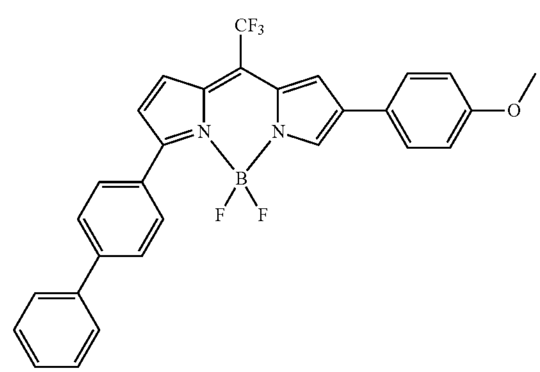

-continued
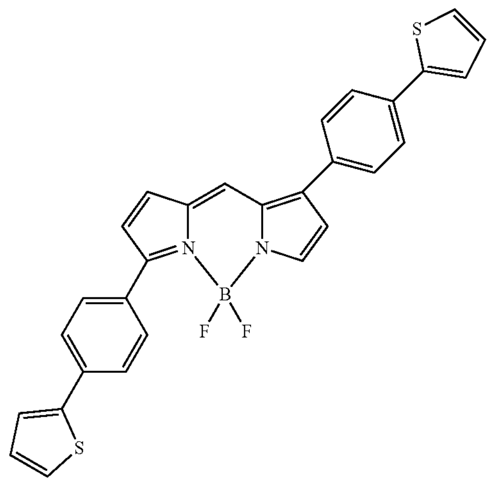
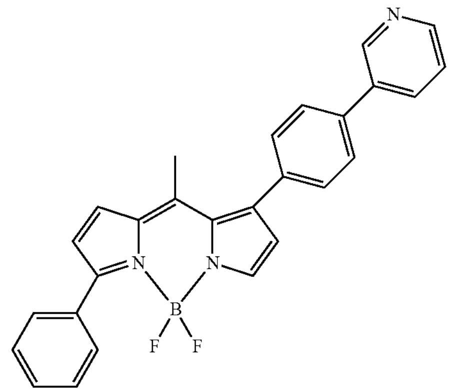
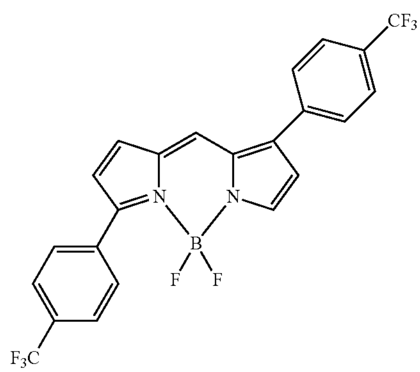
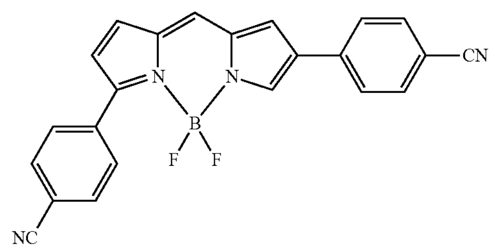
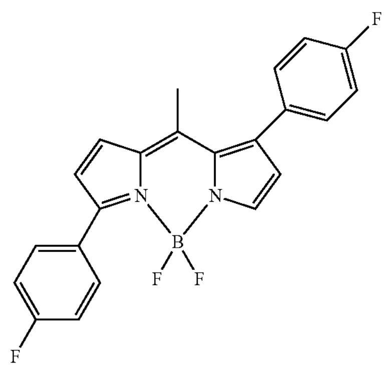
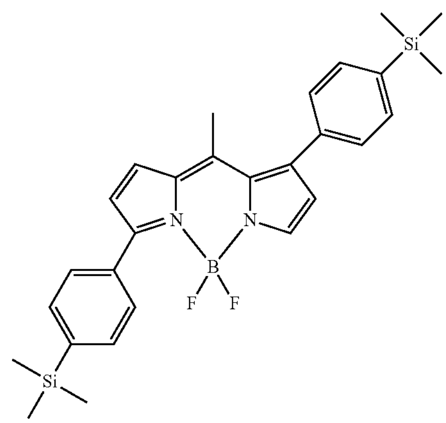
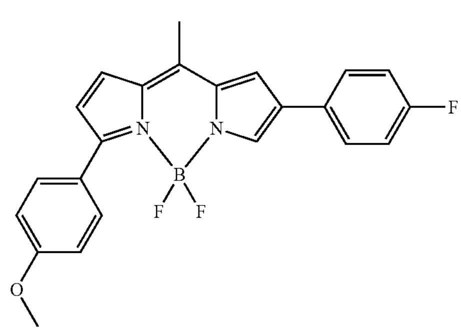
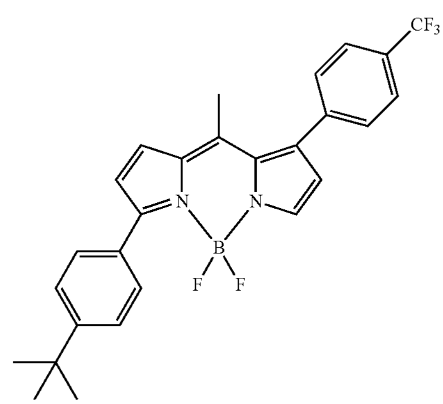

-continued
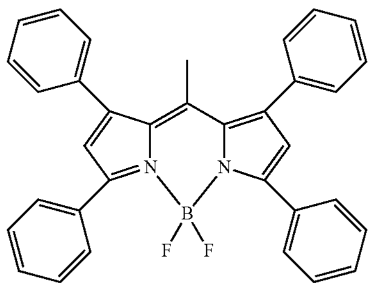
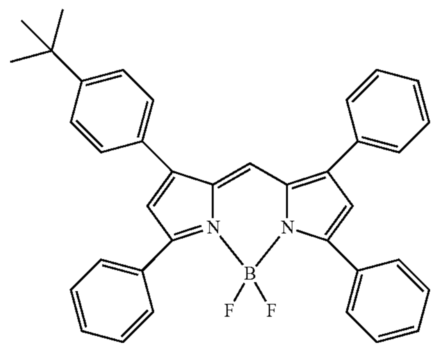
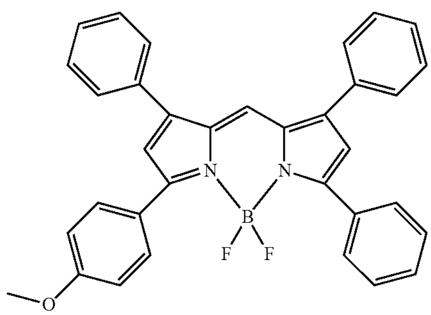
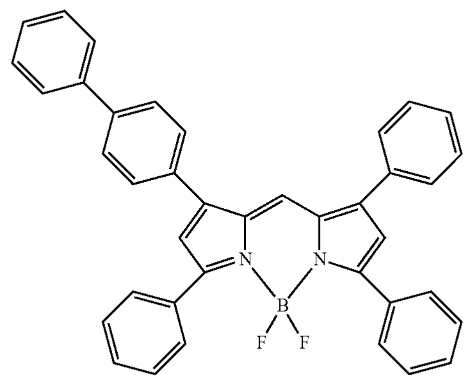
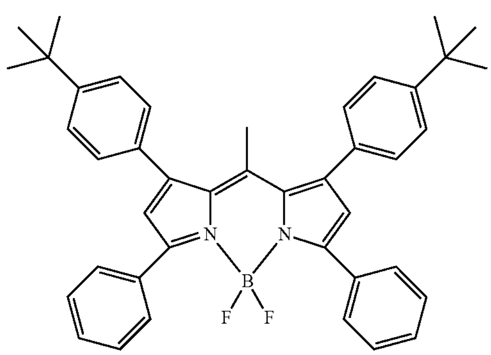
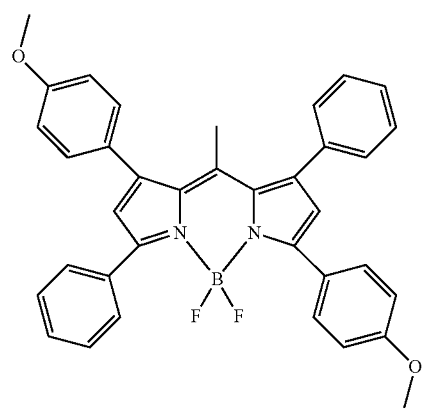
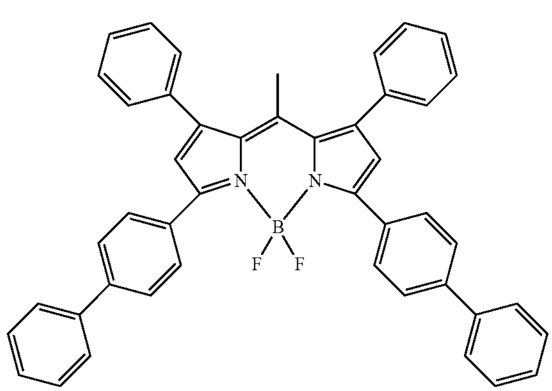
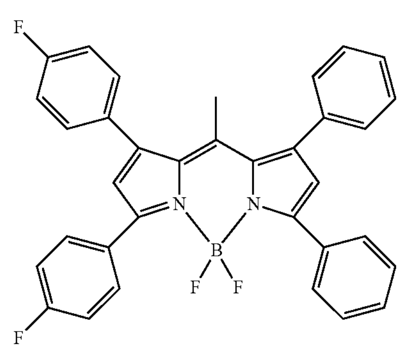

-continued
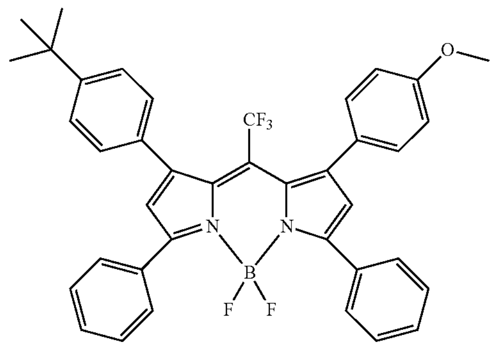
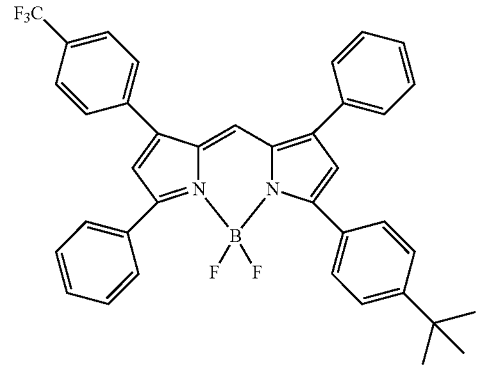
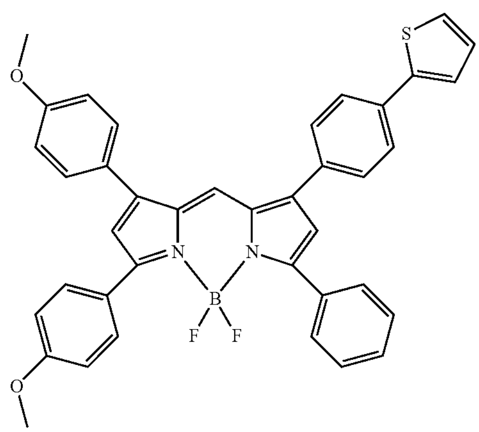
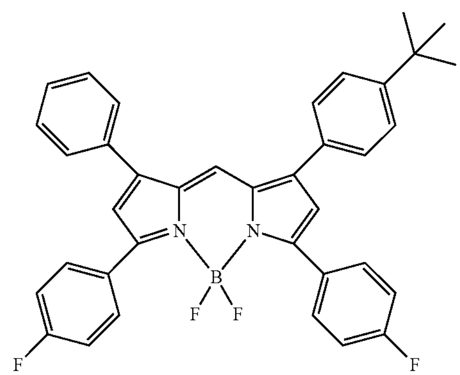
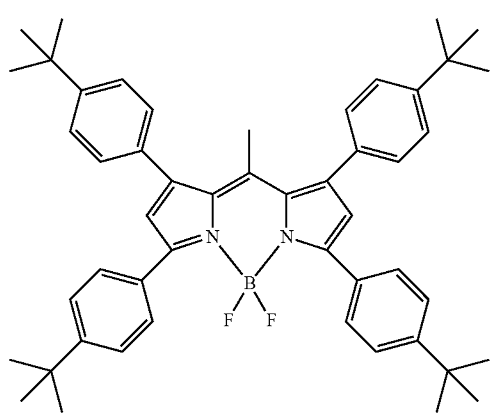
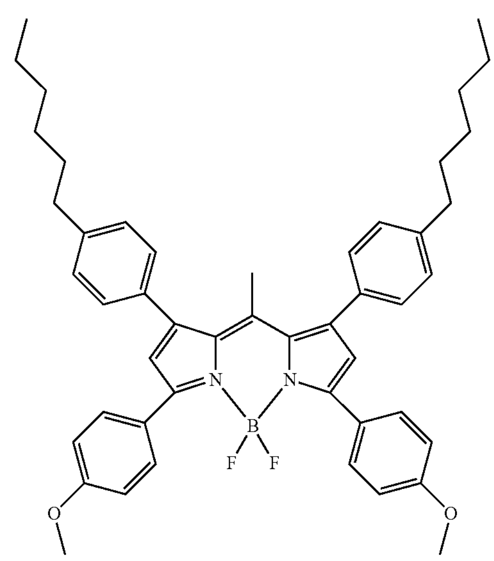

-continued
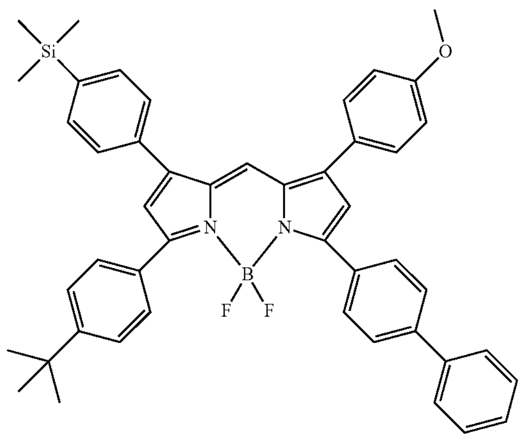
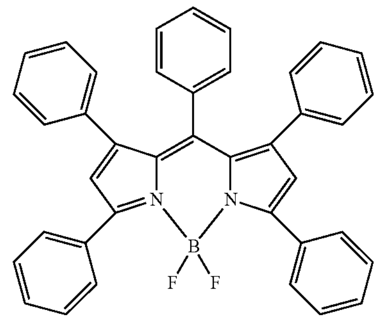
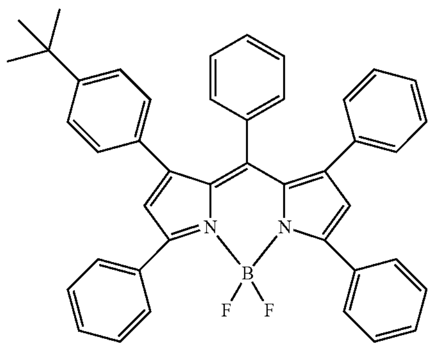
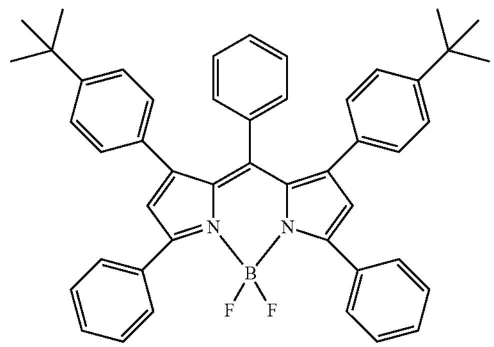
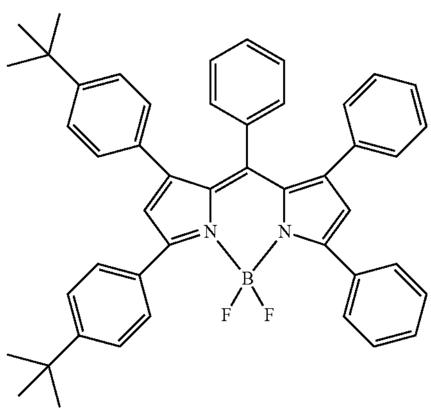
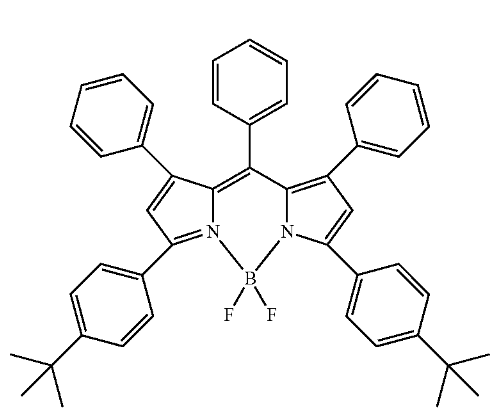
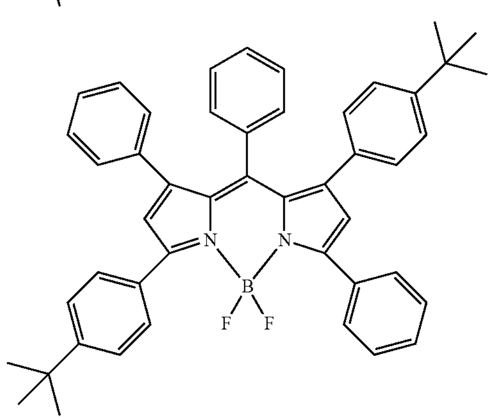
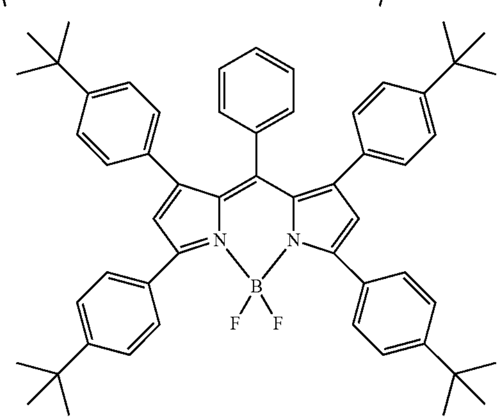

-continued
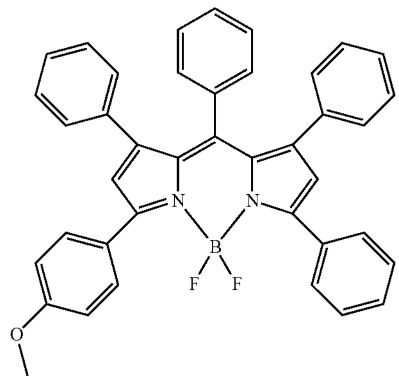
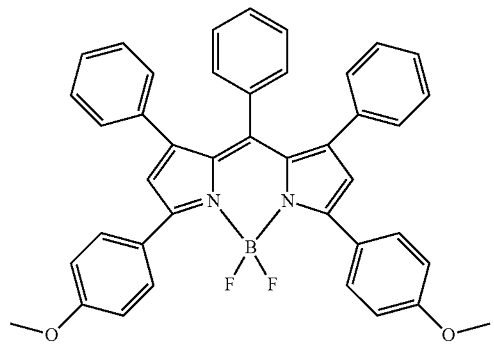
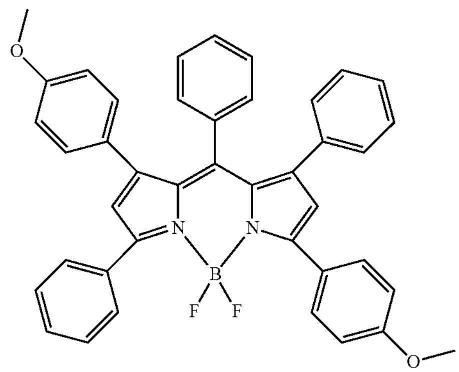
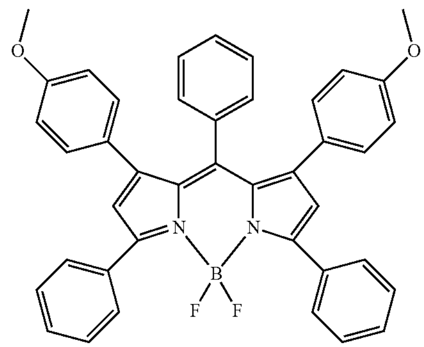
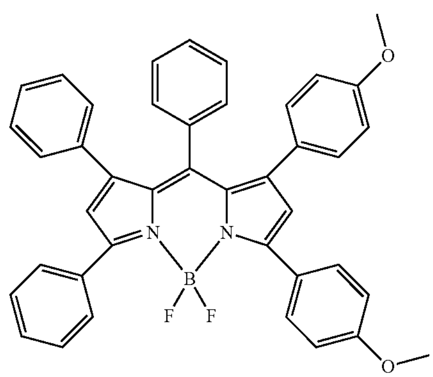
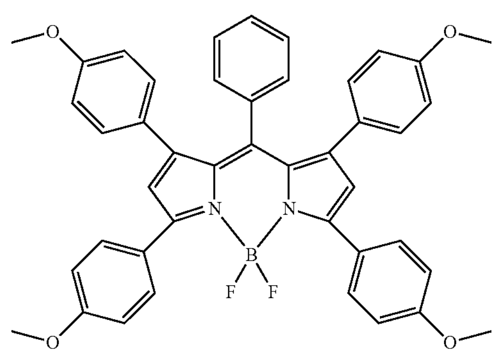
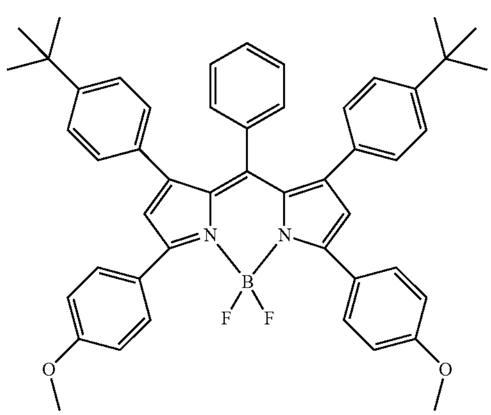
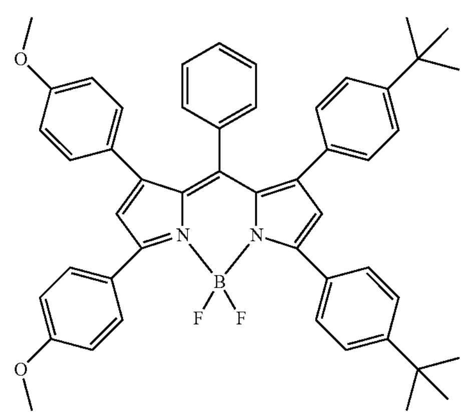

-continued
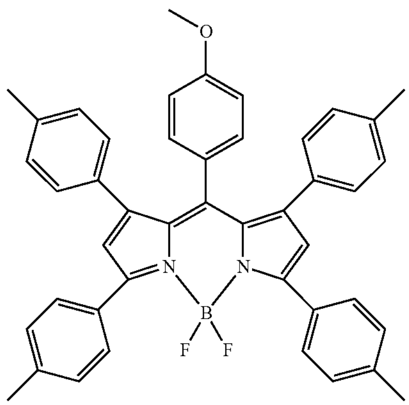
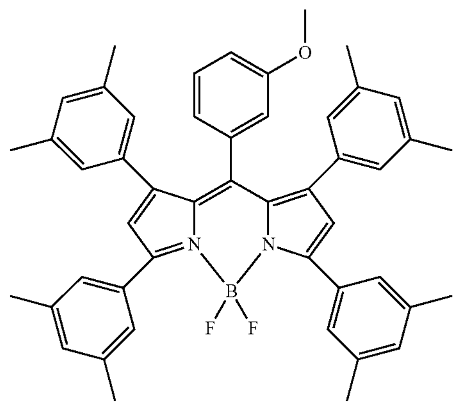
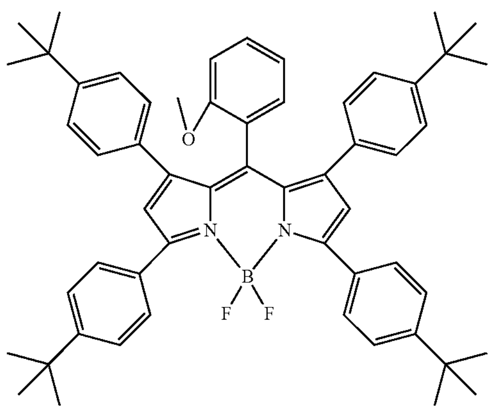
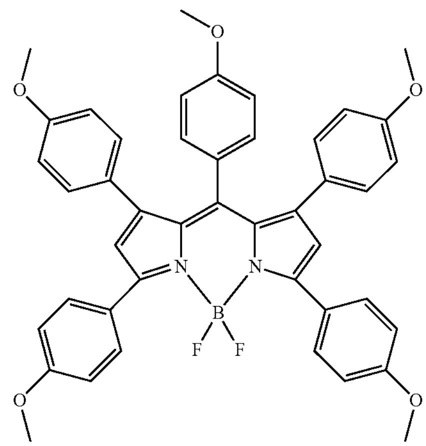
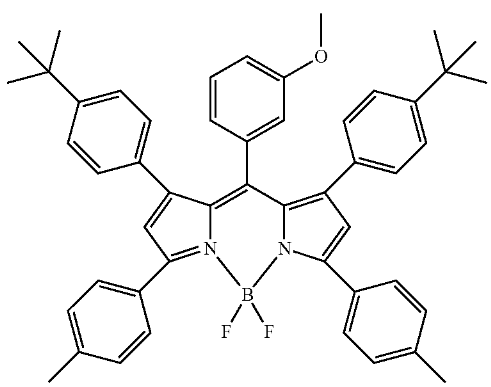
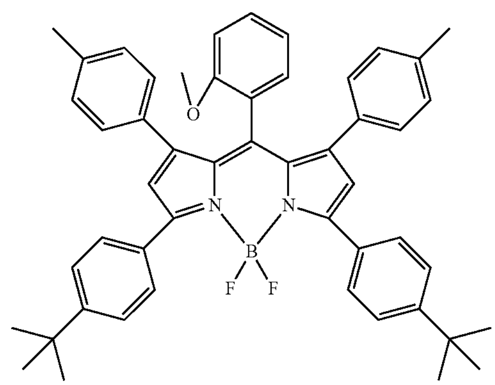
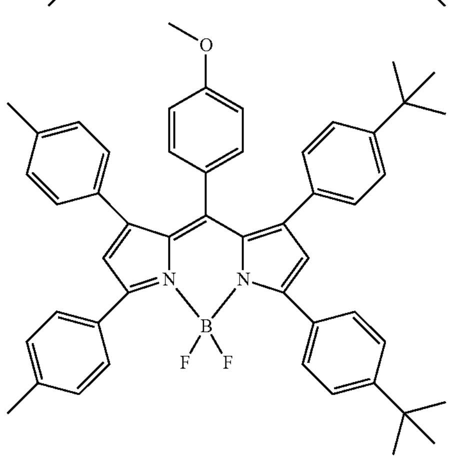
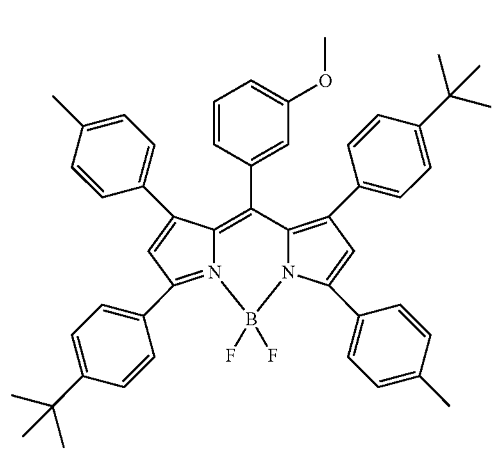

-continued
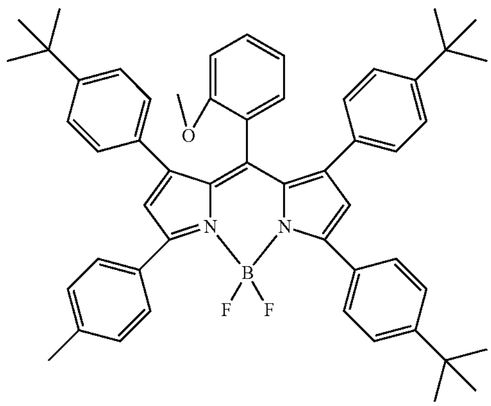
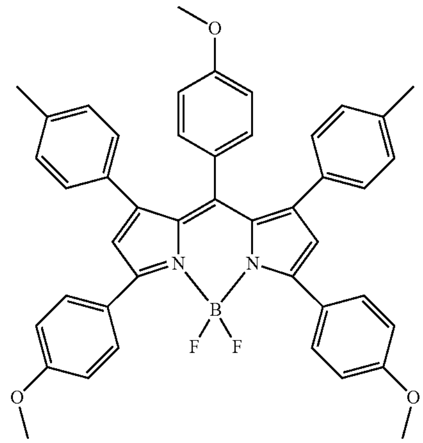
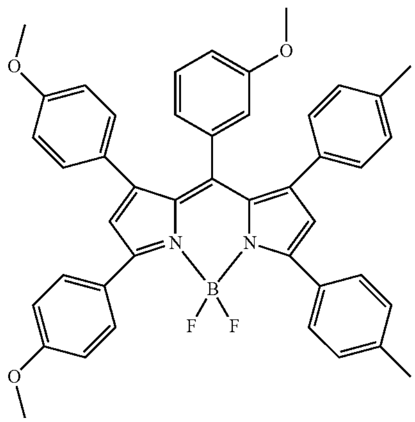
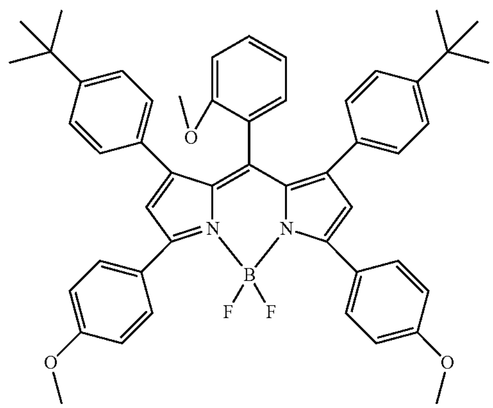
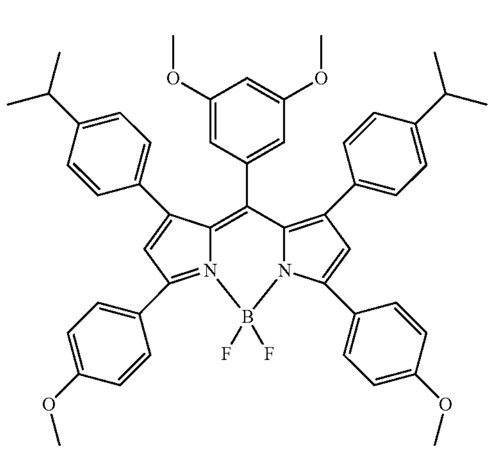
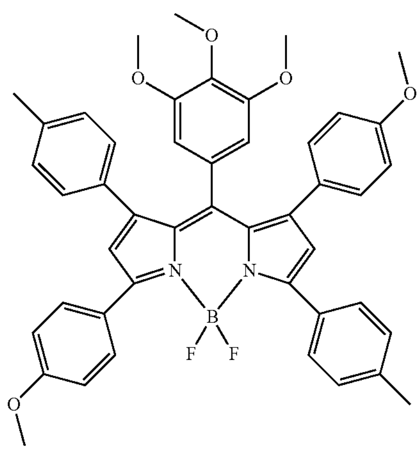
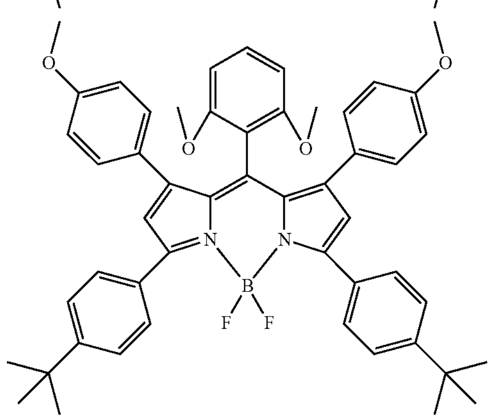
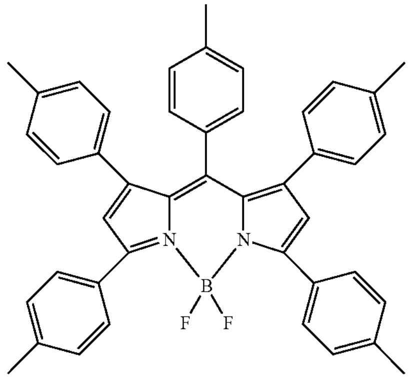

-continued
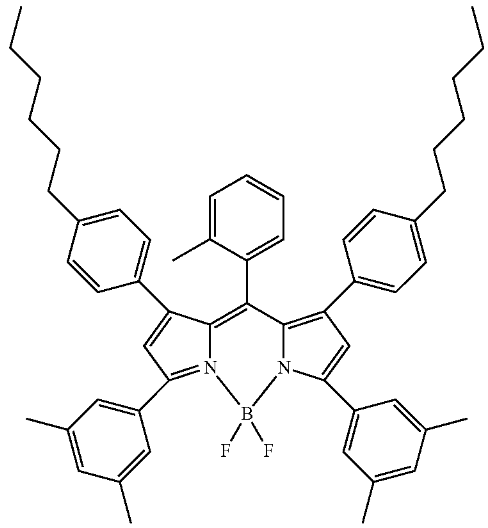
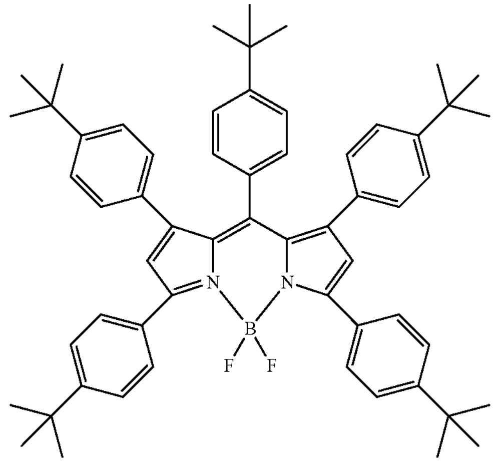
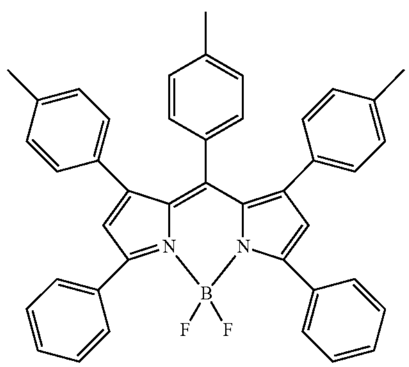
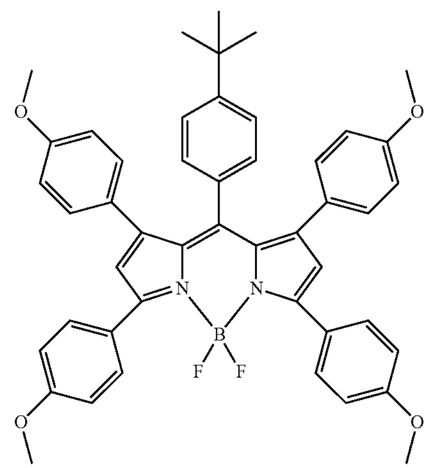
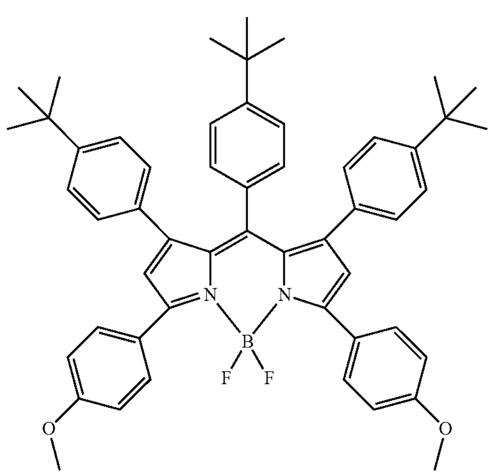
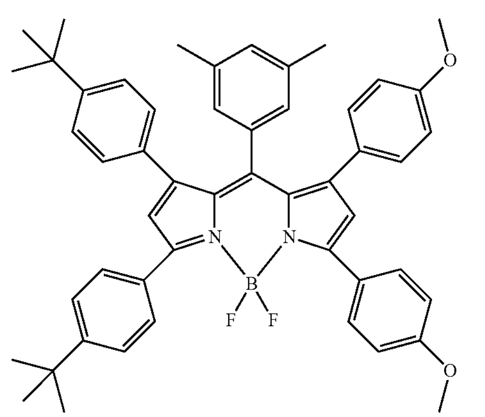

-continued
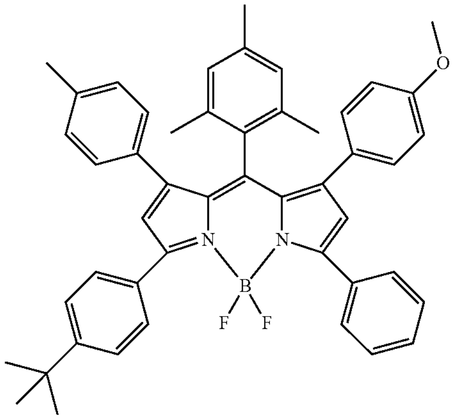
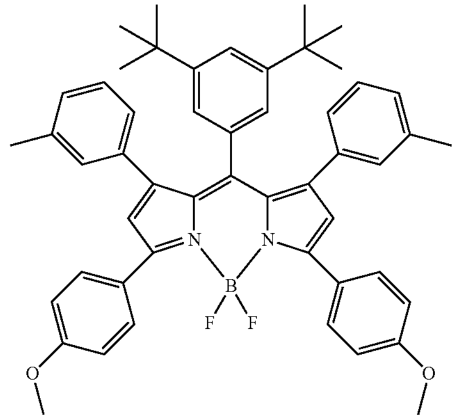
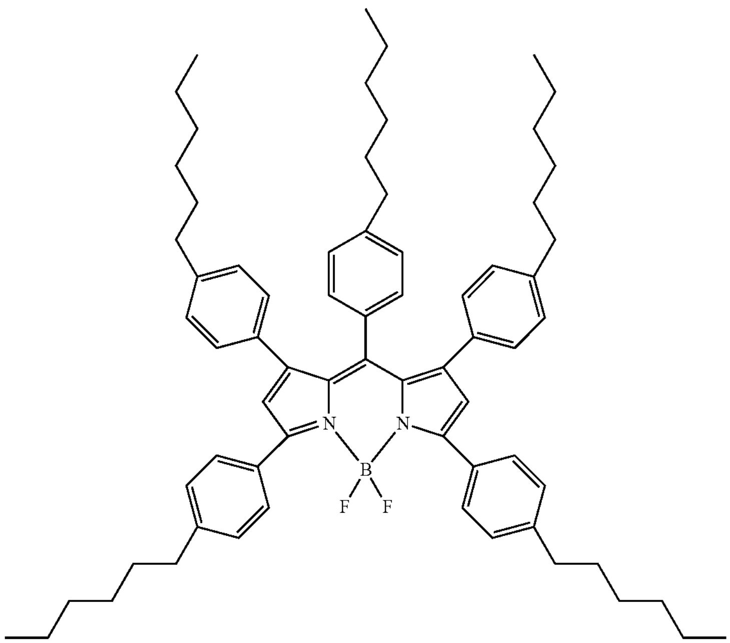
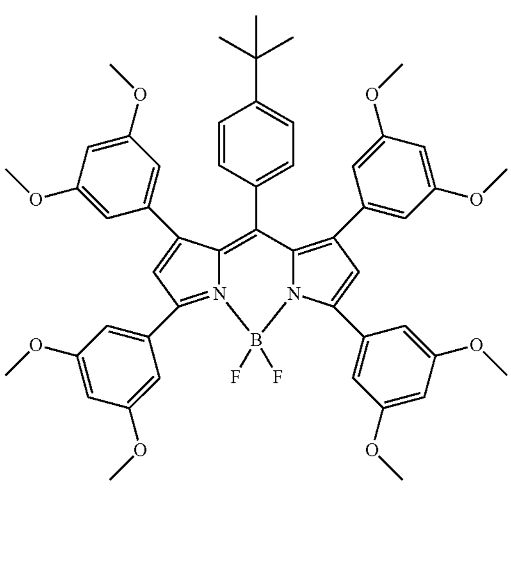
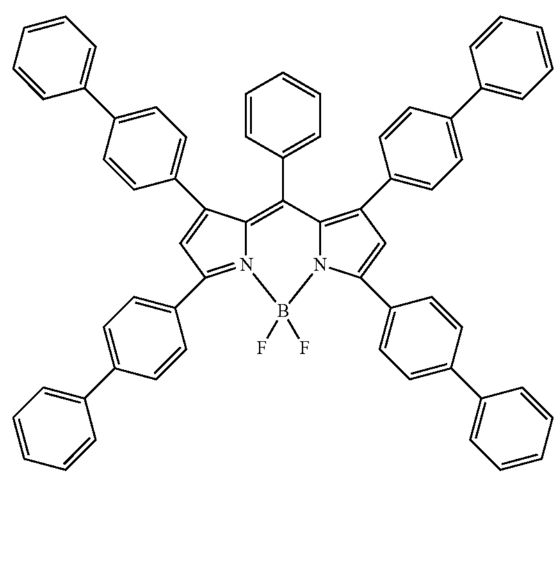

-continued
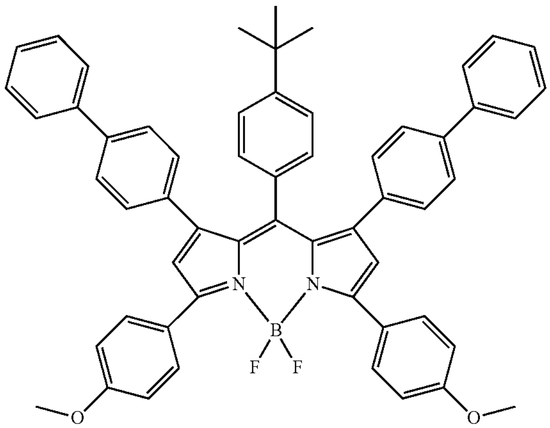
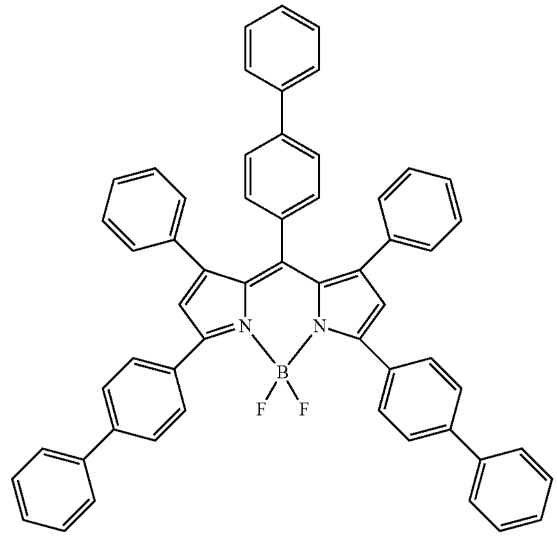
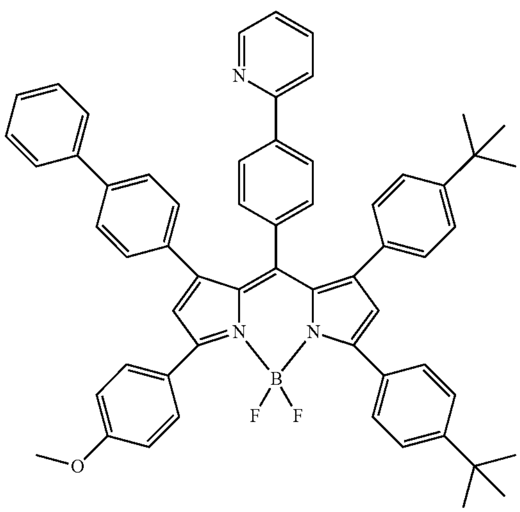
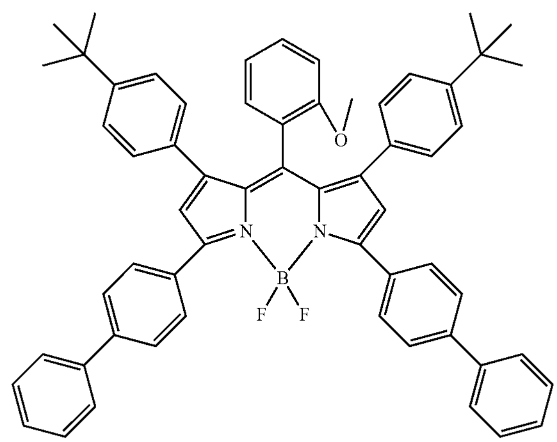
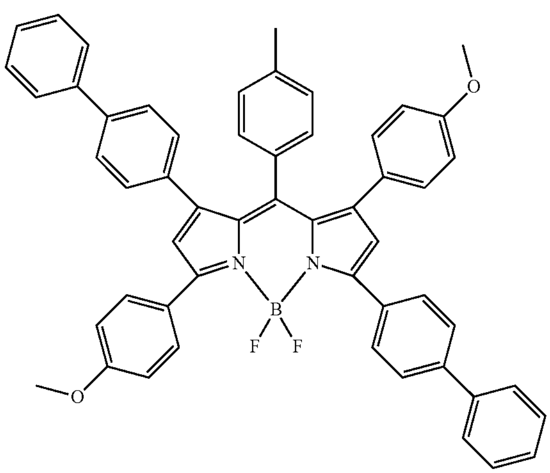

-continued
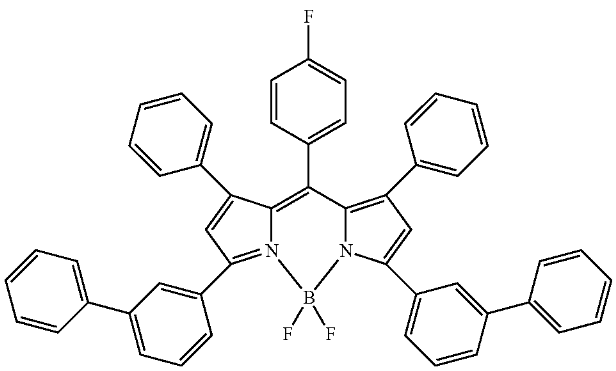
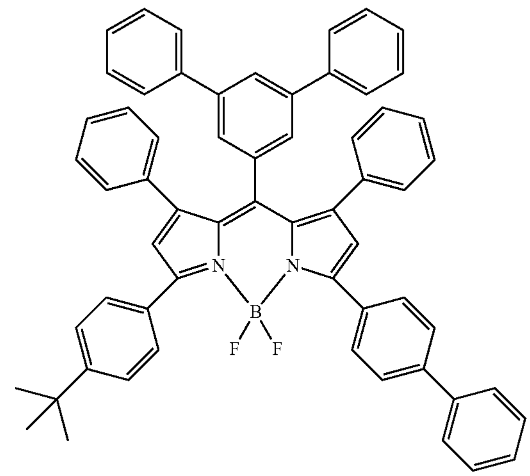
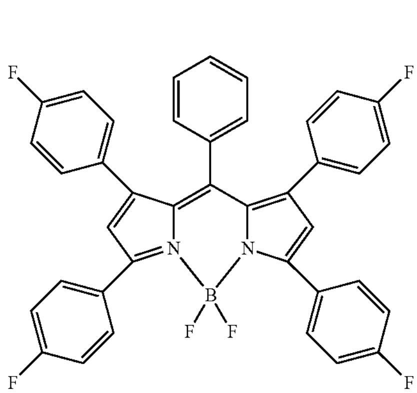
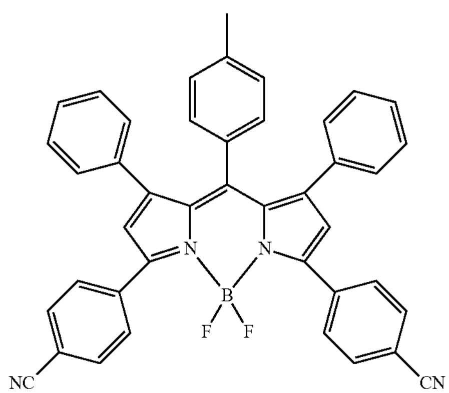
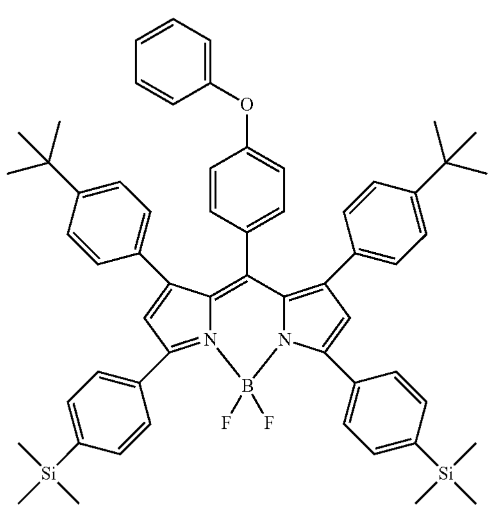
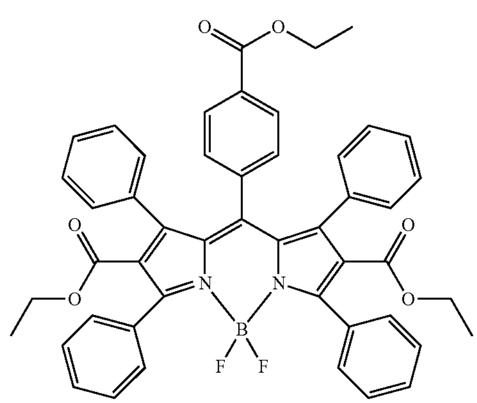

-continued
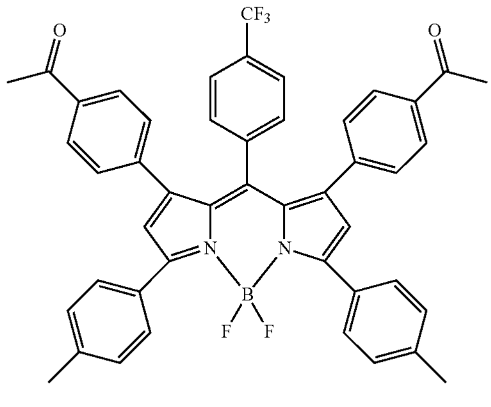
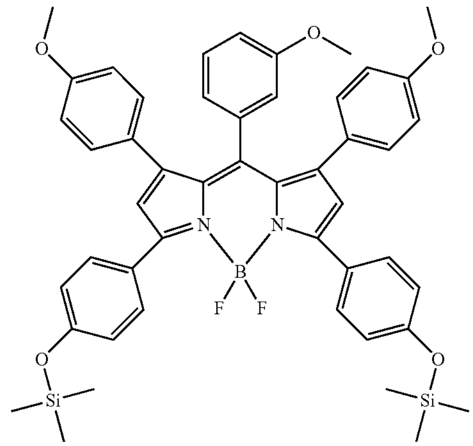
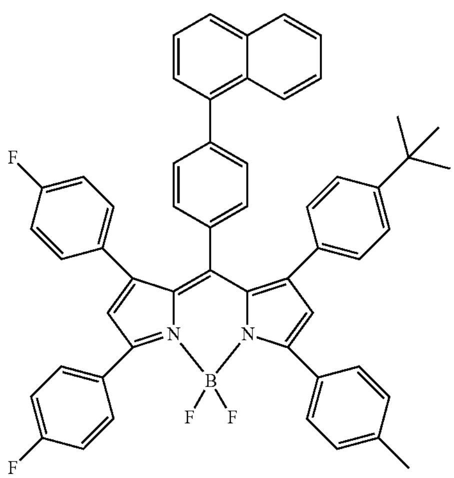
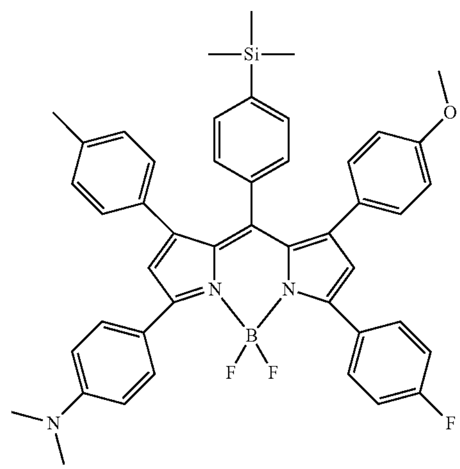
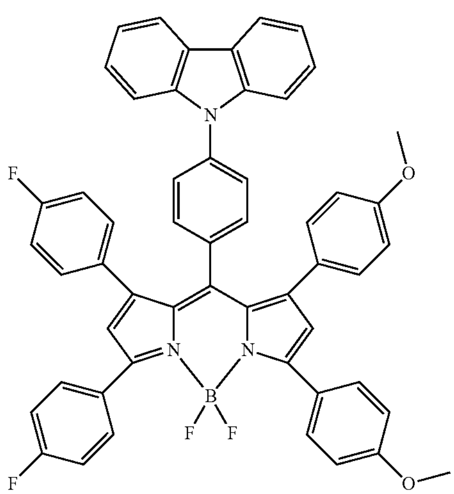
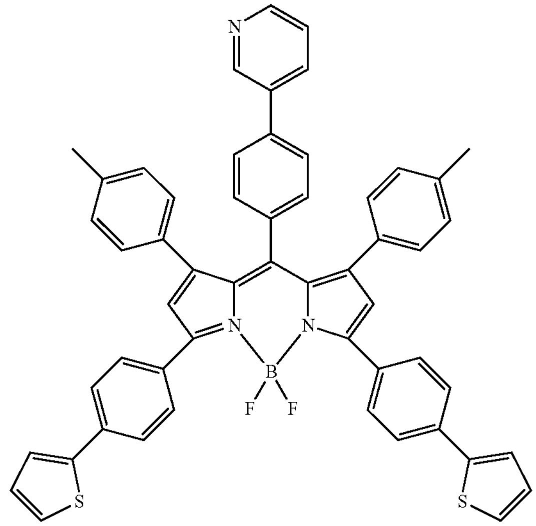

-continued
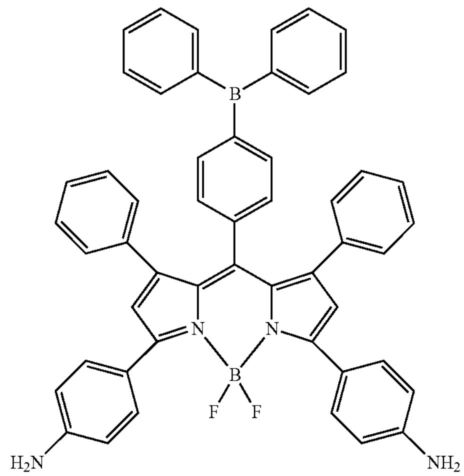
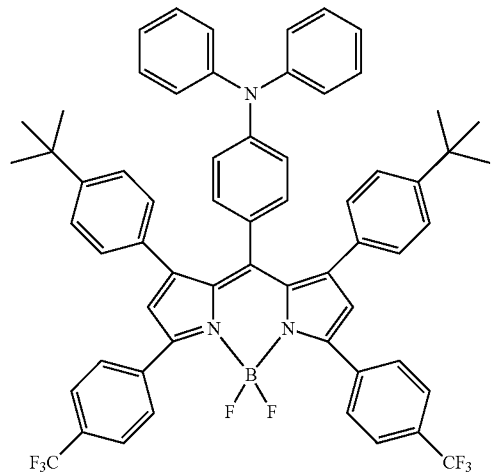
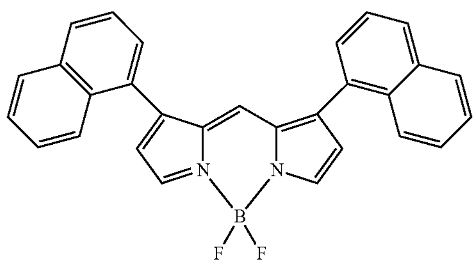
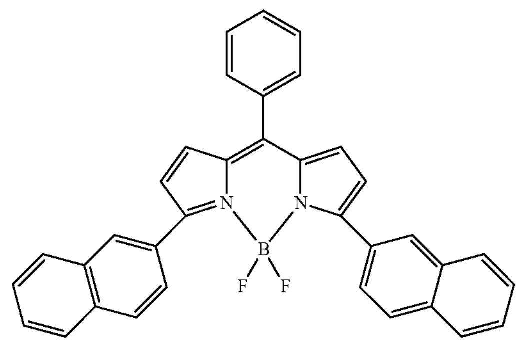
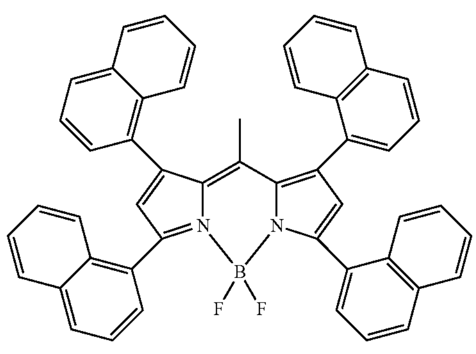
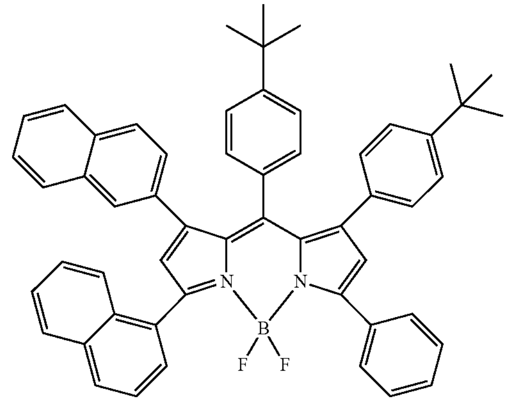
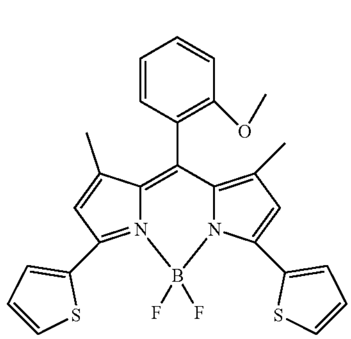
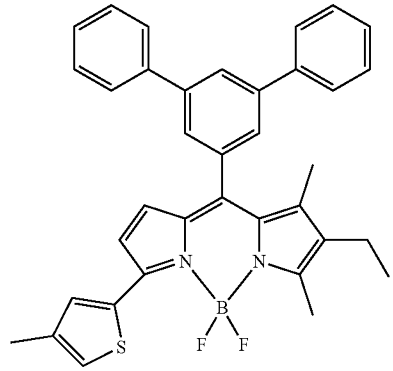
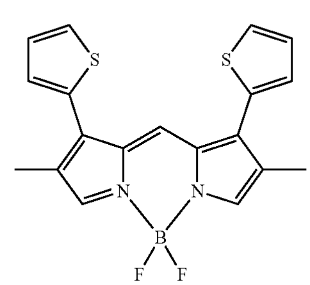

-continued
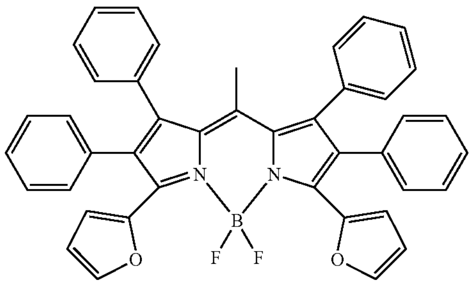
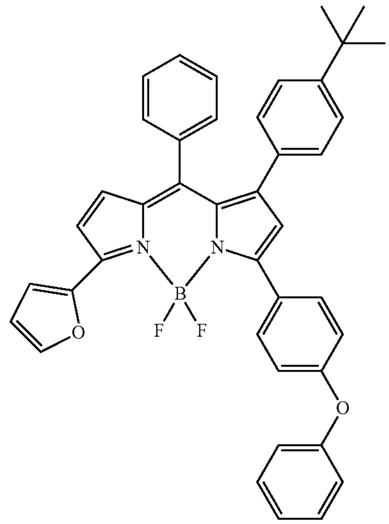
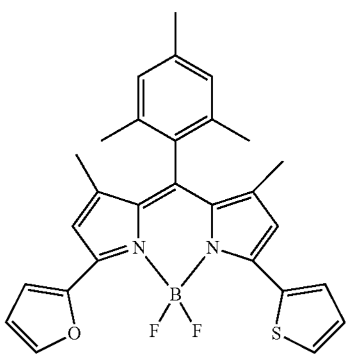
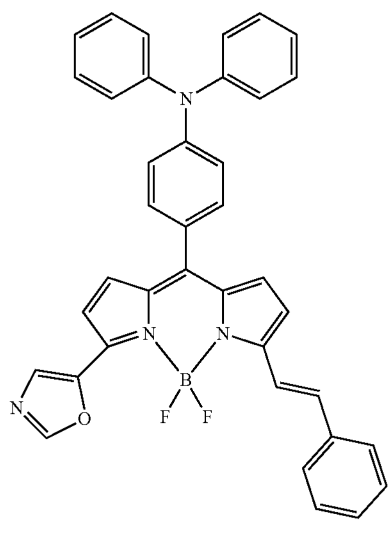
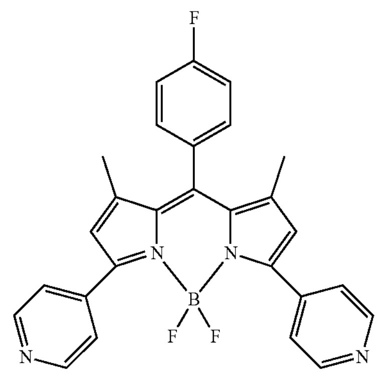
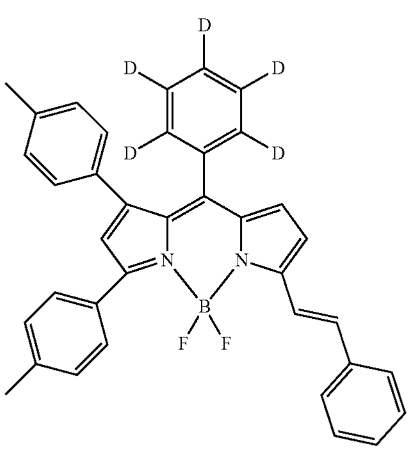
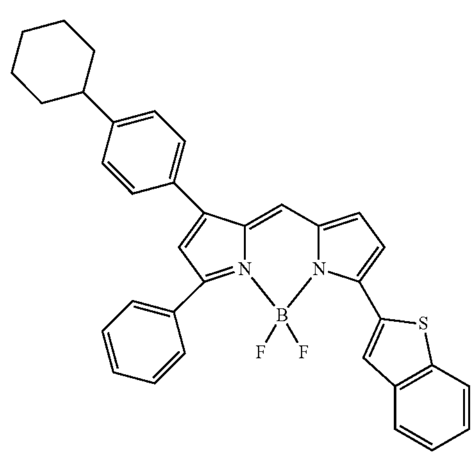

-continued
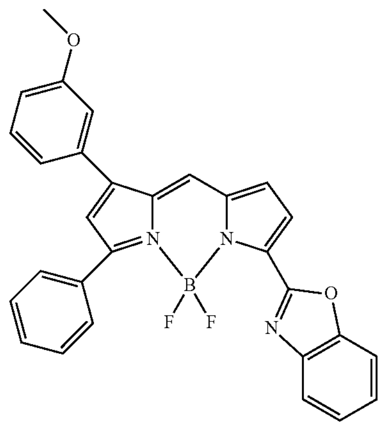
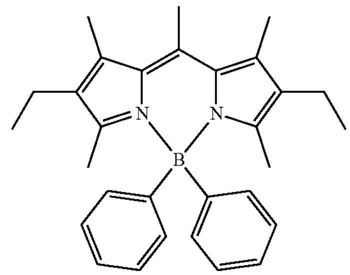
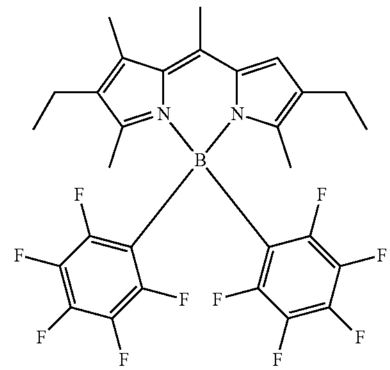
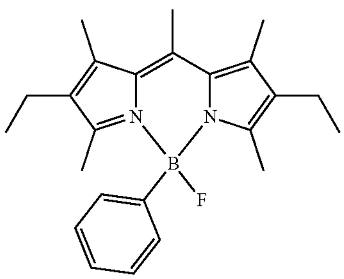
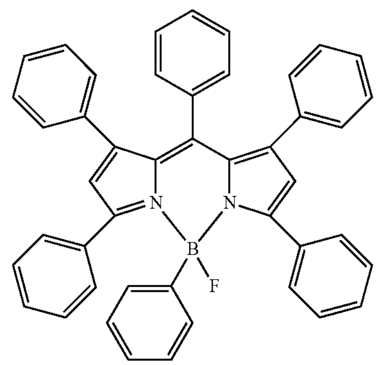
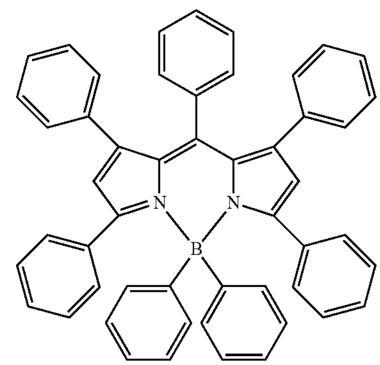
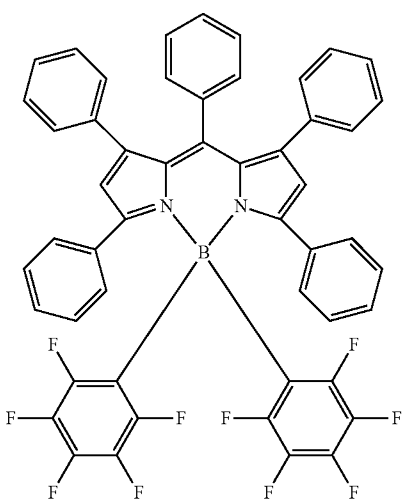
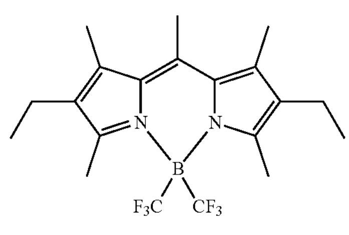
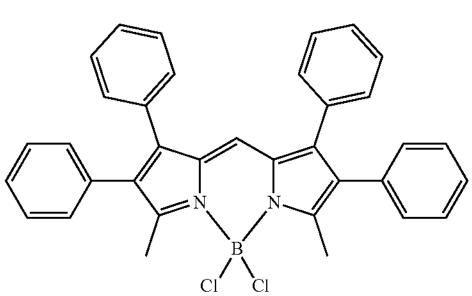
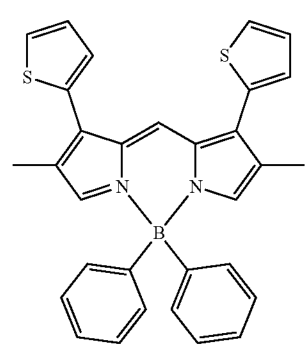

-continued
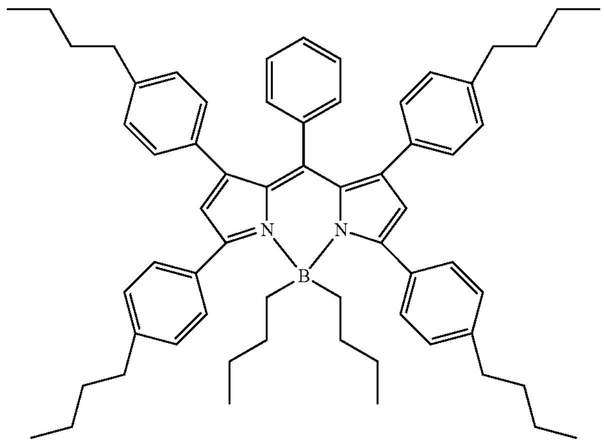
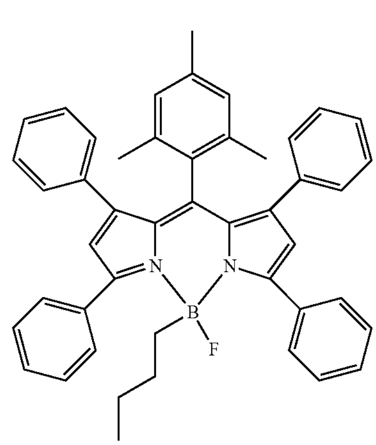
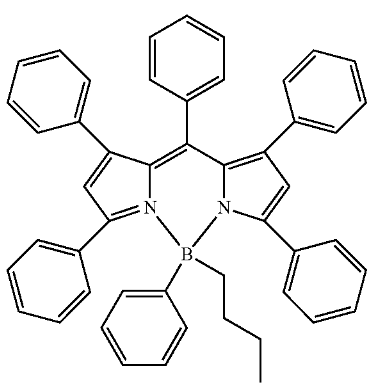
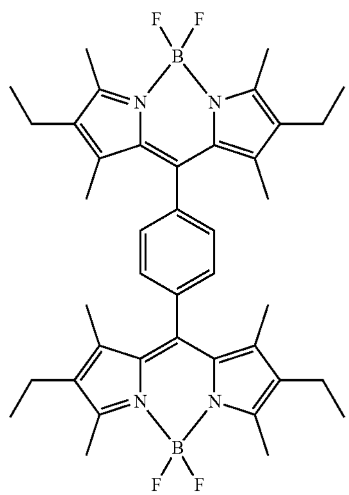
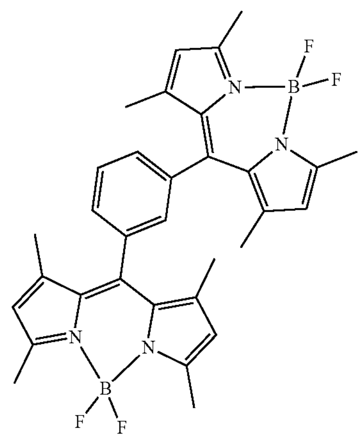
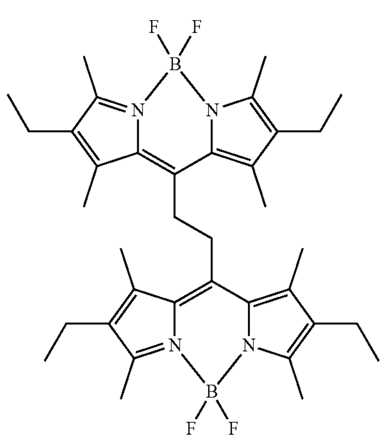
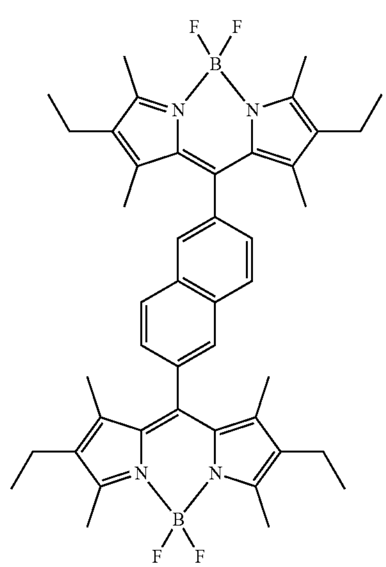

-continued
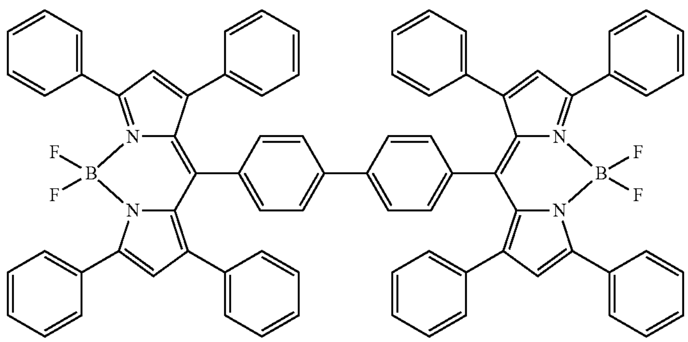
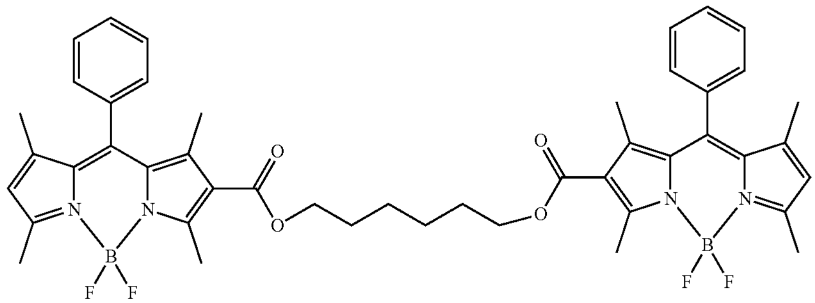
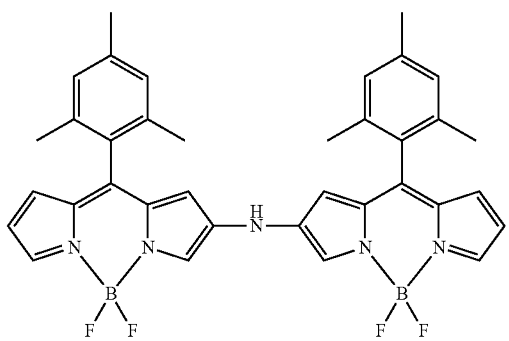
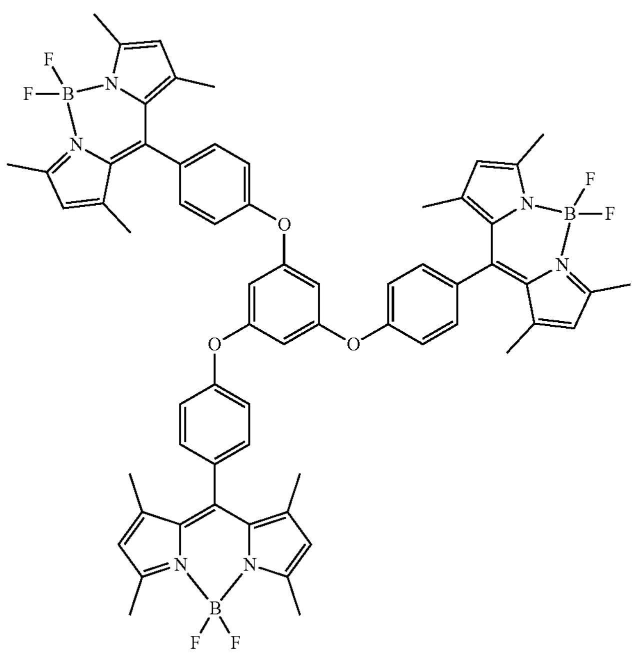

-continued
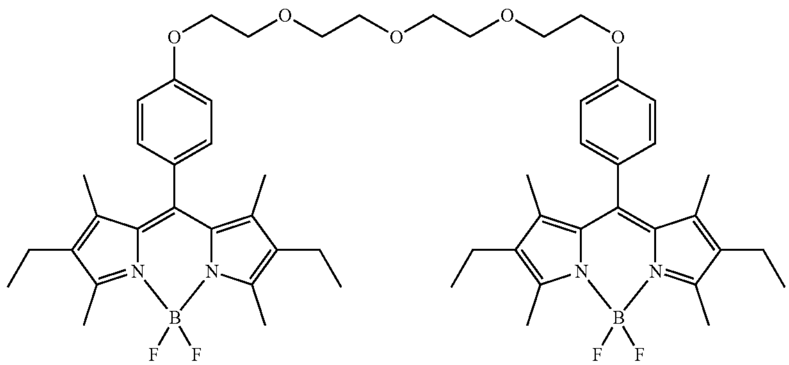
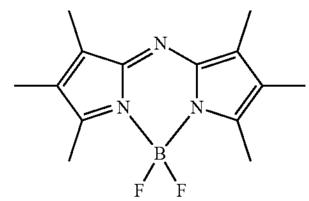
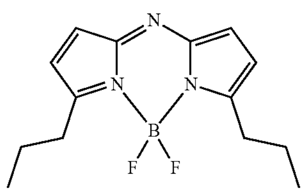
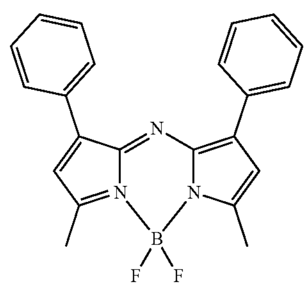
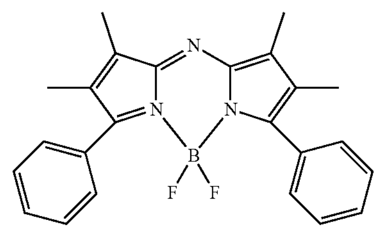
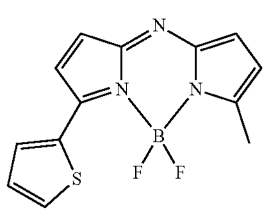
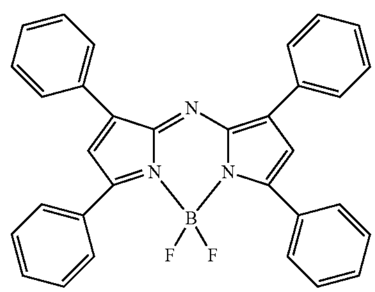
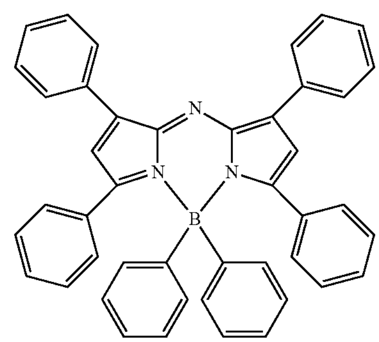
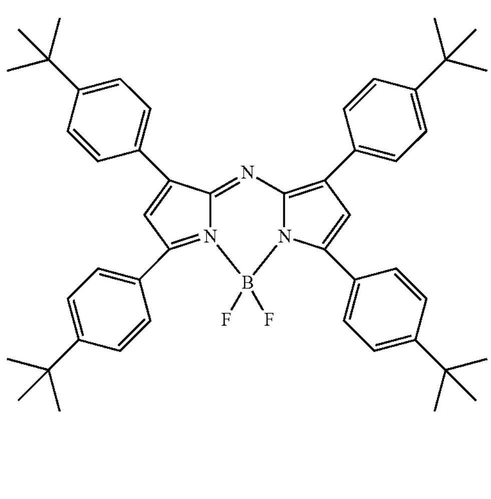
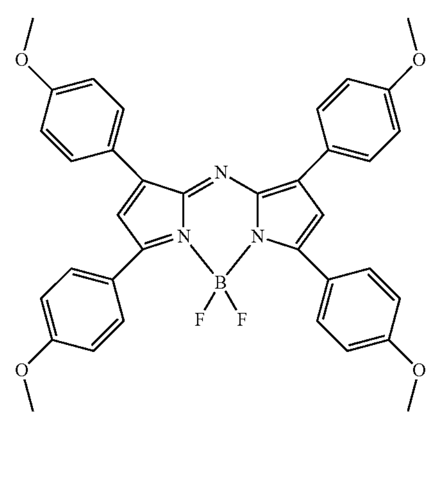

-continued
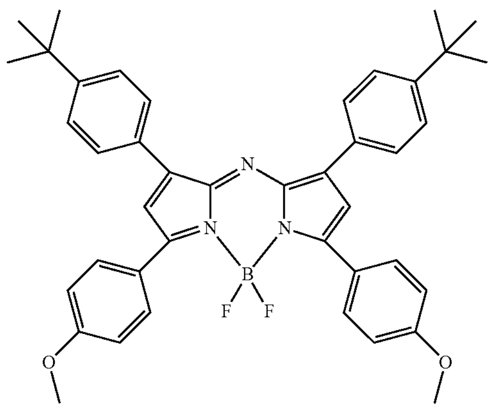
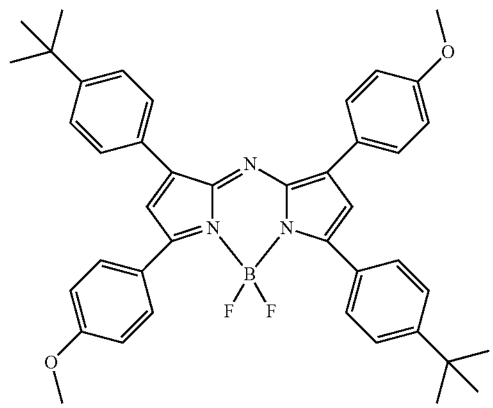
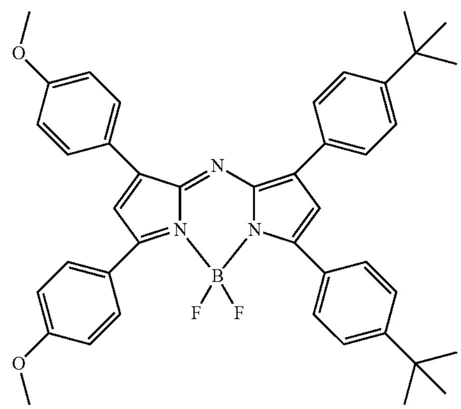
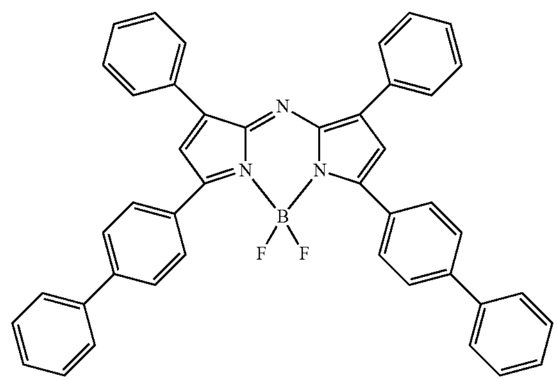
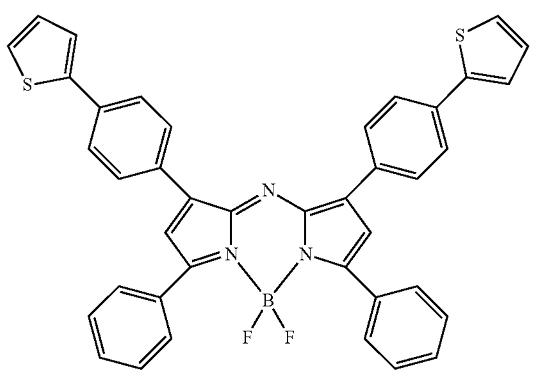
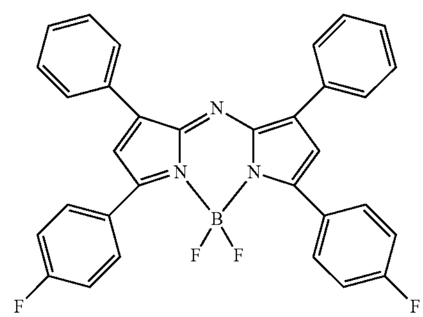
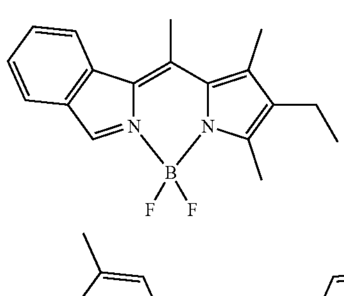
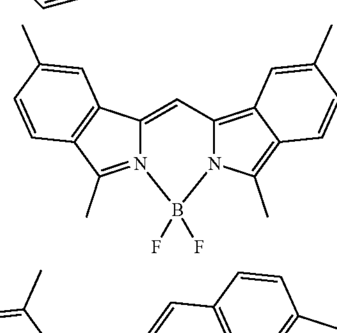
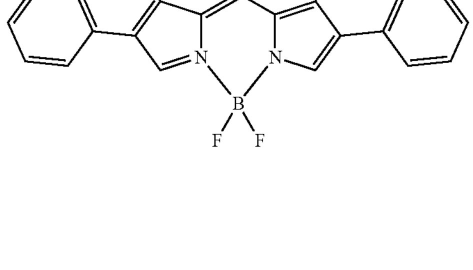
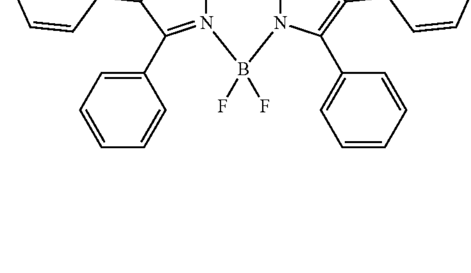

-continued

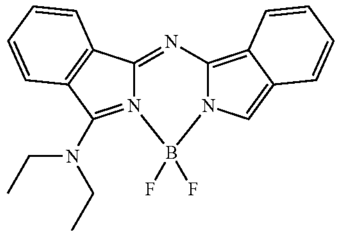

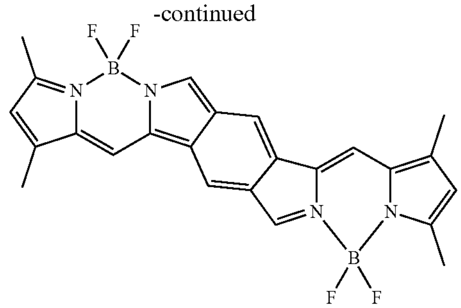

The compound represented by General Formula (1) can be manufactured by methods described in Japanese Unexamined Patent Application Publication No. H08-509471 and Japanese Patent Application Laid-open No. 2000-208262, for example. In other words, a pyrromethene compound and a metallic salt are reacted in the presence of a base to obtain a target pyrromethene-based metal complex.

As the synthesis of a pyrromethene-boron fluoride complex, the compound represented by General Formula (1) can be manufactured with reference to methods described in J. Org. Chem., vol. 64, No. 21, pp. 7813-7819 (1999), Angew. Chem., Int. Ed. Engl., vol. 36, pp. 1333-1335 (1997), and the like. Examples of the method include a method in which a compound represented by the following General Formula (3) and a compound represented by General Formula (4) are heated in 1,2-dichloroethane in the presence of phosphoryl chloride and a compound represented by the following General Formula (5) is reacted in 1,2-dichloroethane mixture in the presence of triethylamine to obtain the compound represented by General Formula (1). However, the present invention is not limited to this method. In this example, $R^1$ to $R^9$ are similar to the above description.

The symbol J represents halogen.

(3)

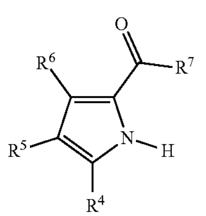

(4)

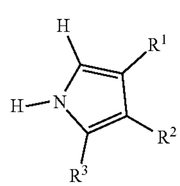

-continued (5)

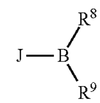

Furthermore, although examples of the introduction of aryl group or heteroaryl group include a method in which a carbon-carbon bond is created using a coupling reaction between a halogenated derivative and boronic acid or a boronic acid esterified derivative; the present invention is not limited to this method. Similarly, although examples of the introduction of amino group or carbazolyl group include a method in which a carbon-nitrogen bond is created using a coupling reaction between a halogenated derivative and amine or a carbazole derivative in the presence of a metal catalyst such as palladium; the present invention is not limited to this method.

The color conversion film for use in the present invention can contain other compounds as appropriate in addition to the compound represented by General Formula (1) as needed. To further enhance energy transfer efficiency from the light source to the compound represented by General Formula (1), for example, an assist dopant such as rubrene may be contained. When any emission color other than the emission color of the compound represented by General Formula (1) is desired to be added, desired organic luminous materials such as coumarin-based dyes and rhodamine-based dyes can be added. In addition, other than these organic luminous materials, known luminous materials such as inorganic luminous materials, fluorescent pigments, fluorescent dyes, and quantum dots can also be contained in combination.

Although the following describes examples of the organic luminous materials other than the compound represented by General Formula (1), the present invention is not limited to these compounds in particular:

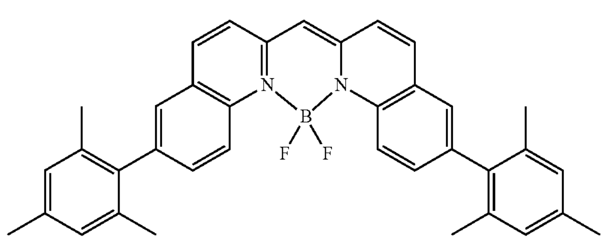

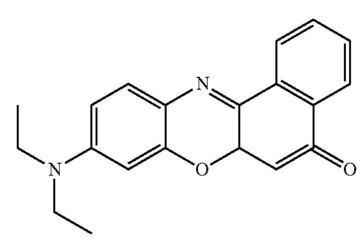

-continued
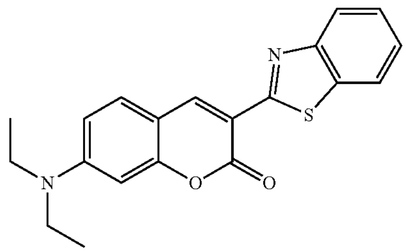
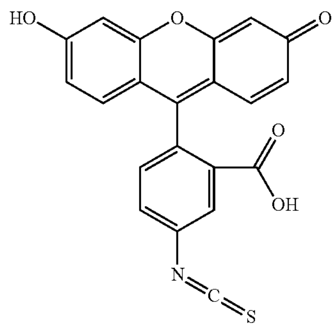
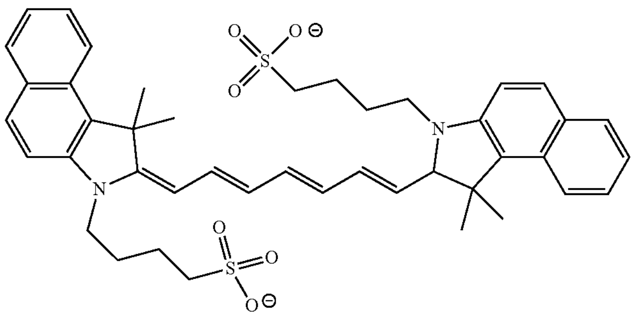
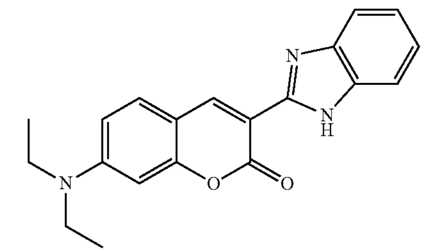
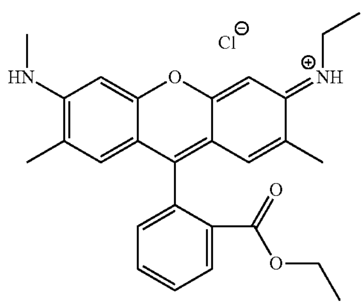
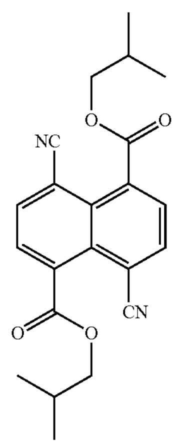
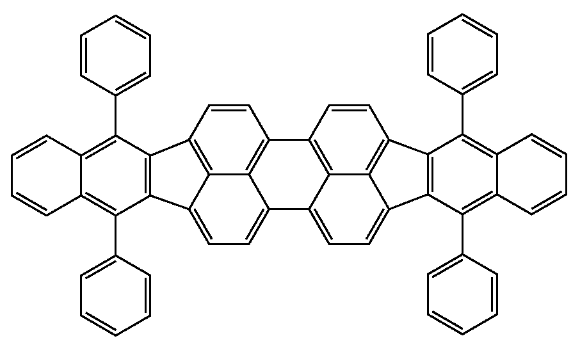
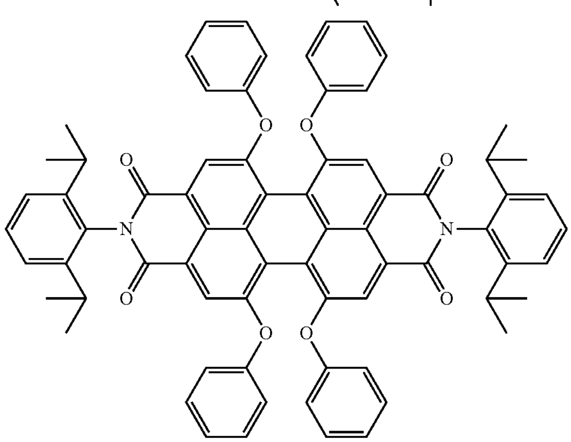
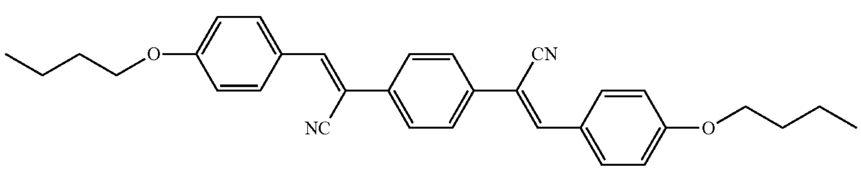

-continued

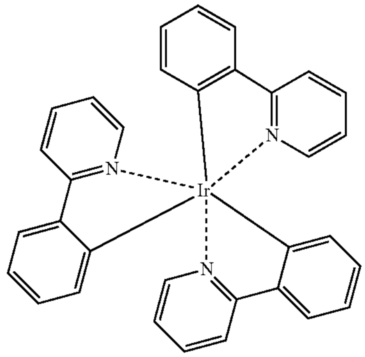
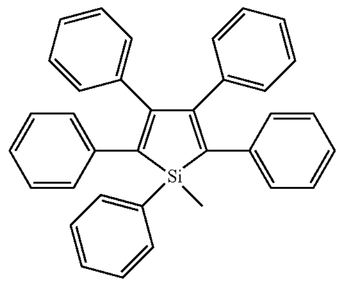
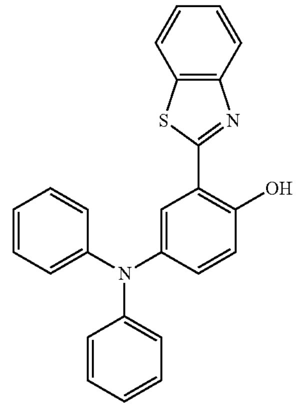
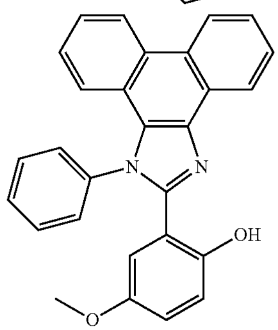
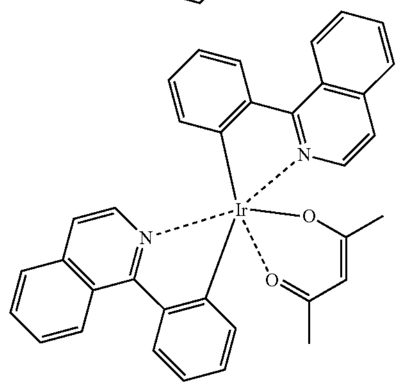
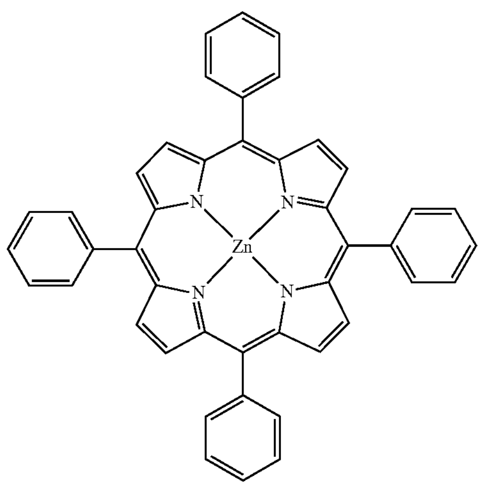
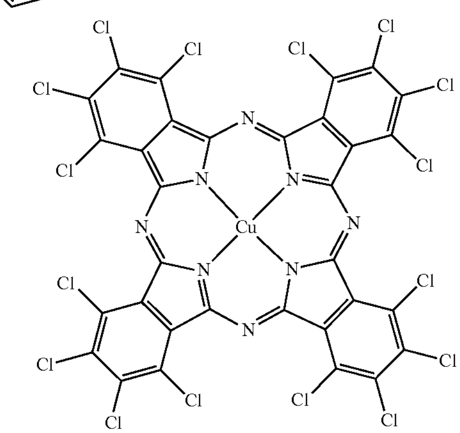

The color conversion film for use in the present invention preferably contains an organic luminous material (hereinafter, referred to as "Organic Luminous Material (a)") that exhibits emission the peak wavelength of which is observed in the range of 500 nm or longer and 580 nm or shorter by using light from a light source that emits light with a wavelength range of 400 nm or longer and 500 nm or shorter. The emission the peak wavelength of which is observed in the range of 500 nm or longer and 580 nm or shorter will be hereinafter referred to as "green emission." Light from a light source is generally more likely to cause the decomposition of a material as its energy becomes higher. However, the light with a wavelength range of 400 nm or longer and 500 nm or shorter has relatively smaller excitation energy. Consequently, the green emission with favorable color purity can be obtained without causing the decomposition of Organic Luminous Material (a) in the color conversion film.

The color conversion film for use in the present invention preferably contains the following Organic Luminous Material (a) and Organic Luminous Material (b). As described above, Organic Luminous Material (a) is a luminous material that exhibits emission with the peak wavelength of 500 nm or longer and 580 nm or shorter by using the light source that emits the light with a wavelength range of 400 nm or longer and 500 nm or shorter. Organic Luminous Material (b) is a luminous material that exhibits emission the peak wavelength of which is observed in the range of 580 nm or longer and 750 nm or shorter by being excited by either the light from the light source that emits the light with a wavelength range of 400 nm or longer and 500 nm or shorter or the emission from Organic Luminous Material (a) or both. The emission the peak wavelength of which is observed in the range of 580 nm or longer and 750 nm or shorter will be hereinafter referred to as "red emission."

In part of the light source with a wavelength range of 400 nm or longer and 500 nm or shorter, a part of light passes through the color conversion film for use in the present invention, and when a blue LED having a sharp emission peak is used, emission spectra having sharp shapes in the individual colors of blue, green, and red are exhibited, and white light having good color purity can be achieved. Consequently, in displays in particular, a larger color gamut having more vivid colors can be efficiently made. In lighting use, emission characteristics in the green range and the red range in particular are improved compared with a white LED obtained by combining a blue LED and a yellow fluorescent substance, which is currently in the mainstream, and a favorable white light source with improved color rendering can be achieved.

To enlarge a color gamut to improve color reproducibility, the overlap of the emission spectra of the individual colors of blue, green, and red is preferably small.

When blue light with a wavelength range of 400 nm or longer and 500 nm or shorter having moderate excitation energy is used as excitation light, when emission the peak wavelength of which is observed in the range of 500 nm or longer is used as the green emission, the spectral overlap is small, and color reproducibility improves, which is preferred. In enhancing the effect, the lower limit of the peak wavelength of Organic Luminous Material (a) is more preferably 510 nm or longer, further preferably 515 nm or longer, and particularly preferably 520 nm or longer.

To reduce the spectral overlap with the red light, emission the peak wavelength of which is observed in the range of 580 nm or shorter is preferably used as the green emission. In enhancing the effect, the upper limit of the peak wavelength of Organic Luminous Material (a) is more preferably 550 nm or shorter, further preferably 540 nm or shorter, and particularly preferably 530 nm or shorter.

Furthermore, when the emission the peak wavelength of which is observed in the range of 500 nm or longer and 580 nm or shorter is used as the green emission, when emission the peak wavelength of which is observed in the range of 580 nm or longer is used as the red emission, the spectral overlap is small, and color reproducibility improves, which is preferred. In enhancing the effect, the lower limit of the peak wavelength of Organic Luminous Material (b) is more preferably 620 nm or longer, further preferably 630 nm or longer, and particularly preferably 635 nm or longer.

The upper limit of the peak wavelength of the red light may be 750 nm or shorter, which is near the upper bound of the visible range, or shorter; when it is 700 nm or shorter, visibility increases, which is more preferred. In enhancing the effect, the upper limit of the peak wavelength of Organic Luminous Material (b) is further preferably 680 nm or shorter and particularly preferably 660 nm or shorter.

In other words, when the blue light with a wavelength range of 400 nm or longer and 500 nm or shorter is used as the excitation light, the peak wavelength of the green light is preferably observed in the range of 500 nm or longer and 580 nm or shorter, more preferably 510 nm or longer and 550 nm or shorter, further preferably 515 nm or longer and 540 nm or shorter, and particularly preferably 520 nm or longer and 530 nm or shorter. The peak wavelength of the red light is preferably observed in the range of 580 nm or longer and 750 nm or shorter, more preferably 620 nm or longer and 700 nm or shorter, further preferably 630 nm or longer and 680 nm or shorter, and particularly preferably 635 nm or longer and 660 nm or shorter.

To reduce the overlap of the emission spectra to improve color reproducibility, the full widths at half maximum of the emission spectra of the individual colors of blue, green, and red are preferably small. The full widths at half maximum of the emission spectra of the green light and the red light being small in particular are effective in improving color reproducibility.

The full width at half maximum of the emission spectrum of the green light is preferably 50 nm or smaller, more preferably 40 nm or smaller, further preferably 35 nm or smaller, and particularly preferably 30 nm or smaller.

The full width at half maximum of the emission spectrum of the red light is preferably 80 nm or smaller, more preferably 70 nm or smaller, further preferably 60 nm or smaller, and particularly preferably 50 nm or smaller.

Although the shape of the emission spectra is not limited to a particular shape, a single peak is preferred, because the excitation energy can be efficiently used, and color purity increases. The single peak referred to this disclosure indicates a state in which any peak having an intensity of 5% or higher relative to the intensity of a peak with the maximum intensity is absent in a certain wavelength range.

Preferred examples of Organic Luminous Material (a) include coumarin derivatives such as coumarin 6, coumarin 7, and coumarin 153; cyanine derivatives such as indocyanine green; fluorescein derivatives such as fluorescein, fluorescein isothiocyanate, and carboxyfluorescein diacetate; phthalocyanine derivatives such as phthalocyanine green; perylene derivatives such as diisobutyl-4,10-dicyanoperylene-3,9-dicarboxylate; pyrromethene derivatives; stilbene derivatives; oxazine derivatives; naphthalimide derivatives; pyrazine derivatives; benzimidazole derivatives; benzoxazole derivatives; benzothiazole derivatives; imidazopyridine derivatives; azole derivatives; compounds having a condensed aryl ring such as anthracene and derivatives thereof; aromatic amine derivatives; and organometallic complex compounds. However, Organic Luminous Material (a) is not limited to these compounds in particular. Among these compounds, the pyrromethene derivatives, which give a high fluorescence quantum yield and are favorable in durability, are particularly preferred compounds. Among the pyrromethene derivatives, the compound represented by General Formula (1) is preferred, because it exhibits emission with high color purity.

Preferred examples of Organic Luminous Material (b) include cyanine derivatives such as 4-dicyanomethylene-2-methyl-6-(4-dimethylaminostyryl)-4H-pyran; rhodamine derivatives such as rhodamine B, rhodamine 6G, rhodamine 101, and sulforhodamine 101; pyridine derivatives such as 1-ethyl-2-(4-(p-dimethylaminophenyl)-1,3-butadienyl)-pyridinium-perchlorate; perylene derivatives such as N,N'-bis(2,6-diisopropylphenyl)-1,6,7,12-tetraphenoxyperylene-3,4:9,10-bisdicarboimide; porphyrin derivatives; pyrromethene derivatives; oxazine derivatives; pyrazine derivatives; compounds having a condensed aryl ring such as naphthacene and dibenzodiindenoperylene and derivatives thereof; and organometallic complex compounds. However, Organic Luminous Material (b) is not limited to these compounds in particular. Among these compounds, the pyrromethene derivatives, which give a high fluorescence quantum yield and are favorable in durability, are particularly preferred compounds. Among the pyrromethene derivatives, the compound represented by General Formula (1) is preferred, because it exhibits emission with high color purity.

The content of the component (A) the organic luminous material in the color conversion film for use in the present invention, which depends on the molar absorption coefficient, the fluorescence quantum yield, and the absorption intensity at an excitation wavelength of the compound and the thickness and the transmittance of a film to be manufactured, is usually $1.0\times10^{-4}$ parts by weight to 30 parts by weight relative to 100 parts by weight of the component (B) the binder resin. The content of this component (A) is further preferably $1.0\times10^{-3}$ parts by weight to 10 parts by weight and particularly preferably $1.0\times10^{-2}$ parts by weight to 5 parts by weight relative to 100 parts by weight of the component (B).

(B) Binder Resin

The binder resin in the color conversion film for use in the present invention may be a material that forms a continuous phase and is excellent in molding workability, transparency, heat resistance, and the like. Examples of the binder resin include known ones such as photocurable resist materials having reactive vinyl group such as an acrylic acid-based one, a methacrylic acid-based one, a polyvinyl cinnamate-based one, and a cyclized rubber-based one; an epoxy resin; a silicone resin (including organopolysiloxane cured products (cross-linked products) such as silicone rubber and silicone gel); a urea resin; a fluorine resin; a polycarbonate resin; an acrylic resin; an urethane resin; a melamine resin; a polyvinyl resin; a polyamide resin; a phenol resin; a polyvinyl alcohol resin; a polyvinyl butyral resin; a cellulose resin; an aliphatic ester resin; an aromatic ester resin; an aliphatic polyolefin resin; and an aromatic polyolefin resin. The binder resin may be a copolymer resin of these resins. These resins are designed as appropriate, whereby a binder resin useful for the color conversion film for use in the present invention can be obtained.

Among these resins, thermosetting resins are more preferred because of the easiness of the process of film formation. Among the thermosetting resins, an epoxy resin, a silicone resin, an acrylic resin, a polyester resin, or mixtures thereof can be suitably used in view of transparency and heat resistance in particular.

To the binder resin, dispersants, leveling agents, and the like for coating film stabilization can be added as additives, and adhesive adjuvants such as silane coupling agents and the like can be added as film surface modifiers. To the binder resin, inorganic particles such as silica particles and silicone fine particles can be added as color conversion material anti-settling agents.

The binder resin is particularly preferably a silicone resin in view of heat resistance. Among the silicone resin, an addition reaction-curable type silicone composition is preferred. The addition reaction-curable type silicone composition is heated to be cured at room temperature or a temperature between 50° C. and 200° C. and is excellent in transparency, heat resistance, and adhesiveness.

The addition reaction-curable type silicone composition is formed by a hydrosilylation reaction between a compound containing alkenyl group bonding to a silicon atom and a compound having a hydrogen atom bonding to a silicon atom as an example. Among these materials, examples of the “compound containing alkenyl group bonding to a silicon atom” include vinyltrimethoxy silane, vinyltrimethoxysilane, allyltrimethoxysilane, propenyltrimethoxysilane, norbornenyltrimethoxysilane, and octenyltrimethoxysilane. Examples of the “compound having a hydrogen atom bonding to a silicon atom” include methylhydrogenpolysiloxane, dimethylpolysiloxane-CO-methylhydrogenpolysiloxane, ethylhydrogenpolysiloxane, methylhydrogenpolysiloxane-CO-methylphenylpolysiloxane. Other examples of the addition reaction-curable type silicone composition include known ones as described in Japanese Patent Application Laid-open No. 2010-159411.

The addition reaction-curable type silicone composition can be a commercially available one such as a general silicone sealant for LED use. Specific examples thereof include OE-6630A/B and OE-6336A/B manufactured by Dow Corning Toray Co., Ltd. and SCR-1012A/B and SCR-1016A/B manufactured by Shin-Etsu Chemical Co., Ltd.

In the composition for manufacturing the color conversion film for use in the present invention, the binder resin preferably contains a hydrosilylation reaction retarder such as acetylene alcohol as another component in order to retard curing at room temperature to prolong a pot life. The binder resin may contain fine particles such as fumed silica, glass powder, and quartz powder; inorganic fillers such as titanium oxide, zirconium oxide, barium titanate, and zinc oxide; pigments; fire retardants; heat-resistant agents; antioxidants; dispersants; solvents; and adhesive imparting agents such as silane coupling agents and titanium coupling agents as needed to the extent that the effects of the present invention are not impaired.

In particular, in view of the surface smoothness of the color conversion layer, the composition for manufacturing the color conversion film preferably contains a low molecular weight polydimethylsiloxane component, silicone oil, or the like. Such a component is preferably added in an amount of 100 ppm to 2,000 ppm and is further preferably added in an amount of 500 ppm to 1,000 ppm to the entire composition of this silicone resin composition.

(C) Other Components

The color conversion film for use in the present invention can contain other additives such as antioxidants; processing and thermal stabilizers; light resistance stabilizers such as ultraviolet light absorbents; dispersants and leveling agents for coating film stabilization; plasticizers; cross-linking agents such as epoxy compounds; curing agents such as amine, acid anhydrides, and imidazole; adhesive adjuvants such as silane coupling agents as film surface modifiers; inorganic particles such as silica particles and silicone fine particles as color conversion material anti-settling agents; and silane coupling agents in addition to the organic luminous material and the binder resin.

Examples of the antioxidants include, but are not limited to, phenol-based antioxidants such as 2,6-di-tert-butyl-p-cresol and 2,6-di-tert-butyl-4-ethylphenol. These antioxidants may be used singly or used in combination.

Examples of the processing and thermal stabilizers include, but are not limited to, phosphorous-based stabilizers such a tributylphosphite, tricyclohexylphosphite, triethylphosphine, and diphenylbutylphosphine. These stabilizers may be used singly or used in combination.

Examples of the light resistance stabilizers include, but are not limited to, benzotriazoles such as 2-(5-methyl-2-hydroxyphenyl)benzotriazole and 2-[2-hydroxy-3,5-bis(α,α-dimethylbenzyl)phenyl]-2H-benzotriazole. These light resistance stabilizers may be used singly or used in combination.

These additives preferably have a small extinction coefficient in the visible range in view of not hindering the light from the light source and/or the emission of the luminous material. Specifically, in the entire wavelength range of 400 nm or longer and 800 nm or shorter, the molar extinction coefficient of these additives is preferably 1,000 or smaller, more preferably 500 or smaller, further preferably 200 or smaller, and particularly preferably 100 or smaller.

As the light resistance stabilizers, compounds having a role of a singlet oxygen quencher are also suitably used.

The singlet oxygen quencher is a material that traps and deactivates singlet oxygen generated by the activation of oxygen molecules through light energy. The singlet oxygen quencher coexisting in the composition can prevent the luminous material from deteriorating by singlet oxygen.

It is known that singlet oxygen is produced by the occurrence of exchange of electrons and energy between the triplet excited state of a dye such as rose bengal or methylene blue and an oxygen molecule in the ground state.

In the color conversion film of the present invention, the contained organic luminous material is excited by the light source and emits light with a wavelength different from the light source, thereby performing light color conversion. This excitation-emission cycle is repeated, and the probability of generation of singlet oxygen increases through interaction between generated excited species and oxygen contained in the composition. Consequently, the probability of collision between the organic luminous material and singlet oxygen also increases, and the organic luminous material is apt to be deteriorated.

Organic luminous materials are more vulnerable to singlet oxygen than inorganic luminous materials. The compound represented by General Formula (1) in particular has higher reactivity with singlet oxygen than compounds having a condensed aryl ring such as perylene or derivatives thereof and has a larger effect on durability caused by singlet oxygen.

Given these circumstances, the generated singlet oxygen is promptly deactivated by the singlet oxygen quencher, whereby the durability of the compound represented by General Formula (1) that is excellent in luminous quantum yield and color purity can be improved.

Examples of a compound having a role of the singlet oxygen quencher include, but are not limited to, specific tertiary amines, catechol derivatives, and nickel compounds. These compounds (light resistance stabilizers) may be used singly or used in combination.

The tertiary amine indicates a compound having a structure in which all the N—H bonds of ammonia have been replaced with N—C bonds. The substituent on the nitrogen atom is selected from alkyl group, cycloalkyl group, heterocyclic group, alkenyl group, cycloalkenyl group, alkynyl group, aryl group, heteroaryl group, aldehyde group, carbonyl group, carboxy group, oxycarbonyl group, carbamoyl group, and a condensed ring and an aliphatic ring formed between adjacent substituents. These substituents may be further substituted with the above substituents.

The substituent on the nitrogen atom of the tertiary amine is preferably a substituted or unsubstituted alkyl group, a substituted or unsubstituted cycloalkyl group, a substituted or unsubstituted aryl group, or a substituted or unsubstituted heteroaryl group in view of photostability. Among them, more preferred are a substituted or unsubstituted alkyl group, a substituted or unsubstituted cycloalkyl group, or a substituted or unsubstituted aryl group.

The aryl group in this case is preferably phenyl group or naphthyl group and more preferably phenyl group, because the light from the light source and/or the emission of the luminous material are not hindered. When the number of the aryl groups on the nitrogen atom increases, the absorption of light in the visible range may increase, and the three substituents on the nitrogen atom preferably include two or less aryl groups and more preferably include one or less aryl group.

When at least one of the three substituents on the nitrogen atom is substituted or unsubstituted alkyl group, singlet oxygen can be trapped more efficiently, which is preferred. In particular, two or more of the three substituents are preferably substituted or unsubstituted alkyl groups.

Preferred examples of the tertiary amine include, but are not limited to, triethylamine, 1,4-diazabicyclo[2.2.2]octane, tri-n-butylamine, N,N-diethylaniline, and 2,2,6,6-tetramethylpiperidine.

The catechol derivative indicates a compound having two or more hydroxy groups on the benzene ring including isomers such as resorcinol and hydroquinone. These compounds can trap singlet oxygen more efficiently than phenol derivatives having one hydroxy group on the benzene ring.

The substituent on the benzene ring of the catechol derivative is selected from hydrogen, alkyl group, cycloalkyl group, heterocyclic group, alkenyl group, cycloalkenyl group, alkynyl group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, phosphine oxide group, and a condensed ring and an aliphatic ring formed between adjacent substituents other than a hydroxy group. These substituents may be further substituted with the above substituents.

Among them, preferred are substituted or unsubstituted alkyl group, substituted or unsubstituted cycloalkyl group, substituted or unsubstituted aryl group, substituted or unsubstituted heteroaryl group, and halogen in view of photostability. More preferred are substituted or unsubstituted alkyl group, substituted or unsubstituted cycloalkyl group, substituted or unsubstituted aryl group, and halogen. Furthermore, because the change of color after reaction with the singlet oxygen quencher is small, more preferred are substituted or unsubstituted alkyl group, substituted or unsubstituted cycloalkyl group, and halogen. Substituted or unsubstituted alkyl group is particularly preferred.

As the positions of the hydroxy groups on the benzene ring of the catechol derivative, at least two hydroxy groups are preferably adjacent to each other. This is because of being more difficult to be photooxidized than resorcinol (1,3-substituted) and hydroquinone (1,4-substituted). In addition, even after being oxidized, light absorption in the visible range is small, and the change of color of the composition can be prevented.

Preferred examples of the catechol derivative include, but are not limited to, 4-tert-butylbenzene-1,2-diol and 3,5-di-tert-butylbenzene-1,2-diol.

The nickel compound is a compound containing nickel. Examples of the nickel compound include, but are not limited to, inorganic salts such as nickel chloride, complexes such as nickel bisacetylacetonate, and organic acid salts such as nickel carbamate. The organic acid salt referred to this disclosure indicates an organic compound having carboxy group, sulfonyl group, phenolic hydroxy group, or thiol group.

Among them, the nickel compound is preferably a complex or an organic acid salt in view of being uniformly dispersed in the composition.

Examples of the nickel complex and the nickel salt of the organic acid that can be suitably used as the singlet oxygen quencher include, but are not limited to, acetylacetonate-based nickel complexes, bisdithio-α-diketone-based nickel complexes, dithiolate-based nickel complexes, aminothiolate-based nickel complexes, thiocatechol-based nickel complexes, salicylaldehydeoxime-based nickel complexes, thiobisphenolate-based nickel complexes, indoaniline-based nickel compounds, carboxylic acid-based nickel salts, sulfonic acid-based nickel salts, phenol-based nickel salts, carbamic acid-based nickel salts, and dithiocarbamic acid-based nickel salts.

Among these, the nickel salt of the organic acid is preferred in view of the easiness of synthesis and being low in price.

Furthermore, sulfonic acid-based nickel salts are preferred in view of being low in a molar extinction coefficient in the visible range and not absorbing the light source and/or the emission of the luminous material. Furthermore, nickel salts of arylsulfonic acids are more preferred in view of exhibiting a better singlet quenching effect, and nickel salts of alkylsulfonic acids are preferred in view of solubility in a wide variety of kinds of solvents.

As the aryl group of the arylsulfonic acids, substituted or unsubstituted phenyl group is preferred, and phenyl group substituted with an alkyl group is more preferred in view of solubility and dispersibility in solvents.

As the light resistance stabilizers, compounds having a role of a radical quencher can also be suitably used. Preferred examples thereof include hindered amine-based compounds. Examples of the hindered amine-based compounds include piperidine derivatives such as 2,2,6,6,-tetramethylpiperidine, 4-hydroxy-2,2,6,6-tetramethylpiperidine, 4-hydroxy-1,2,2,6,6-pentamethylpiperidine, 4-methoxy-2,2,6,6-tetramethylpiperidine, 4-methoxy-1,2,2,6,6-pentamethylpiperidine, bis(2,2,6,6-tetramethyl-4-piperidyl) sebacate, bis(1,2,2,6,6-pentamethyl-4-piperidyl) sebacate, 2,2,6,6-tetramethyl-4-piperidyl methacrylate, and 1,2,2,6,6-pentamethyl-4-piperidyl methacrylate and oxides thereof.

Laminated Film

The laminated film included in the laminated member and the light source unit of the present invention is required to be formed of thermoplastic resins. Thermoplastic resins are generally lower in price than thermoset reins and photocurable resins, can be made into a sheet form simply and continuously by known melt extrusion, and can obtain the laminated film at low costs.

The laminated film included in the laminated member and the light source unit of the present invention is required to comprise a constitution in which 11 or more layers of different thermoplastic resins are alternately laminated with each other. The different thermoplastic resins referred to this disclosure indicate that their refractive indices are different from each other by 0.01 or more in any of two orthogonal directions freely selected within the plane of the film and a direction perpendicular to the plane.

Being alternately laminated with each other referred to this disclosure indicates that layers formed of the different thermoplastic resins are laminated with regular arrangement in a thickness direction. When the layers are formed of Thermoplastic Resins X and Y and the respective layers are represented as Layer X and Layer Y, the layers are laminated as X(YX)n (n is a natural number). When the layers are formed of Thermoplastic Resins X, Y, and Z, they are laminated as Z(XYZ)n (n is a natural number). The resins having different optical properties are thus alternately laminated with each other, thereby enabling interference reflection, which can reflect light with a wavelength designed from relation between a difference in refractive index and a layer thickness of the individual layers, to be exhibited.

When the numbers of layers laminated are each 10 or less, a high reflectance cannot be obtained in a desired band. The number of layers laminated is preferably 100 or more, more preferably 200 or more, and further preferably 600 or more.

As the number of layers increases, the interference reflection can widen a wavelength band and achieve a higher reflectance, whereby a laminated film that reflects light of a desired band can be obtained.

Although there is no upper limit on the number of layers, as the number of layers increases, manufacturing costs increase along with the upsizing of a manufacturing apparatus, and handleability worsens due to an increased film thickness. Therefore, the practical range of the number of layers is about 10,000.

The thicknesses of the individual layers formed of the thermoplastic resins should be appropriately adjusted depending on a method of use; when the thickness is 1 μm or thicker, the effect of reflective characteristics of light is not exhibited, at least a plurality of layers with a thickness of thinner than 1 μm are preferably included. Other than the layers with a thickness of thinner than 1 μm, layers with a thickness of 1 μm or thicker that do not have any effect on optical characteristics may be further included.

The laminated film included in the laminated member and the light source unit of the present invention preferably has a reflectance of incident light made incident from the light source described below on the laminated film being 20% or lower at an incident angle of 10°. The light made incident from the light source on the laminated film referred to this disclosure has a full width at half maximum in intensity distribution at the wavelength of light emitted from the light source as its range. The reflectance being 20% or lower at an incident angle of 10° means an average reflectance in the range of the full width at half maximum.

When the reflectance of the incident light made incident from the light source on the laminated film is 20% or lower at an incident angle of 10°, the amount of light that passes through the laminated film to reach the color conversion film out of the light made incident from the light source increases, and the emission by the color conversion film can be easily increased. When a blue light-emitting diode shown in the examples of the present invention is used as the light source as an example, the peak wavelength of the light made incident from the light source on the laminated film is 400 nm or longer and 500 nm or shorter. Furthermore, to increase the purity of the blue emission, the peak wavelength is preferably 43.0 nm or longer and 470 nm or shorter.

Not limited to the blue light-emitting diode, light-emitting diodes that emit near-ultraviolet rays (400 nm or longer and 420 nm or shorter) or light-emitting diodes that emit green or red light may be used. Similarly, a band-width giving a half-value is calculated, which is a calculation range for the reflectance of the incident light made incident from the light source on the laminated film. The reflectance of the incident light made incident from the light source on the laminated film is more preferably 15% or lower at an incident angle of 10° and further preferably 10% or lower at an incident angle of 10°. By reducing the reflectance, the emission by the color conversion film can be easily increased more efficiently.

In order to obtain such a laminated film, a reflection band is optimized by controlling the layer thicknesses of the individual layers of the film, and further a layer formed of a resin with a low refractive index is provided on the surface, whereby a reduction of surface reflection can be achieved.

The laminated film included in the laminated member and the light source unit of the present invention preferably has a reflectance of light made incident from the light source described below on the color conversion film and converted into light with a longer wavelength being 70% or higher at an incident angle of 60°. Specifically, the color conversion film preferably exhibits the green emission the peak wavelength of which is observed in the range of 500 nm or longer and 580 nm or shorter and the red emission the peak wavelength of which is observed in the range of 580 nm or longer and 750 nm or shorter in outputting white light, and the reflectance is preferably 70% or higher at an incident angle of 60° in the light in the range of 500 nm or longer and 750 nm or shorter.

The light made incident from the light source on the color conversion film and converted into the light with a longer wavelength referred to this disclosure specifically has a full width at half maximum in intensity distribution at the wavelength of the emission spectrum of the luminous material as its range with a wavelength at which the emission intensity of the light source included in the light source unit is at its peak regarded as an excitation wavelength. The reflectance being 70% or higher at an incident angle of 60° means an average reflectance in the range of the full width at half maximum.

One of the causes of a decrease in luminance in the light source unit using the color conversion film containing the luminous material is loss by stray light due to the light from the color conversion film emitting isotropically. In particular, a main cause of the loss is light emitted from the color conversion film toward the light source strays within the light source unit. When the laminated film having the reflectance of the light made incident from the light source on the organic luminous material and converted into the light with a longer wavelength being 70% or higher at an incident angle of 60° is included between the light source and the color conversion film as in the present invention, the light from the color conversion film can be reflected immediately below, and the decrease in luminance due to the stray light within a cavity on the light source side can be easily reduced. The reflectance is preferably 90% or higher at an incident angle of 60° and further preferably 95% or higher at an incident angle of 60°. As the reflectance increases, the amount of light passing through the laminated film decreases, thereby achieving a luminance improvement effect.

In addition, also preferred is a reflectance of the light made incident from the light source described below on the color conversion film and converted into the light with a longer wavelength being 70% or higher at an incident angle of 10°. By reflecting not only the light at an incident angle of 60° but also the light at an incident angle of 10°, almost all of the emission from the color conversion film is reflected by the laminated film from the light source toward the display side, whereby the effect of improving luminance is enormous.

In the present invention, also preferred is use as the laminated member including the color conversion film containing an organic luminous material that converts incident light into light with a longer wavelength than the light source and the laminated film comprising a constitution in which 11 or more layers of different thermoplastic resins are alternately laminated with each other. The laminated member including the color conversion film and the laminated film referred to this disclosure indicates that the color conversion film and the laminated film are fixed to each other directly or via an adhesive layer or the like. In this case, there is no space between the color conversion film and the laminated film, and a reduction in loss of light by stray light and elimination of reflection on the surface of the color conversion film to air make the effect of improving luminance noticeable.

Another preferred form is making the laminated film part of the color conversion film by directly providing a layer formed of the organic luminous material on the laminated film. In this case; a base for use in forming the color conversion film is replaced, which reduces costs and eliminates the space between the organic luminous material and the laminated film within the color conversion film, whereby the effect of reducing loss of light due to stray light is noticeable.

Figure 3:
FIG. 3 is a schematic sectional view of an example of an uneven shape on the surface of a laminated film.
Figure 4:
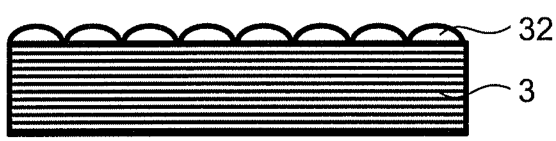
FIG. 4 is a schematic sectional view of an example of the uneven shape on the surface of the laminated film.

The laminated film for use in the laminated member and the light source unit of the present invention also preferably satisfies the following Numerical Formula (6). The following Numerical Formula (6) indicates that a change in reflectance between a light reflecting wavelength band and a light transmitting wavelength band is steep; as $|\lambda1-\lambda2|$ becomes smaller, the reflecting wavelength band changes into the transmitting wavelength band more steeply. The change in reflectance from the reflecting wavelength band to the transmitting wavelength band, that is, from the emission band of the light source to the light exit band of the color conversion film is thus steeply performed, thereby enabling only the light from the light source to be selectively and efficiently transmitted and enabling the light exiting from the color conversion film to be efficiently reflected, whereby an effect of a reflection film is easily obtained to the maximum. More preferred is that $|\lambda1-\lambda2|$ s 30 nm or smaller; as I$|\lambda1-\lambda2|$ becomes smaller, the luminance improvement effect improves. To achieve a desired $|\lambda1-\lambda2|$, a laminated film comprising a constitution in which 11 or more layers of different thermoplastic resins are alternately laminated with each other is required. In the sputtering of metal thin films, liquid crystal techniques, or the like, the conversion of reflectance from the reflecting wavelength band to the transmitting wavelength band is gentle, and a desired luminance improvement effect cannot be necessarily obtained.

$$|\lambda1-\lambda2|\leq 50 \text{ (where } \lambda1<\lambda2) \quad (6)$$

λ1: Wavelength (nm) at which the reflectance is ¼ of the maximum reflectance near the shorter wavelength end of the reflection band of the reflection film λ2: Wavelength (nm) at which the reflectance is ¾ of the maximum reflectance near the shorter wavelength end of the reflection band of the reflection film Also preferred is an uneven shape provided on the surface of the laminated film or the color conversion film included in the laminated member and the light source unit of the present invention. The uneven shape referred to this disclosure indicates one with a maximum height of 1 μm or higher when the shape of the surface or interface of the film is measured. FIG. 3 and FIG. 4 are schematic sectional views of examples of the uneven shape on the surface of the laminated film. In FIG. 3 and FIG. 4, the reference numerals 31 and 32 indicate the examples of the uneven shape. The following describes effects of forming the unevenness.

A first effect is slipperiness. By providing the uneven shape on the surface, slipperiness is exhibited, and the occurrence of flaws when the laminated film and the color conversion film are incorporated into the light source unit can be reduced.

A second effect is extraction of light. The inventors of the present invention have found that a phenomenon occurs in which in the color conversion film containing the organic luminous material light is reflected within the color conversion film to be confined within the sheet like an optical fiber, resulting in a phenomenon in which luminance decreases, although the luminous efficacy of the organic luminous material itself is high. As a measure against the phenomenon, the uneven shape is provided on the surface of the laminated film or the color conversion film, whereby light is extracted through the uneven interface, and the amount of light confined within the color conversion film is reduced, whereby the effect of improving luminance is obtained. To efficiently obtain the second effect, the maximum height is preferably 10 μm or higher. As the size of the uneven shape increases, light extraction efficiency also increases, and besides an effect of reducing unevenness of the light source is also obtained. To obtain this effect more efficiently, the laminated film is preferably made part of the color conversion film by directly providing a layer formed of the organic luminous material on the laminated film, and unevenness is preferably formed on the surface on the layer formed of the organic luminous material side of the laminated film. In this case, light can be efficiently extracted, and besides light can be efficiently reflected toward the display side, whereby the effect of improving luminance is noticeable.

A third effect is the adjustment of the optical path of light. The light from the light source, especially the light-emitting diode propagates toward the display side with relatively high directivity, whereas the light from the color conversion film is emitted isotropically, which causes a reduction in luminance on the front of the light source. The uneven shape is formed on the surface of the laminated film or the color conversion film, whereby the light direction is adjusted by the uneven interface, the light is converged in the font direction in particular, thereby easily achieving improvement in luminance and eliminating other optical members when the light source unit and the display are formed, which also contributes to a reduction in costs.

To obtain the second and third effects more efficiently, also preferred is that the uneven shape on the surface of the laminated film or the color conversion film included in the laminated member and the light source unit of the present invention is a lenticular shape, a substantially triangular shape, or a substantially semicircular shape. A micro-lenticular shape indicates unevenness with a substantially semispherical shape, whereas a prismatic shape indicates unevenness with a substantially triangular shape. When these shapes are included, the optical path for the light is converged to the display side, and the front luminance of the light source unit and when being made into a display increases more markedly.

The laminated member and the light source unit of the present invention preferably include the laminated film or the color conversion film with a difference between the incident angle of incident light made incident from the light source on the laminated film or the color conversion film and the exit angle of exit light being 5° or larger. The difference between the incident angle from the light source and the exit angle referred to this disclosure is the exit angle of light made incident at an incident angle of 60° by a variable angle photometer, and 0° is a direction perpendicular to a film face. In this case, the optical path of the light is converged to the display side, and the front luminance of the light source unit and when being made into a display improves more markedly. This improvement can be achieved by the fact that the uneven shape is the lenticular shape, the substantially triangular shape, or the substantially semicircular shape as described above.

Figure 5:
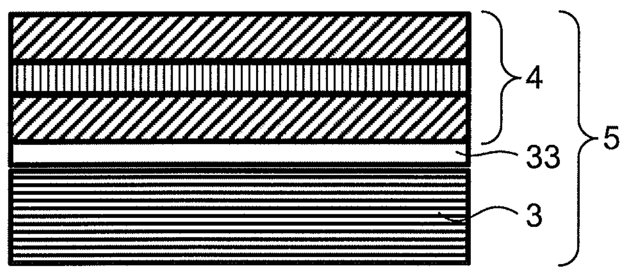
FIG. 5 is a schematic sectional view of an example of the laminated member according to the embodiment of the present invention.

FIG. 5 is a schematic sectional view of an example of the laminated member according to the embodiment. As illustrated in FIG. 5, the laminated member and the light source unit of the present invention include a functional layer 33 on the surface of the laminated film 3 or the color conversion film 4 included in the laminated member 5 and the light source unit 1. When the refractive index of the laminated film 3 is n1, the refractive index of the color conversion film 4 is n2, and the refractive index of the functional layer 33 is n3, the refractive index n3 of the functional layer 33 is preferably between n1 and n2. The refractive indexes of the laminated film 3 and the color conversion film 4 referred to this disclosure indicate an in-plane average refractive index of a layer as the outermost layer of the film. In this case, due to the effect of the refractive index of the functional layer 33, reflection between the laminated film 3 and the color conversion film 4, which have been conventionally different in refractive index, can be reduced, and the light from the light sources 2 passes therethrough efficiently, whereby luminance is easily improved.

The laminated film preferably absorbs or reflects ultraviolet rays. Absorbing or reflecting ultraviolet rays referred to this disclosure indicates that a band the transmittance of which is 50% or lower has a bandwidth of at least by 30 nm in the wavelength range of 300 nm or longer and 410 nm or shorter.

A light source used when the color conversion film is used as in the light source unit and the liquid crystal display of the present invention is a light source that is shorter in wavelength and higher in energy than a normal white light source such as a blue LED or a near-ultraviolet LED. For this reason, many ultraviolet rays that cause the deterioration of the color conversion film and the laminated film are contained, which may cause changes in color and luminance during long-term use. In particular, when the resin contained in the color conversion film is irradiated with ultraviolet rays, radicals are generated in the resin, and the generated radicals may cause the decomposition of the organic luminous material contained in the color conversion film by a radical reaction.

The laminated film absorbs or reflects ultraviolet rays, whereby the deterioration of the color conversion film and the laminated film can be reduced, and the light source unit and the liquid crystal display suitable for long-term use can be achieved. Specifically, it is preferable that incident light made incident from the light source described below on the laminated film gives a reflectance of light with a wavelength of 300 nm or longer and 410 nm or shorter being 20% or higher at an incident angle of 10° or with a absorbance of light with a wavelength of 300 nm or longer and 410 nm or shorter being 10% or higher at an incident angle of 10°.

The laminated film preferably has a transmittance at a wavelength of 300 nm or longer and 380 nm or shorter being 10% or lower at an incident angle of 10°. In this case, almost all ultraviolet rays that are absorbed by the color conversion film and the laminated film to cause them to be deteriorated can be cut, and almost no change in color and luminance is observed. The laminated film is preferred when the color conversion film that emits red, green, and blue light using a near-ultraviolet LED is used.

The transmittance at a wavelength of 300 nm or longer and 410 nm or shorter at an incident angle of 10° is further preferably 10% or lower. In the color conversion film that emits red and green light using blue light, absorption that does not contribute to color conversion efficient very much but causes deterioration is also present near a wavelength of 410 nm. The transmittance at a wavelength of 410 nm or shorter is made 10% or lower, whereby such deterioration of the color conversion film can be easily reduced.

Also preferred is that the transmittance of light with a wavelength shorter than the shorter wavelength end of the emission band of the light source by 20 nm is 10% or lower. As described above, the light of the light source is important for color conversion, but on the other hand, deteriorates the color conversion film itself. Given these circumstances, the laminated film that causes light with wavelengths important for color conversion to pass and cuts light with shorter wavelengths that hardly contribute to color conversion is used to protect the color conversion film, whereby deterioration during long-term use can be almost reduced without impairing the luminous efficacy by the color conversion film.

Figure 10:
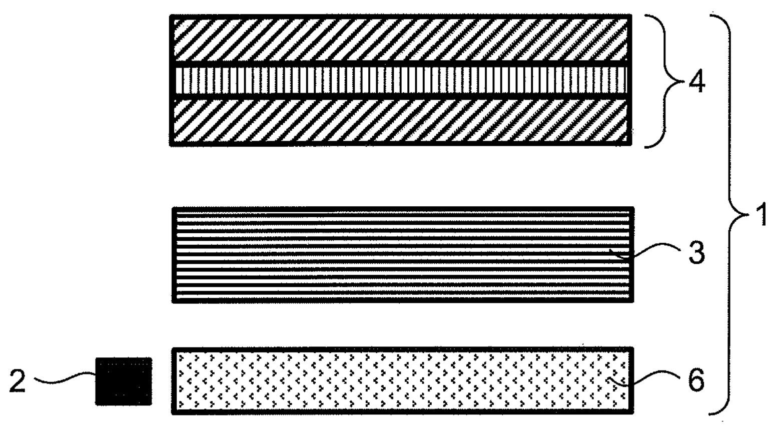
FIG. 10 is a schematic sectional view of another example of the light source unit according to the embodiment of the present invention.

The laminated film is preferably provided between the light source and the color conversion film. Being between the light source and the color conversion film referred to this disclosure indicates that being between the light sources 2 and the color conversion film 4 in an immediately under type, in which the light sources 2 and the color conversion film 4 are arranged on a line as illustrated in FIG. 1. FIG. 10 is a schematic sectional view illustrating another example of the light source unit according to the embodiment. In a configuration in which light from the light sources 2 provided on the side face as illustrated in FIG. 10 once diffuses in a planar manner via a light-guiding plate 6 and exits immediately upward, being between the light source and the color conversion film indicates being between the light-guiding plate 6 and the color conversion film 4.

Being provided between the light source and the color conversion film does not necessarily require the laminated film to be adjacent to the light source, the light-guiding plate, or the color conversion film and another component may be interposed therebetween. When the laminated film is provided between the light source and the color conversion film, light with shorter wavelengths and higher energy that causes the deterioration of the color conversion film contained in the light source can be prevented from reaching the color conversion film.

In the light source unit of the present invention, the light source, the laminated film, and the color conversion film are also preferably arranged in the order of the light source, the color conversion film, and the laminated film. In this case, the color conversion film can be protected also from ultraviolet rays emitted from outside the light source and the liquid crystal display, and the light source and the liquid crystal display that cause no change in color tone and luminance can be achieved.

The transmittance at a wavelength of 410 nm or shorter of the laminated film for use in the present configuration is preferably 10% or lower. In this case, ultraviolet rays with a wavelength of 380 nm or longer and 410 nm or shorter that cannot be covered by the other optical films for use in the light source unit and the liquid crystal display can also be cut, and light that causes the deterioration of the color conversion film contained in external light can be cut, exhibiting excellent color and luminance stability in long-term use at places exposed to sunlight such as the outdoors and automobiles in particular.

Further preferred is that two laminated films that absorb or reflect ultraviolet rays are included and that the light source, the laminated film, the color conversion film, and the laminated film are arranged in this order. In this case, both the ultraviolet rays from the light source and the ultraviolet rays emitted from outside the light source and the liquid crystal display can be cut, exhibiting extremely excellent color and luminance stability in long-term use at places exposed to sunlight such as the outdoors and automobiles.

The laminated film preferably has a longest reflection wavelength of 700 nm or longer. Furthermore, in such a laminated film, the thermoplastic resin layer of the portion comprising the constitution in which 11 or more layers of different thermoplastic resins are alternately laminated with each other preferably includes two kinds of resins of Thermoplastic Resins X and Y. In addition, in that case, parts with a thickness of thinner than 1 μm out of the individual layers of Thermoplastic Resins X and Y preferably have the following relation. In other words, the sum total x of the thicknesses of all layers with a thickness of thinner than 1 μm out of the layers formed of Thermoplastic Resin X and the sum total y of the thicknesses of all layers with a thickness of thinner than 1 μm out of the layers formed of Thermoplastic Resin Y preferably have a relation of $x/y \geq 1.5$, where X and Y are selected so as to be $x>y$. The layers of Thermoplastic Resins X and Y with a thickness of 1 μm or thicker do not contribute to light reflection characteristics and are not included in the calculation of x and y.

The laminated film causes secondary reflection at a wavelength about half the main primary reflection wavelength as the product of the refractive index of each layer and the thickness of each layer (an optical thickness) becomes larger than 1 in adjacent layers. The longest reflection wavelength being 700 nm or longer causes the secondary reflection in the ultraviolet range with a wavelength of 300 nm or longer and 410 nm or shorter, and besides the ratio of the layer thicknesses of the adjacent layers being 1.5 can enhance the secondary reflection, whereby desired ultraviolet cutting performance can be easily imparted.

The longest reflection wavelength of the laminated film is preferably 800 nm or longer. In this case, ultraviolet rays with wavelengths of thinner than 410 nm can be cut, and the effect of reducing the deterioration of the color conversion film increases. Further preferred is that the ratio of the layer thicknesses of the adjacent layers is 2.0 or higher; as the secondary reflection enhances, higher ultraviolet cutting performance can be achieved, and the deterioration of the color conversion film and the laminated film can be easily reduced.

In the laminated film, an ultraviolet light absorbent is preferably contained in at least one of the thermoplastic resins. The ultraviolet light absorbent referred to this disclosure indicates a component that absorbs light with a wavelength of 300 nm or longer and 410 nm or shorter and other than thermoplastic resins. By containing the ultraviolet light absorbent, transmittance-reflectance (nearly equal to absorbance) in a wavelength of 300 nm or longer and 410 nm or shorter at an incident angle of 10° is preferably 10% or higher.

The ultraviolet light absorbent is contained, whereby ultraviolet rays are easily cut. Further preferred is that the reflectance of light with a wavelength of 300 nm or longer and 410 nm or shorter is 20% or higher at an incident angle of 10°.

In the laminated film in the present invention, the interface of adjacent layers reflects light with a wavelength corresponding to the thicknesses of the layers. In the process, light is reflected many times within the film and is then extracted out of the film. By adding the ultraviolet light absorbent to such a film, the number of times light passes through the layer containing the ultraviolet light absorbent increases unlike a film having a few layers involving no reflection in the film. With this phenomenon, a high ultraviolet cutting effect can be obtained efficiently with a small amount of the ultraviolet light absorbent, whereby a low-cost ultraviolet cutting film can be achieved.

When a film the number of layers of which is 10 or less is used, the ultraviolet light absorbent may be precipitated in a long-term reliability test. Using the laminated film including 11 or more layers gives the advantage that the ultraviolet light absorbent is trapped by the interfaces of the layers and within the layers and is prevented from being precipitated on the film surface.

The ultraviolet light absorbent in the present specification is defined as two kinds including a general general-purpose ultraviolet light absorbent that absorbs ultraviolet rays in the wavelength range of 380 nm or shorter and a visible light absorbing dye that can also cut light near the boundary between the ultraviolet range and the visible light range (around 380 nm or longer and 430 nm or shorter).

The general-purpose ultraviolet light absorbent is generally more excellent in the ability to absorb the ultraviolet rays in the wavelength range of 380 nm or shorter than in the ability to absorb the light near the boundary between the ultraviolet range and the visible light range (around 380 nm or longer and 430 nm or shorter). For this reason, to cut the light near the boundary between the ultraviolet range and the visible light range (around 380 nm or longer and 430 nm or shorter) simply by containing the general-purpose ultraviolet light absorbent, the effect appears by containing the general-purpose ultraviolet light absorbent in a high concentration except partial long-wavelength ultraviolet absorption described below.

Examples of the ultraviolet light absorbent that can achieve wavelength cutting in the ultraviolet range and the region near the boundary between the ultraviolet range and the visible light range (around 380 nm or longer and 430 nm or shorter) as a single general-purpose ultraviolet light absorbent include compounds represented by structures such as 2-(5-chloro-2H-benzotriazol-2-yl)-6-tert-butyl-4-methylphenol and 2,4,6-tris(2-hydroxy-4-hexyloxy-3-methylphenyl)-1,3,5-triazine as commercially available general-purpose ultraviolet light absorbents as only examples.

The visible light absorbing dye is generally more excellent in the performance to cut a visible short wavelength range than in the ability to cut the ultraviolet range of 380 nm or shorter. For this reason, to cut light in a general-purpose ultraviolet range simply by containing the visible light absorbing dye, the effect appears by containing the visible light absorbing dye in a high concentration except partial visible light absorbing dyes described below. The visible light absorbing dye generally has a property that broadly cuts a wide wavelength range in many cases, and when it is contained in a high concentration, it absorbs the visible light range on the longer wavelength side than the target wavelength range, and it is preferably contained to such an extent that it does not have any influence on the absorption of the visible light emitted from the color conversion film. There are few visible light absorbing dyes having a property that performs cutting near the boundary between the ultraviolet range and the visible light range in the wavelength range of 380 nm or longer and 440 nm or shorter in particular with a narrow band, and it is desirable to select and use a visible light absorbing dye having a specific structure.

Examples of the visible light absorbing dye that can achieve wavelength cutting in the ultraviolet range and the region near the boundary between the ultraviolet range and the visible light range (around 380 nm or longer and 430 nm or shorter) by single addition include "LumogenF Violet570" manufactured by BASF. The general-purpose ultraviolet light absorbent and/or the visible light absorbing dye have individual strong ranges, and to prevent bleed out caused by high concentration addition and process contamination along therewith, more preferred is a technique that effectively combines one or more kinds of ultraviolet light absorbent and one or more kinds of visible light absorbing dyes.

When one or more kinds of general-purpose ultraviolet light absorbent and one or more kinds of visible light absorbing dyes are contained in the laminated film, the light transmittance described above can be easily achieved while maintaining transparency and bleed out preventing property. Examples of the general-purpose ultraviolet light absorbent that is available in that case include multi-skeleton ultraviolet light absorbents such as a benzotriazole-based one, a benzophenone-based one, a benzoate-based one, a triazine-based one, a benzoxazinone-based one, a salicylic acid-based one, and a benzoxazine-based one in addition to the two kinds of general-purpose ultraviolet light absorbents described above.

When two or more kinds of general-purpose ultraviolet light absorbents and/or visible light absorbing dyes are used in combination, they may be ultraviolet light absorbents having the same skeleton, or ultraviolet light absorbents having different skeletons may be combined.

The ultraviolet light absorbent for use in the present invention is preferably a general-purpose ultraviolet light absorbent having a maximum absorption wavelength in the wavelength range of 320 nm or longer and 380 nm or shorter. When the maximum wavelength is shorter than 320 nm, it is difficult to sufficiently cut an ultraviolet area on the longer wavelength side, and even when it is combined with a dye having a maximum wavelength that is maximized in a visible light short wavelength range of exceeding 380 nm and 430 nm or shorter, a range exhibiting a light transmittance of 10% or higher is likely to occur in the wavelength range of 300 nm or longer and 380 nm or shorter. Given these circumstances, the ultraviolet light absorbent described above is preferably used in order to give a maximum value of the light transmittance in the ultraviolet range of the wavelength range of 300 nm or longer and 380 nm or shorter of 10% or lower.

The following describes specific examples thereof, in which compounds the maximum wavelength of which is in the wavelength range of 320 nm or longer and 380 nm or shorter are attached with (*) following their compound names.

Examples of the benzotriazole-based ultraviolet light absorbent include, but are not limited to, 2-(2'-hydroxy-5'-methylphenyl)benzotriazole (*), 2-(2'-hydroxy-3',5'-di-tert-butylphenyl)benzotriazole (*), 2-(2'-hydroxy-3',5'-di-tert-butylphenyl)-5-chlorobenzotriazole (*), 2-(2'-hydroxy-3'-tert-butyl-5'-methylphenyl)benzotriazole (*), 2-(2'-hydroxy-3'-tert-butyl-5'-methylphenyl)-5-chlorobenzotriazole (*), 2-(2'-hydroxy-3',5'-di-tert-amylphenyl)-5-chlorobenzotriazole (*), 2-(2'-hydroxy-3'-(3",4",5",6"-tetrahydrophthalimidomethyl)-5'-methylphenyl)benzotriazole (*), 2-(5-chloro-2H-benzotriazol-2-yl)-6-tert-butyl-4-methylphenol (*), 2,2'-methylenebis(4-(1,1,3,3-tetramethylbutyl)-6-(2H-benzotriazol-2-yl)phenol (*), 2-(2'-hydroxy-3',5'-di-tert-pentylphenyl)benzotriazole, 2-(2'-hydroxy-5'-tert-octylphenyl)benzotriazole, and 2,2'-methylenebis(4-tert-octyl-6-benzotriazolyl)phenol (*).

Examples of the benzophenone-based ultraviolet light absorbent include, but are not limited to, 2,4-dihydroxybenzophenone, 2-hydroxy-4-methoxybenzophenone, 2-hydroxy-4-octoxybenzophenone, 2,2'-dihydroxy-4-methoxybenzophenone (*), 2,2'-dihydroxy-4,4'-dimethoxybenzophenone, 2,2',4,4'-tetrahydroxy-benzophenone, and 5,5'-methylenebis(2-hydroxy-4-methoxybenzophenone).

Examples of the benzoate-based ultraviolet light absorbent include, but are not limited to, resorcinol monobenzoate, 2,4-di-tert-butylphenyl-3,5-di-tert-butyl-4-hydroxybenzoate, 2,4-di-tert-amylphenyl-3,5-di-tert-butyl-4-hydroxybenzoate, 2,6-di-tert-butylphenyl-3',5'-di-tert-butyl-4'-hydroxybenzoate, hexadecyl-3,5-di-tert-butyl-4-hydroxybenzoate, and octadecyl-3,5-di-tert-butyl-4-hydroxybenzoate.

Examples of the triazine-based ultraviolet light absorbent include, but are not limited to, 2-(2-hydroxy-4-hexyloxy-phenyl)-4,6-diphenyl-s-triazine, 2-(2-hydroxy-4-popoxy-5-methylphenyl)-4,6-bis(2,4-dimethyphenyl)-s-triazine, 2-(2-hydroxy-4-hexyloxyphenyl)-4,6-dibiphenyl-s-triazine, 2,4-diphenyl-6-(2-hydroxy-4-methoxyphenyl)-s-triazine, 2,4-diphenyl-6-(2-hydroxy-4-ethoxyphenyl)-s-triazine, 2,4-diphenyl-6-(2-hydroxy-4-propoxyphenyl)-s-triazine, 2,4-diphenyl-6-(2-hydroxy-4-butoxyphenyl)-s-triazine, 2,4-bis(2-hydroxy-4-octoxyphenyl)-6-(2,4-dimethylphenyl)-s-triazine, 2,4,6-tris(2-hydroxy-4-hexyloxy-3-methylphenyl)-s-triazine (*), 2,4,6-tris(2-hydroxy-4-octoxyphenyl)-s-triazine, 2-(4-isooctyloxycarbonylethoxyphenyl)-4,6-diphenyl-s-triazine, and 2-(4,6-diphenyl-s-triazin-2-yl)-5-(2-(2-ethylhexanoyloxy)ethoxy)phenol.

Examples of the benzoxazinone-based ultraviolet light absorbent include, but are not limited to, 2,2'-p-phenylenebis(4H-3,1-benzoxazin-4-on) (*), 2,2'-p-phenylenebis(6-methyl-4H-3,1-benzoxazin-4-on), 2,2'-p-phenylenebis(6-chloro-4H-3,1-benzoxazin-4-on) (*), 2,2'-p-phenylenebis(6-methoxy-4H-3,1-benzoxazin-4-on), 2,2'-p-phenylenebis(6-hydroxy-4H-3,1-benzoxazin-4-on), 2,2'-(naphthalene-2,6-diyl)bis(4H-3,1-benzoxazin-4-on) (*),2,2'-(naphthalene-1,4-diyl)bis(4H-3,1-benzoxazin-4-on) (*), and 2,2'-(thiophene-2,5-diyl)bis(4H-3,1-benzoxazin-4-on) (*).

As other examples of the ultraviolet light absorbent, a salicylic acid-based one such as phenyl salicylate, tert-butylphenyl salicylate, and p-octylphenyl salicylate, a natural product-based one (such as orizanol, shea butter, and baicalin), a bio-based one (such as cornified cells, melanin, and urocanine), and the like can also be used.

A hindered amine-based compound as a stabilizer can be used in combination with these ultraviolet light absorbents.

At least one of the ultraviolet light absorbents for use in the present invention is an ultraviolet light absorbent having a triazine skeleton. It is known that the triazine skeleton is higher in thermal decomposition temperature and is more excellent in long-term stability than a benzotriazole skeleton and a benzophenone skeleton generally used in ultraviolet light absorbents, and the triazine skeleton is suitable for laminated films for display use that requires to retain performance over the long term. In addition, the triazine skeleton is low in a melting point, thereby producing effects of not only reducing the surface precipitation of the ultraviolet light absorbent itself as a solid component but also making it difficult for oligomers and other highly sublimable ultraviolet light absorbents to be precipitated, and thus the triazine skeleton can be suitably used.

In the laminated film of the present invention, as the visible light absorbing dye available when the above light transmittance is achieved by combining one or more kinds of general-purpose ultraviolet light absorbents and one or more kinds of visible light absorbing dyes, dyes other than the visible light absorbing dyes described above can also be selected.

As the visible light absorbing dye for use in the present invention, dyes that can be dissolved in solvents and are excellent in color saturation may be used for the purpose of being added to a curable resin described below, or pigments, which are more excellent in heat resistance and resistance to moist heat than dyes, may be used for the purpose of being kneaded into the resin.

The pigments can be broadly classified into organic pigments, inorganic pigments, and classical pigments. The organic pigments are preferably used in view of compatibility with the thermoplastic resin or the curable resin to which the pigments are added. The structure of the visible light absorbing dye is not limited to a particular structure. Examples thereof include a β-naphthol-based one, a naphthol AS-based one, an acetoacetic acid aryl amide-based one, an acetoacetic acid aryl amide-based one, a pyrazolone-based one, an azo-based one such as a β-oxynaphthoic acid-based one, a phthalocyanine-based one such as copper phthalocyanine, copper phthalocyanine halide, metal-free phthalocyanine, and copper phthalocyanine lake, an azomethine-based one, an aniline-based one, an alizarin-based one, an anthraquinone-based one, an isoindolinone-based one, an isoindoline-based one, an indole-based one, a quinacridone-based one, a quinophthalone-based one, a dioxazine-based one, a thioindigo-based one, a triazine-based one, a naphthalimide-based one, a nitron-based one, a perinone-based one, a perylene-based one, a benzoxazine-based one, a benzotriazole-based one, and a natural organic dye.

The visible light absorbing dye more preferably has a maximum wavelength of 390 nm or longer and 410 nm or shorter. When a dye having a maximum wavelength in the longer wavelength range than 410 nm is selected, an average transmittance in the emission band of the light source may be smaller than 80% unless a dye having cutting performance with an extremely narrow band is selected. As the visible light absorbing dye that has a maximum wavelength in the wavelength range of 390 nm or longer and 410 nm or shorter and can exhibit absorption performance in a narrow band, ultraviolet light absorbents having a skeleton of any of anthraquinone, azomethine, indole, triazine, naphthalimide, and phthalocyanine can be preferably used.

As a prescription for the general-purpose ultraviolet light absorbent and the visible light absorbing dye to be contained in the laminated film, an indicator c×t of absorption performance represented by the product of a sum c [wt %] of the contents of the general-purpose ultraviolet light absorbent and the visible light absorbing dye and a film thickness t [μm] preferably satisfies 80 [wt %·μm] or less. The indicator c×t is more preferably 50 [wt %·μm] or less and further preferably 30 [wt %·μm] or less. With this prescription, visibility improves when being mounted on the light source unit or the liquid crystal display without having any influence on a decrease in transmittance or an increase in turbidity (a haze value) by the addition of the general-purpose ultraviolet light absorbent and/or the visible light absorbing dye.

The laminated film preferably contains a resin layer containing an ultraviolet light absorbent on at least one side thereof in order to increase ultraviolet absorption efficiency. Furthermore, the laminated film preferably has a curable resin-containing layer at least on one side thereof and contains an ultraviolet light absorbent in the curable resin-containing layer. In this case, functions such as wear resistance and dimension stability can be added in accordance with the composition of the curable resin, and in addition, the cross-linkability of the curable resin-containing layer is high, and oligomers, additives, and the like contained within the laminated film can be prevented from being precipitated. In particular, the laminated film is used for the light source unit, and it is necessary that the characteristics of the film be unchanged in a long-term reliability test on harsh conditions.

Specifically the long-term reliability test on harsh conditions indicates an accelerated heat resistance test at a temperature of 85° C. and an accelerated moisture and heat resistance test at a temperature of 60° C. and 90% RH described below.

The curable resin-containing layer is laminated on the laminated film, whereby wear resistance and dimension stability can be further improved. The curable resin-containing layer may be directly applied onto the laminated film. The curable resin-containing layer may be provided only on one side of the laminated film or provided on both sides thereof in view of preventing the curling of the laminated film caused by the contraction stress of the curable resin.

The curable resin is preferably highly transparent and durable; examples thereof include an acrylic resin, an urethane resin, a fluorine resin, a silicone resin, a polycarbonate resin, and a vinyl chloride resin, which can be used singly or in a mixed manner. In view of curability, flexibility, and productivity, the curable resin preferably contains an active energy ray-curable resin such as an acrylic resin represented by a polyacrylate resin or the like.

The active energy ray-curable resin for use in the component of the curable resin-containing layer can contain as a monomer component forming the active energy ray-curable resin polyfunctional (meth)acrylic compounds such as pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, trimethylolpropane tri(meth)acrylate, bis(mathacroyl thiophenyl)sulfide, 2,4-dibromophenyl (meth)acrylate, 2,3,5-tribromophenyl (meth)acrylate, 2,2-bis(4-(meth)acryloyloxyphenyl)propane, 2,2-bis(4-(meth)acryloyloxyethoxyphenyl) propane, 2,2-bis(4-(meth)acryloyloxydiethoxyphenyl) propane, 2,2-bis(4-(meth)acryloylpentaethoxyphenyl) propane, 2,2-bis(4-(meth)acryloyloxyethoxy-3,5-dibromophenyl)propane, 2,2-bis(4-(meth) acryloyloxydiethoxy-3,5-dibromophenyl)propane, 2,2-bis (4-(meth)acryloyloxypentaethoxy-3,5-dibromophenyl) propane, 2,2-bis(4-(meth)acryloyloxyethoxy-3,5-dimethylphenyl)propane, 2,2-bis(4-(meth) acryloyloxyethoxy-3-phenylphenyl)propane, bis(4-(meth) acryloyloxyphenyl)sulfone, bis(4-(meth) acryloyloxyethoxyphenyl)sulfone, bis(4-(meth) acryloyloxypentaethoxyphenyl)sulfone, bis(4-(meth) acryloyloxyethoxy-3-phenylphenyl)sulfone, bis(4-(meth) acryloyloxyethoxy-3,5-dimethylphenyl)sulfone, bis(4-(meth)acryloyloxyphenyl)sulfide, bis(4-(meth) acryloyloxyethoxyphenyl)sulfide, bis(4-(meth) acryloyloxypentaethoxyphenyl)sulfide, bis(4-(meth) acryloyloxyethoxy-3-phenylphenyl)sulfide, bis(4-(meth) acryloyloxyethoxy-3,5-dimethylphenyl)sulfide, di((meth) acryloyloxyethoxy)phosphate, and tri((meth) acryloyloxyethoxy)phosphate; one of these or two or more of them can be used.

Examples of substances to be used together with these polyfunctional (meth)acrylic compounds in order to control the hardness, the transparency, the strength, the refractive index, and the like of the active energy ray-curable resin, styrene, chloro styrene, dichloro styrene, bromo styrene, dibromo styrene, divinyl styrene, vinyl toluene, 1-vinyl naphthalene, 2-vinyl naphthalene, N-vinyl pyrrolidone, phenyl (meth)acrylate, benzyl (meth)acrylate, biphenyl (meth) acrylate, diallyl phthalate, dimethallyl phthalate, diallyl biphenylate, and reactants of metal such as barium, lead, antimony, titanium, tin, or zinc and (meth)acrylic acid. One of these or two or more of them may be used.

Examples of a method for curing the active energy ray-curable resin include a method that applies ultraviolet rays; in this case, about 0.01 part by weight to 10 parts by weight of a photopolymerization initiator is preferably added to the curable resin.

To the active energy ray-curable resin for use in the present invention, organic solvents such as isopropyl alcohol, ethyl acetate, methyl ethyl ketone, and toluene can be added in order to improve workability during coating and control the coating film thickness to the extent that the effects of the present invention are not impaired.

The active energy ray in the present invention means electromagnetic waves that polymerize acrylic vinyl group such as ultraviolet rays, electron beams, and radiation (such as α rays, β rays, or γ rays) and is practically preferably ultraviolet rays because of simplicity. Examples of an ultraviolet source include an ultraviolet fluorescent lamp, a low pressure mercury lamp, a high pressure mercury lamp, a super-high pressure mercury lamp, a xenon lamp, and a carbon arc lamp. An electron beam system is advantageous in that there is no need to contain a photopolymerization initiator, a photosensitizer, and the like, although an apparatus therefor is high in price, and operation in an inert gas is required.

The thickness of the curable resin-containing layer, which should be appropriately adjusted by a method use, is normally preferably 1 μm to 6 μm, more preferably 1 μm to 3 μm, and further preferably 1 μm to 1.5 μm.

A thermosetting urethane resin used as a component of the curable resin-containing layer in order to impart wear resistance is preferably a resin obtained by cross-linking a copolymer resin having a polycaprolactone segment and/or a polysiloxane segment or a polydimethylsiloxane segment with a compound having isocyanate group through a thermal reaction. By using the thermosetting urethane resin, the curable resin-containing layer can be made tough, and at the same time, elastic recovery can be promoted, whereby wear resistance can be added to the laminated film.

The polycaprolactone segment contained in the thermosetting urethane resin produces an effect of resilience, and radical polymerizable polycaprolactone such as polycaprolactonediol, polycaprolactonetriol, or lactone-modified hydroxyethyl acrylate can be used therefor.

The polysiloxane and/or polydimethylsiloxane segments contained in the thermosetting urethane resin coordinate to the surface to produce an effect of improving surface lubricity and reducing frictional resistance. Examples of the resin having the polysiloxane segment include tetraalkoxysilanes, methyltrialkoxysilanes, dimethyldialkoxysilanes, γ-glycidoxypropyltrialkoxysilanes, and γ-methacryloxypropyltrialkoxysilanes. Preferred examples of the resin having the polydimethylsiloxane segment include copolymers obtained by copolymerizing any of various kinds of vinyl monomers such as methyl acrylate, isobutyl acrylate, methyl methacrylate, n-butyl methacrylate, styrene, α-methyl styrene, acrylonitrile, vinyl acetate, vinyl chloride, vinyl fluoride, acrylamide, methacrylamide, and N,N-dimethylacrylamide with the polydimethylsiloxane segment.

When the curable resin-containing layer is provided on one side of the laminated film, the general-purpose ultraviolet light absorbent and the visible light absorbing dye may be contained in either the laminated film or the curable resin-containing layer. The curable resin-containing layer is highly cross-linked, and when the ultraviolet light absorbent is added to the inside of the layer, the ultraviolet light absorbent is prevented from being precipitated. In addition, also when the ultraviolet light absorbent is added to the inside of the laminated film, the layer produces an effect as a lid for preventing the additive from being precipitated, and laminating the curable resin-containing layer itself is less likely to cause the problem that visibility is impaired when being mounted on the light source unit or the liquid crystal display.

When the ultraviolet light absorbent is added to the laminated film, the general-purpose ultraviolet light absorbent and the visible light absorbing dye are preferably contained separately in the laminated film and the curable resin-containing layer. More preferred is that the laminated film contains the ultraviolet light absorbent, whereas the curable resin-containing layer contains the visible light absorbing dye.

In addition, the general-purpose ultraviolet light absorbent and/or the visible light absorbing dye are preferably added separately to the individual layers so as to cause the total added concentration in the entire film to be constant. With this addition, the quality of the film can be prevented from degrading during heat treatment of the film or after the reliability test caused by the addition of the ultraviolet light absorbent in a high concentration locally to a partial layer.

When this technique is used, preferably used is either a technique that adds the general-purpose ultraviolet light absorbent that is resistant to kneading and has high heat resistance to the laminated film to be contained therein and adds the visible light absorbing dye that is suitable for solvent use to the curable resin-containing layer to be contained therein or a technique that adds the visible light absorbing dye that is resistant to kneading and has high heat resistance to the laminated film to be contained therein and adds the general-purpose ultraviolet light absorbent that is suitable for solvent use to the curable resin-containing layer to be contained therein. By using these techniques, the individual weak points of the general-purpose ultraviolet light absorbent and the visible light absorbing dye in kneading use and application use can be compensated.

In particular, in view of the production efficiency of the laminated film in extruded film formation, the production efficiency of the laminated film during application, the visible light absorbing dye being generally higher in price than the general-purpose ultraviolet light absorbent, and the like, the most preferred is the technique that adds the general-purpose ultraviolet light absorbent that is resistant to kneading and has high heat resistance to the laminated film to be contained therein and adds the visible light absorbing dye that is suitable for application use to the curable resin-containing layer to be contained therein.

The content of the general-purpose ultraviolet light absorbent and/or the visible light absorbing dye when the curable resin-containing layer is laminated on at least one side of the laminated film is preferably as follows; in other words, when the concentrations of the general-purpose ultraviolet light absorbent and/or the visible light absorbing dye to be added to the individual layers of the laminated film and the curable resin-containing layer are cX, cY [wt %], and the thicknesses of the respective layers are tX, tY [μm], respectively, an indicator $cX \times tX + cY \times tY$ of absorption performance represented as the form of sum preferably satisfies 80 [wt %·μm] or less. The indicator $cX \times tX + cY \times tY$ is more preferably 50 [wt %·μm] or less and further preferably 30 [wt %·μm] or less.

The amount added should be adjusted as appropriate in view of the absorption performance of the additives and the thicknesses of the individual layers; when the amount exceeds 80 [wt %·μm], the effect of the surface precipitation of the additives on optical performance is a matter of concern in the reliability test, which may cause trouble.

Examples of the laminated film included in the laminated member and the light source unit of the present invention include chain polyolefins such as polyethylene, polypropylene, poly(4-methylpentene-1), and polyacetal; alicyclic polyolefins as products of ring-opening metathesis polymerization, addition polymerization, and addition polymerization with other olefins of norbornenes; biodegradable polymers such as polylactic acid and polybutyl succinate; polyamides such as nylon 6, nylon 11, nylon 12, and nylon 66; aramid; polymethyl methacrylate; polyvinyl chloride; polyvinylidene chloride; polyvinyl alcohol; polyvinyl butyral; ethylene-vinyl acetate copolymer; polyacetal; polyglycol acid; polystyrene; styrene-copolymerized polymethyl methacrylate; polycarbonate; polyesters such as polypropylene terephthalate, polyethylene terephthalate, polybutylene terephthalate, and polyethylene-2,6-naphthalate; polyether sulfone; polyether ether ketone; modified polyphenylene ether; polyphenylene sulfide; polyether imide; polyimide; polyarylate; a tetrafluoroethylene resin; a trifluoroethylene resin; a trifluorochloroethylene resin; tetrafluoroethylene-hexafluoropropylene copolymer; polyfluorovinylidene. Among these, polyesters in particular are more preferably used in view of strength, heat resistance, transparency, and versatility. These may be copolymers or mixtures of two or more resins.

Among polyesters, preferred is a polyester obtained by the polymerization of a monomer having an aromatic dicarboxylic acid or an aliphatic dicarboxylic acid and a diol as primary components. Examples of the aromatic dicarboxylic acid include terephthalic acid, isophthalic acid, phthalic acid, 1,4-naphthalene dicarboxylic acid, 1,5-naphthalene dicarboxylic acid, 2,6-naphthalene dicarboxylic acid, 4,4'-diphenyl dicarboxylic acid, 4,4'-diphenyl ether dicarboxylic acid, and 4,4'-diphenyl sulfone dicarboxylic acid. Examples of the aliphatic dicarboxylic acid include adipic acid, suberic acid, sebacic acid, dimer acid, dodecanedioic acid, cyclohexane dicarboxylic acid, and ester derivatives thereof. Among them, preferred are terephthalic acid and 2,6-naphthalene dicarboxylic acid, which exhibit a high refractive index. Only one of these acid components may be used, or two or more of them may be used in combination. Furthermore, an oxyacid such as hydroxy benzoic acid may be partially copolymerized therewith.

Examples of the diol component include ethylene glycol, 1,2-propanediol, 1,3-propanediol, neopentyl glycol, 1,3-butanediol, 1,4-butanediol, 1,5-pentanediol, 1,6-hexanediol, 1,2-cyclohexanedimethanol, 1,3-cyclohexanedimethanol, 1,4-cyclohexanedimethanol, diethylene glycol, triethylene glycol, polyalkylene glycol, 2,2-bis(4-hydroxyethoxyphenyl)propane, isosorbide, and spiroglycol. Among them, ethylene glycol is suitably used. One of these diol components may be used, or two or more of them may be used in combination.

In the laminated film included in the laminated member and the light source unit of the present invention, the thermoplastic resin preferably uses, among the polyesters, polyethylene terephthalate and polymers thereof, polyethylene naphthalate and copolymer thereof, polybutylene terephthalate and copolymers thereof, polybutylene naphthalate and copolymers thereof, polyhexamethylene terephthalate and copolymers thereof, polyhexamethylene naphthalate and copolymers thereof, or the like.

In the laminated film included in the laminated member and the light source unit of the present invention, a difference in in-plane average refractive index between Layer X formed of Thermoplastic Resin X and Layer Y formed of Thermoplastic Resin Y is preferably 0.03 or larger. The difference in in-plane average refractive index is more preferably 0.05 or larger and further preferably 0.1 or larger. When the difference in in-plane average refractive index is smaller than 0.03, sufficient reflectance cannot be obtained, which may lead insufficient luminance improvement performance. To achieve this condition, a crystalline resin is used as Thermoplastic Resin X, whereas an amorphous resin is use as Thermoplastic Resin Y, for example. In this case, the difference in refractive index can be easily provided in stretching and heat treatment in the manufacture of the laminated film.

In the laminated film included in the laminated member and the light source unit of the present invention, as a preferred combination of Thermoplastic Resin X and Thermoplastic Resin Y, the absolute value of a difference in SP value between the thermoplastic resins is first preferably 1.0 or lower. When the absolute value of the difference in SP value is 1.0 or lower, delamination is difficult to occur. Thermoplastic Resin X and Thermoplastic Resin Y are more preferably a combination having the same basic skeleton. The basic skeleton referred to this disclosure is a repeating unit included in the resin. When polyethylene terephthalate is used as Thermoplastic Resin X, for example, Thermoplastic Resin Y preferably contains ethylene terephthalate, which has the same basic skeleton as polyethylene terephthalate in view of easily achieving accurate laminate structures of Thermoplastic Resin Y. When Thermoplastic Resin X and Thermoplastic Resin Y are resins having the same basic skeleton, lamination accuracy is high, and besides delamination at a lamination interface is difficult to occur.

A solubility parameter (the SP value) is a value calculated from the type and ratio of monomers contained in a resin using the Fedors' estimation method generally used and described in Poly. Eng. Sci., vol. 14, No. 2, pp. 147-154 (1974) and the like. For a mixture of a plurality of types of resins, calculation can be performed by a similar method. The SP values of polymethyl methacrylate, the SP value of polyethylene terephthalate (PET), and the SP value of a bisphenol A-based epoxy resin can be calculated to be 9.5 $(cal/cm^3)^{0.5}$, 10.7 $(cal/cm^3)^{0.5}$, and 10.9 $(cal/cm^3)^{0.5}$, respectively, for example.

In the laminated film included in the laminated member and the light source unit of the present invention, a preferred combination of Thermoplastic Resin X and Thermoplastic Resin Y is a combination of thermoplastic resins in which a difference in glass transition temperature between the thermoplastic resins is 20° C. or smaller. When the difference in glass transition temperature exceeds 20° C., thickness uniformity when the laminated film is formed is faulty, which causes unevenness in luminance and color tone or air bubbles or wrinkles when being laminated with the color conversion film. Also preferred is that Thermoplastic Resin X is crystalline, whereas Thermoplastic Resin Y is amorphous and that the glass transition temperature of Thermoplastic Resin X is lower than the glass transition temperature of s Thermoplastic Resin Y. In this case, when stretching is performed at a stretch temperature appropriate for orienting and crystallizing the crystalline resin in the laminated film, the orientation of the amorphous resin can be reduced compared with that of the crystalline resin, whereby the difference in refractive index can be easily provided. The crystalline resin referred to this disclosure specifically indicates a resin having an enthalpy of fusion (ΔHm) of 15 J/g or larger determined from the peak area of a fusion peak in a 2nd RUN differential scanning calorimetry chart obtained by performing differential scanning calorimetry (hereinafter, may be referred to as DSC) in conformity with JIS K7122 (1999) and heating (1st RUN) the resin at a temperature rising rate of 20° C./minute from 25° C. to 300° C., holding the resin at that state for 5 minutes, rapidly cooling the resin so as to be a temperature of 25° C. or lower, and then again raising the temperature of the resin at a temperature rising rate of 20° C./minute from 25° C. to 300° C. The amorphous resin indicates a resin having an enthalpy of fusion (ΔHm) determined on the same conditions as the above of 5 J/g or smaller.

As an example of the combination of the thermoplastic resins for satisfying the above condition, in the laminated film included in the laminated member and the light source unit of the present invention, preferred is that Thermoplastic Resin X contains polyethylene terephthalate or polyethylene naphthalate, whereas Thermoplastic Resin Y is a polyester containing a spiroglycol-originated polyester. The spiroglycol-originated polyester refers to a polyester with spiroglycol used as a diol component, the polyester being a copolymer with another ester structural unit, being a polyester with spiroglycol used as a single diol component, or being a polyester obtained by blending those with another polyester resin in which the number of spiroglycol residues preferably occupies half or more of the number of all the diol residues in the polyester resin. The spiroglycol-originated polyester has a small difference in glass transition temperature from polyethylene terephthalate and polyethylene naphthalate, whereby over-stretching is difficult to occur during film formation, and besides delamination is also difficult to occur, which is preferred. More preferred is that Thermoplastic Resin X contains polyethylene terephthalate or polyethylene naphthalate, whereas Thermoplastic Resin Y is a polyester with spiroglycol and cyclohexane dicarboxylic acid used. Being the polyester obtained using spiroglycol and cyclohexane dicarboxylic acid increases a difference in in-plane refractive index from polyethylene terephthalate and polyethylene naphthalate, whereby a high reflectance is easily obtained. Being the polyester obtained using spiroglycol and cyclohexane dicarboxylic acid has a small difference in glass transition temperature from polyethylene terephthalate and polyethylene naphthalate and is excellent in adhesiveness, whereby over-stretching is difficult to occur during film formation, and besides delamination is also difficult to occur.

In the laminated film included in the laminated member and the light source unit of the present invention, also preferred is that Thermoplastic Resin X contains polyethylene terephthalate or polyethylene naphthalate, whereas Thermoplastic Resin Y is a cyclohexane dimethanol-originated polyester. The cyclohexane dimethanol-originated polyester refers to a polyester with cyclohexane dimethanol as a diol component, the polyester being a copolymer with another ester structural unit, being a polyester with cyclohexane dimethanol used as a single diol component, or being a polyester obtained by blending those with another polyester resin in which the number of cyclohexane dimethanol residues preferably occupies half or more of the number of all the diol residues in the polyester resin. The cyclohexane dimethanol-originated polyester has a small difference in glass transition temperature from polyethylene terephthalate and polyethylene naphthalate, whereby over-stretching is difficult to occur during formation, and besides delamination is also difficult to occur, which is preferred. More preferred is that at least one thermoplastic resin is an ethylene-terephthalate polycondensate with a copolymerized amount of cyclohexanedimethanol of 15 mol % or more and 60 mol % or less. Thus, in particular, changes in optical characteristics caused by heating and with the lapse of time are small, and delamination is difficult to occur, while having a high reflectance. The ethylene-terephthalate polycondensate with a copolymerized amount of cyclohexanedimethanol of 15 mol % or more and 60 mol % or less adheres to polyethylene terephthalate extremely strongly. Cyclohexane dimethanol group thereof has the cis form or the trans form as geometrical isomers and also has the chair form or the boat form as conformational isomers, whereby the ethylene-terephthalate polycondensate is difficult to cause oriented crystallization even when it is co-stretched with polyethylene terephthalate, is high in reflectance, involves smaller changes in optical characteristics by heat history, and is difficult to cause breakage during film formation.

Method for Manufacturing Color Conversion Composition

The following describes an example of a method for manufacturing a color conversion composition as a raw material of the color conversion film for use in the present invention. In this method of manufacture, the organic luminous material, the binder resin, the solvent, and the like are mixed in certain amounts. The above components are mixed to give a certain composition and are then uniformly mixed and dispersed by a stirring and kneading machine such as a homogenizer, a rotary and revolutionary stirrer, three rollers, a ball mill, a planetary ball mill, or a beads mill to obtain the organic luminous material. After mixing and dispersing or during mixing and dispersing, deaeration is suitably performed in a vacuum or a reduced pressure condition. A specific component may be mixed in advance or subjected to treatment such as aging. The solvent can be removed by an evaporator to give a desired solid concentration.

The solvent for use in the color conversion composition is not limited to a particular solvent so long as it can adjust the viscosity of the resin in a fluid state and does not have an excessive influence on the emission and the durability of the luminous material. Examples thereof include water, 2-propanol, ethanol, toluene, methyl ethyl ketone, methyl isobutyl ketone, cyclohexanone, hexane, acetone, terpineol, texanol, methylcellosolve, butyl carbitol, butyl carbitol acetate, and propylene glycol monomethyl ether acetate; two or more of these solvents can be used in a mixed manner.

Method for Manufacturing Color Conversion Film

Figure 6:
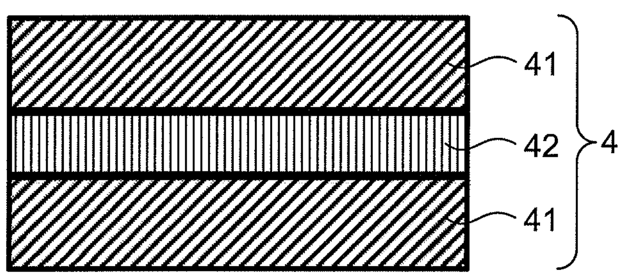
FIG. 6 is a schematic sectional view of an example of a color conversion film.
Figure 7:
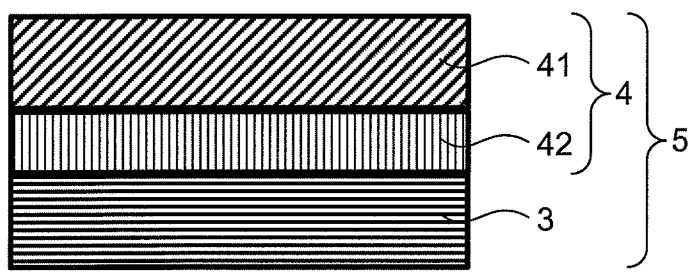
FIG. 7 is a schematic sectional view of an example of the laminated member according to the embodiment of the present invention.
Figure 8:
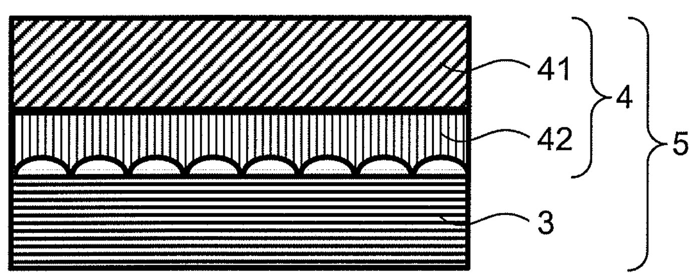
FIG. 8 is a schematic sectional view of an example of the laminated member according to the embodiment of the present invention.
Figure 9:
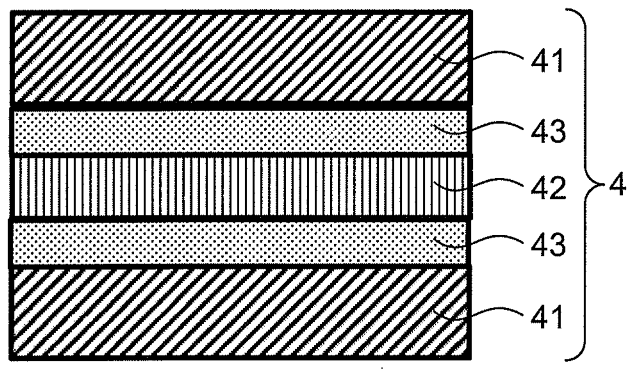
FIG. 9 is a schematic sectional view of an example of the laminated member according to the embodiment of the present invention.

In the present invention, the color conversion film has no limitation in its configuration so long as it includes the organic luminous material or its cured body layer (that is, a cured body layer of the color conversion composition). FIG. 6 to FIG. 9 illustrate examples thereof. FIG. 6 is a schematic sectional view of an example of the color conversion film 4, and FIG. 7, FIG. 8, and FIG. 9 are each a schematic sectional view of an example of the laminated member 5 according to the embodiment. The reference numerals 41, 42, and 43 illustrated in FIG. 6 to FIG. 9 are a base layer, a layer formed of the organic luminous material of the color conversion film (hereinafter, may also be referred to as a color conversion layer), and a barrier film, respectively.

Base Layer

Examples of the base layer include, without any particular limitation, known metals, films, glass, ceramic, and paper. Specific examples of the base layer include metal plates or foils of aluminum (including aluminum alloys), zinc, copper, iron, and the like; plastic films of cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefins, thermoplastic fluorine resins, copolymers of tetrafluoroethylene and ethylene (ETFE), and the like; plastic films formed of an α-polyolefin resin, a polycaprolactone resin, an acrylic resin, a silicone resin, and copolymer resins of these resins and ethylene; paper laminated with the plastic films; paper coated with the plastic films; paper laminated with or deposited with the metals; and plastic films laminated with or deposited with the metals. When the base layer is a metal plate, its surface may be subjected to plating treatment or ceramic treatment such as a chromium-based one or a nickel-based one.

Among these materials, glass and resin films are preferably used in view of the easiness of manufacture of the color conversion film and the easiness of formation of the color conversion film. Films with high strength are preferred so as to exclude the risk of breakage or the like when the film-shaped base layer is handled. In view of those required characteristics and economy, resin films are preferred, and among these, plastic films selected from the group consisting of PET, polyphenylene sulfide, polycarbonate, and polypropylene are preferred in view of economy and handleability. When the color conversion film is dried or when the color conversion film is press-formed at a high temperature of 200° C. or higher by an extruder, a polyimide film is preferred in view of heat resistance. In view of the easiness of delamination of the film, the base layer may be subjected to mold releasing treatment on its surface in advance.

The thickness of the base layer is not limited to a particular thickness; the lower limit thereof is preferably 25 μm or thicker and more preferably 38 μm or thicker. The upper limit thereof is preferably 5,000 μm or thinner and more preferably 3,000 μm or thinner.

As a preferred form of the present invention, a laminated film comprising a constitution in which 11 or more layers of different thermoplastic resins are alternately laminated with each other is also preferably used as the base. This effect is as described above. The surface of the base is also preferably given an uneven shape. The method for forming the shape is similar to that for a laminated film described below.

Color Conversion Layer

The following describes an example of a method for manufacturing a layer (hereinafter, also referred to as a color conversion layer) formed of the organic luminous material of the color conversion film for use in the present invention. In this method for manufacturing the color conversion layer, the color conversion layer manufactured by the method described above is applied to a foundation such as a base layer or a barrier film and is dried. The color conversion layer is thus manufactured. The application can be performed by a reverse roll coater, a blade coater, a slit die coater, a direct gravure coater, an offset gravure coater, a kiss coater, a natural roll coater, an air knife coater, a roll blade coater, a vari-bar roll blade coater, a two-stream coater, a rod coater, a wire bar coater, an applicator, a dip coater, a curtain coater, a spin coater, a knife coater, or the like. To obtain the film thickness uniformity of the color conversion layer, the application is preferably performed by a slit die coater.

The drying of the color conversion layer can be performed using a general heating apparatus such as a hot-air drier or an infrared drier. For the heating of the color conversion film, a general heating apparatus such as a hot-air drier or an infrared drier can be used. In this case, the beating conditions include normally 1 minute to 5 hours at 40° C. to 250° C. and preferably 2 minutes to 4 hours at 60° C. to 200° C. Stepwise heating and curing such as step cure is also applicable.

After manufacturing the color conversion layer, the base layer can be changed as needed. In this case, examples of simple methods therefor include, but are not limited to, a method that performs re-lamination using a hot plate and a method using a vacuum laminator or a dry film laminator.

Also preferred is taking the form of the color conversion layer of two or more layers including Layer (A) containing Organic Luminous Material (a) and Layer (B) containing Organic Luminous Material (b). This is because Organic Luminous Materials (a) and (b) are contained in the different layers, whereby inter-material interaction is reduced, and emission with higher color purity than they are dispersed in the same layer is exhibited. The inter-material interaction is reduced, whereby Organic Luminous Materials (a) and (b) emit light independently in the individual layers, and red and green emission peak wavelengths and emission intensity can be easily adjusted.

Barrier Film

The barrier film is used as appropriate, for example, when gas barrier property has to be improved for the color conversion layer and the like. Examples of this barrier film include metal oxide thin films and metal thin nitride films formed of inorganic oxides such as silicon oxide, aluminum oxide, titanium oxide, tantalum oxide, zinc oxide, tin oxide, indium oxide, yttrium oxide, and magnesium oxide; inorganic nitrides such as silicon nitride, aluminum nitride, titanium nitride, and silicon carbonitride; mixtures thereof; and mixtures obtained by adding other elements to these materials and films formed of various kinds of resins such as a polyvinyl chloride-based resin, an acrylic resin, a silicone-based resin, a melamine-based resin, an urethane-based resin, a fluorine-based resin, and a polyvinyl alcohol-based resin such as a saponified product of vinyl acetate.

Examples of the barrier resin preferably used in the present invention include resins such as polyester, polyvinyl chloride, nylon, polyvinyl fluoride, polyvinylidene chloride, polyacrylonitrile, polyvinyl alcohol, ethylene vinyl alcohol copolymer, and mixtures of these resins. Among them, polyvinylidene chloride, polyacrylonitrile, ethylene vinyl alcohol copolymer, and polyvinyl alcohol are extremely low in an oxygen permeability coefficient, and these resins are preferably contained. In view of resistance to discoloration, further preferred is containing polyvinylidene chloride, polyvinyl alcohol, or ethylene vinyl alcohol copolymer, and in view of the smallness of environmental burden, particularly preferred is containing polyvinyl alcohol or ethylene vinyl alcohol copolymer.

These resins may be used singly or used in a mixed manner with different resins; in view of film uniformity and costs, the film is more preferably formed of a single resin.

As polyvinyl alcohol, a saponified product of polyvinyl acetate with the acetyl group saponified in an amount of 98 mol % or more can be used, for example. As ethylene vinyl alcohol copolymer, a saponified product of ethylene vinyl alcohol copolymer with an ethylene content of 20% to 50% with the acetyl group saponified in an amount of 98 mol % or more can be used, for example.

In addition, commercially available resins and films are also applicable. Specific examples thereof include polyvinyl alcohol resin PVA117 manufactured by Kuraray Co., Ltd. and ethylene-vinyl alcohol copolymer ("EVAL" (registered trademark)) resin L171B, F171B, and film EF-XL manufactured by Kuraray Co., Ltd.

To the barrier film, antioxidants, curing agents, cross-linking agents, processing and thermal stabilizers, light resistance stabilizers such as ultraviolet light absorbents, or the like may be added as needed to the extent that they do not have an excessive influence on the emission and the durability of the color conversion layer.

The thickness of the barrier film, which is not limited to a particular thickness, is preferably 100 μm or thinner in view of the flexibility of the entire color conversion film and costs. The thickness is more preferably 50 μm or thinner and further preferably 20 μm or thinner. The thickness is particularly preferably 10 μm or thinner and may be 1 μm or thinner. In view of the easiness of film formation, the thickness is preferably 0.01 μm or thicker.

The barrier film may be provided on both sides of the color conversion layer or provided only on one side thereof.

Also preferred is imparting an uneven shape to the surface of the barrier film. The method for forming the shape is similar to that for the laminated film described below.

In accordance with required functions of the color conversion film, an auxiliary layer may be further provided having a reflection prevention function, an antiglare function, a reflection prevention antiglare function, a hard coat function (an abrasion resistance function), an antistatic function, a soil-resistance function, an electromagnetic wave shielding function, an infrared cutting function, an ultraviolet cutting function, a polarization function, or a toning function.

Adhesive Layer

In the color conversion film of the present invention, an adhesive layer may be provided between the layers as needed.

As the adhesive layer, known materials can be used without any particular limitation so long as it does not have an excessive influence on the emission and the durability of the color conversion film. When strong adhesion is required, preferably used are photocurable materials, thermocurable materials, anaerobic curable materials, and thermoplastic materials; among them, thermoplastic materials are more preferred, and materials curable at 0° C. to 150° C. are particularly preferred.

The thickness of the adhesive layer, which is not limited to a particular thickness, is preferably $0.01_{R}$m to 100 μm and more preferably 0.01 μm to 25 μm. The thickness is further preferably 0.05 μm to 5 μm and particularly preferably 0.05 μm to 1 μm.

Lamination with Laminated Film

In the laminated member of the present invention, also preferred is that the color conversion film and the laminated film separately formed are laminated on each other via an adhesive layer. Preferred forms of the adhesive layer are similar to those described above.

Method for Manufacturing Laminated Film

The following describes a preferred method for manufacturing the laminated film included in the laminated member and the light source unit according to the embodiment of the present invention with a laminated film including Thermoplastic Resins X and Y taken as an example. It is understood that the present, invention is not interpreted as limited to the example. The lamination structure of the laminated film for use in the present invention can be simply achieved by a method similar to that described in Paragraphs [0053] to [0063] of Japanese Patent Application Laid-open No. 2007-307893.

Thermoplastic Resins X and Y are prepared in the form of pellet or the like. The pellets are dried in hot air or in a vacuum as needed and are then supplied to separate extruders. When the laminated film contains an ultraviolet light absorbent, pellets with Thermoplastic Resins X and Y kneaded with the ultraviolet light absorbent in advance are prepared, or Thermoplastic Resins X and Y and the ultraviolet light absorbent are kneaded with each other in the extruders. For the resins heated and melted up to the melting point or higher in the extruders, a resin extruding amount is unified by a gear pump or the like, and a foreign matter, a modified resin, and the like are removed therefrom by a filter or the like. These resins are formed into a target shape by a die and are then discharged. A sheet laminated in a multilayer manner discharged from the die is extruded onto a cooling body such as a casting drum and is cooled and solidified to obtain a casting film. In this process, the sheet is preferably brought into intimate contact with the cooling body such as the casting drum to be rapidly cooled and solidified through an electrostatic force using an electrode with a wire shape, a tape shape, a needle shape, a knife shape, or the like. Also preferred is that air is blown from an apparatus with a slit shape, a spot shape, or a planar shape to bring the sheet into intimate contact with the cooling body such as the casting drum to be rapidly cooled and solidified or that the sheet is brought into intimate contact with the cooling body by a nip roll or the like to be rapidly cooled and solidified.

A plurality of resins including the thermoplastic resin for use in Layer X and Thermoplastic Resin Y different therefrom are sent out from different channels using two or more extruders to be fed into a multilayer laminating apparatus. Examples of the multilayer laminating apparatus include a multi-manifold die, a feedblock, and a static mixer. To efficiently obtain the configuration of the present invention in particular, a feedblock having 51 or more fine slits is preferably used. When such a feedblock is used, the apparatus is not extremely upsized, and only a small amount of foreign matter caused by thermal degradation occurs, and even when the number of layers is extremely large, high-precision lamination is enabled. Lamination accuracy in the width direction also improves markedly compared with conventional techniques. In this apparatus, the thicknesses of the individual layers can be adjusted by the shape (the length and the width) of the slit, whereby any desired layer thickness can be achieved.

A melted multilayer laminate thus formed in a desired layer structure is guided to the die to obtain a casting film similarly to the above.

The thus obtained casting film is preferably biaxially stretched. The biaxial stretching refers to being stretched in a longitudinal direction and a width direction. The stretching may be performed in the two directions successively or performed in the two directions simultaneously. In addition, re-stretching may be performed in the longitudinal direction and/or the width direction.

The following first describes the successive biaxial stretching. The stretching in the longitudinal direction refers to stretching for imparting longitudinal molecular orientation to the film and is normally performed by a peripheral speed difference between rolls; this stretching may be performed in one step or performed in multiple steps using a plurality of roll pairs. A stretch ratio, which varies depending on the type of the resin, is normally preferably 2 to 15 and particularly preferably 2 to 7 when polyethylene terephthalate is used for any of the resins included in the laminated film. A stretch temperature is preferably from the glass transition temperature of the resin included in the laminated film to the glass transition temperature +100° C.

After subjecting the thus obtained monoaxially stretched film to surface treatment such as corona treatment, flame treatment, or plasma treatment as needed, functions such as slipperiness, easy adhesiveness, and antistatic properties may be imparted thereto by in-line coating. When the laminated member including the laminated film and the color conversion film is formed in particular, a resin having a refractive index that is lower than that of Thermoplastic Resin X as the outermost layer of the laminated film and is higher than the refractive index of the film as the outermost layer of the color conversion film is preferably applied by in-line coating.

Next, the stretching in the width direction refers to stretching for imparting orientation in the width direction to the film; the film is normally conveyed with its both ends gripped with clips using a tenter to be stretched in the width direction. A stretch ratio, which varies depending on the type of the resin, is normally preferably 2 to 15 and particularly preferably 2 to 7 when polyethylene terephthalate is used for any of the resins included in the laminated film. A stretch temperature is preferably from the glass transition temperature of the resin included in the laminated film to the glass transition temperature +120° C.

The thus biaxially stretched film is preferably subjected to heat treatment at the stretch temperature or higher and the melting point or lower within the tenter in order to impart planarity and dimension stability thereto. By performing the heat treatment, the dimension stability of a film for forming increases. After being thus subjected to the heat treatment, the biaxially stretched film is uniformly slowly cooled and is cooled to room temperature to be wound. Relaxation treatment or the like may be employed in combination during the heat treatment and the slow cooling as needed.

The following describes the simultaneous biaxial stretching. In the case of the simultaneous biaxial stretching, after subjecting the obtained cast film to surface treatment such as corona treatment, flame treatment, or plasma treatment as needed, functions such as slipperiness, easy adhesiveness, and antistatic properties may be imparted thereto by in-line coating.

Next, the cast film is guided to a simultaneous biaxial tenter, is conveyed with both ends of the film gripped with clips, and is stretched in the longitudinal direction and the width direction simultaneously and/or stepwise. Examples of a simultaneous biaxial stretcher include a pantograph system, a screw system, a drive motor system, and a linear motor system. Preferred are the drive motor system and the linear motor system, which can freely change the stretch ratio and can perform relaxation treatment at any place. A stretch ratio, which varies depending on the type of the resin, is normally 6 to 50 in terms of areal ratio and particularly preferably 8 to 30 in terms of areal ratio when polyethylene terephthalate is used for any of the resins included in the laminated film. In the case of the simultaneous biaxial stretching in particular, preferred is that the stretch ratios in the longitudinal direction and the width direction are made the same and that stretch speeds are also made substantially equal in order to reduce an in-plane orientation difference. A stretch temperature is preferably from the glass transition temperature of the resin included in the laminated film to the glass transition temperature +120° C.

The thus biaxially stretched film is preferably subsequently subjected to heat treatment at the stretch temperature or higher and the melting point or lower within the tenter in order to impart planarity and dimension stability thereto. During this heat treatment, relaxation treatment is preferably performed in the longitudinal direction in a moment immediately before and/or immediately after the biaxially stretched film enters a heat treatment zone in order to reduce the distribution of a primary orientation axis in the width direction. After being thus subjected to the heat treatment, the biaxially stretched film is uniformly slowly cooled and is cooled to room temperature to be wound. Relaxation treatment or the like may be used in combination in the longitudinal direction and/or the width direction during the heat treatment and the slow cooling. Relaxation treatment is performed in the longitudinal direction in a moment immediately before and/or immediately after the biaxially stretched film enters the heat treatment zone.

Also preferred is that an uneven shape is formed on the surface of the obtained laminated film as described below. Examples of a method for forming the uneven shape include (a) a method of mold transfer using a mold and (b) a method that directly processes the surface of the base. Specific examples of (a) the method of mold transfer include (a1) a method that presses and crimps the mold while heating the mold and/or base to give form, (a2) a method that laminates a photo- or thermo-setting resin on the surface of the base, presses the mold to the surface, and cures the resin by the irradiation with active energy rays or by heating to give form, and (a3) a method that transfers a resin filled in the recesses of the mold to the base.

Examples of (b) the method that directly processes the surface of the base include (b1) a method that preforms cutting to a desired shape using a grinding tool or the like mechanically, (b2) a method that performs removal using sand blasting, (b3) a method that performs removal by a laser, and (b4) a method that laminates a photocurable resin on the surface of the base and processes the surface of the base to a desired shape using a technique such as lithography or light interference exposure.

Among these methods, a more preferred method of manufacture is (a) the method of mold transfer in view of productivity; these processes can be combined, and the processes can be selected as appropriate, whereby the laminated film with a desired uneven shape can be obtained.

Light Diffusion Film

In the light source unit of the present invention, a light diffusion film is preferably laminated on either one side or both sides of the color conversion film. This is because the light diffusion film has an effect of reducing unevenness in the light from the light source and uniformly diffusing light, exhibits an effect of condensation of light similarly to a prism sheet described below, and contributes to improvement in luminance in the front direction. The light diffusion film also has an effect of adjusting the ratio between emission from the light source and emission from the organic luminous material to be an optimum state by reducing the directivity of the emission from the light source and making the emission from the organic luminous material easy to be extracted out of the color conversion film.

The light diffusion film is classified into an upper diffusion film arranged on the upper side of the prism sheet for the purpose of preventing moire and reducing luster and a lower diffusion film that is high in transparency and is arranged on the lower side of the prism sheet. Although only the lower diffusion film is generally used for display and lighting use, the upper diffusion film may be combined therewith in accordance with a purpose.

Examples of the light diffusion film include Light-Up and Chemical Matte (manufactured by Kimoto Co., Ltd.), Opalus (manufactured by KEIWA Incorporated), D series (manufactured by Tsujiden Co., Ltd.), and CH/JS (manufactured by SKC Haas Display Films).

Prism Sheet

The light source unit of the present invention preferably provides a prism sheet on or over a light exit face of the color conversion film. This is because light applied from the light source is converged, thereby improving the luminance in the front direction and unifying the brightness of the backlight. The light exit face referred to this disclosure indicates a display face side for display use and a light-emitting face side for lighting use.

The prism sheet generally has a structure in which a prism pattern having an isosceles triangular shape with an apex angle of 90° or a micro-lenticular shape is formed on an optical transparent PET film. Although the use number of the prism sheet is not limited to a particular number so long as it is one or more, two orthogonally placed prism sheets are preferably used in order to further improve the front luminance. The prism sheet is used in combination with the light diffusion film, whereby the effect of improving the front luminance is more markedly exhibited.

Examples of the prism sheet include BEF series (manufactured by 3M), DIAART (manufactured by Mitsubishi Rayon Co., Ltd.), and GTL5000/GTL6000 series (manufactured by Goyo Paper Working Co., Ltd.).

Light Source

The type of the light source can be any light source as long as it exhibits emission in a wavelength range that can be absorbed by a luminous substance mixed with the compound represented by General Formula (1) and the like. Although any light source can be used in principle such as fluorescent light sources such as a hot cathode tube, a cold cathode tube, and inorganic EL, organic electroluminescent element light sources, LEDs, white light sources, and sunlight, LEDs in particular are preferable light sources, and blue LEDs having light sources in the range of 400 nm or longer and 500 nm or shorter are more preferred light sources in view of the capability of increasing the color purity of blue light in display and lighting use.

Although the light source may have one kind of emission peak or two or more kinds of emission peaks, one having one kind of emission peak is preferred in order to increase color purity. A plurality of light sources having different kinds of emission peaks can be freely combined to be used.

To further increase the color purity of blue light, its peak emission wavelength is within the range of 430 nm or longer and 470 nm or shorter, more preferably 450 nm or longer and 470 nm or shorter and further preferably 455 nm or longer and 465 nm or shorter, and to satisfy luminance of the package, the emission wavelength range is required to be within the range of 400 nm or longer and 500 nm or shorter and to satisfy Numerical Formula (7) and more preferably Numerical Formula (8):

$$1>\beta/\alpha\geq 0.15 \quad (7)$$

$$0.9>\beta/\alpha\geq 0.25 \quad (8)$$

The symbol $\alpha$ is emission intensity at the peak emission wavelength, whereas $\rho$ is emission intensity at a wavelength of the peak emission wavelength +15 nm. By setting the peak emission wavelength of the blue LED to these ranges, luminance can be increased using an effect of relative luminosity while improving color reproducibility.

In order for the blue LED to increase luminance using the effect of relative luminosity while retaining the color purity of blue, a value obtained by dividing the emission intensity at the peak emission wavelength by the emission intensity at a wavelength on the longer wavelength side of the peak emission wavelength by 15 nm is 0.15 or higher and preferably 0.25 or higher.

The emission of an LED is emission by pn-junctioned semiconductors, and its emission spectrum takes a waveform of being concave downward. Consequently, when the emission intensity at the peak emission wavelength is divided by the emission intensity at the wavelength on the longer wavelength side of the peak emission wavelength by 15 nm, the quotient is smaller than 1 and preferably less than 0.9. When the value obtained by dividing the emission intensity at the peak emission wavelength by the emission intensity at the wavelength on the longer wavelength side of the peak emission wavelength by 15 nm is less than 0.15, the shape of the emission spectrum indicates a sharp shape with short feet.

Light Source Unit

The light source unit according to the embodiment of the present invention includes at least the light source, the color conversion film, and the laminated film. A method of arranging the light source and the color conversion is not limited to particular arrangement; the light source and the color conversion film may be in intimate contact with each other, or the light source and the color conversion film may be separated from each other or have the remote phosphor system. The light source unit may include a laminate including the color conversion film and the laminated film. To increase color purity, the light source unit may further include a color filter.

In addition, a light-guiding plate, a diffusion plate, and optical films such as a polarization reflective film are preferably inserted to the light source unit according to the embodiment of the present invention.

The light source unit in the present invention can be used for displays, lighting, interiors, signs, signboards, and the like and are particularly suitably used for displays and lighting.

Display and Lighting Apparatus

The display according to the embodiment of the present invention includes at least the light source unit including the light source and the color conversion film as described above. The display such as a liquid crystal display uses the light source unit as a backlight, for example. The lighting apparatus according to the embodiment of the present invention includes at least the light source unit including the light source and the color conversion film as described above. This lighting apparatus is configured to emit white light by combining a blue LED as the light source unit and the color conversion film or the color conversion composition that converts blue light from this blue LED into light with a longer wavelength, for example.

EXAMPLES

The following describes the present invention with reference to examples; the present invention is not limited by the following examples.

In the following examples and comparative examples, Compounds G-1, G-2, G-3, R-1, and R-2 are compounds described below:

G-1

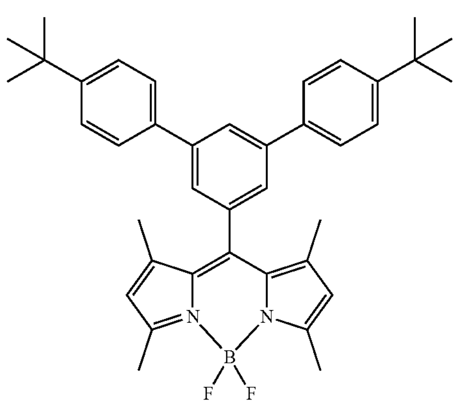

-continued

G-2

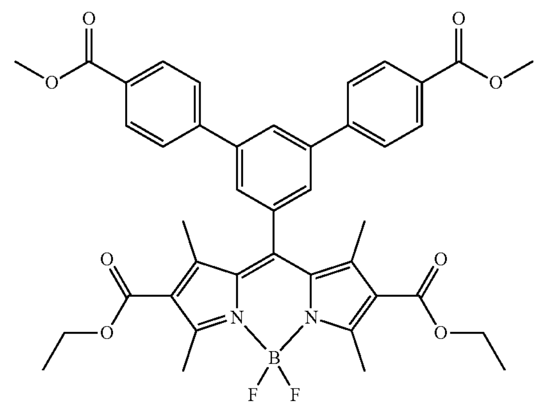

G-3

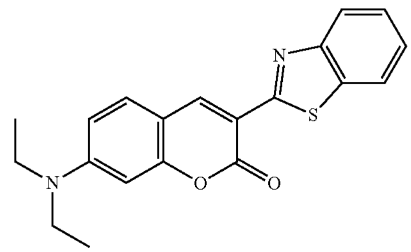

R-1

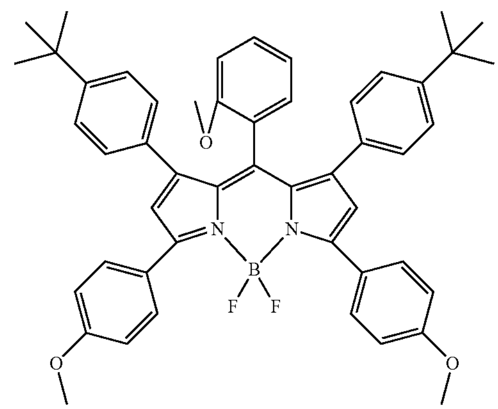

R-2

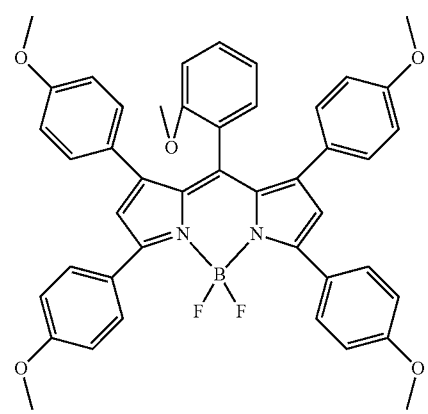

Methods of evaluation on structural analysis in the examples and the comparative examples are as follows:

Measurement of $^{1}$H-NMR

The measurement of $^{1}$H-NMR of the compounds was performed with a deuteriochloroform solution using a superconducting FTNMR EX-270 (manufactured by JEOL Ltd.).

Measurement of Absorption Spectra

The absorption spectra of the compounds were measured by dissolving the compounds in toluene with a concentration of $1\times10^{-6}$ mol/L using Model U-3200 Spectrophotometer (manufactured by Hitachi, Ltd.).

Measurement of Fluorescence Spectra

As the fluorescence spectra of the compounds, fluorescence spectra when the compounds were dissolving in toluene with a concentration of $1\times10^{-6}$ mol/L and were excited at a wavelength of 460 nm were measured using Model F-2500 Fluorescence Spectrophotometer (manufactured by Hitachi, Ltd.).

Number of Layers

The layer configuration of the film was determined by observing a sample obtained by cutting a section using a microtome using a transmission electron microscope (TEM). In other words, using a transmission electron microscope Model H-7100FA (manufactured by Hitachi, Ltd.), a sectional picture of the film was taken with an acceleration voltage of 75 kV, and the layer configuration was observed.

Measurement of Reflectance of Laminated Film

To a spectrophotometer (U-4100 Spectrophotometer) manufactured by Hitachi, Ltd., an angle-variable transmission attachment included therewith was attached, and an absolute reflectance in the wavelength range of 250 nm or longer and 800 nm or shorter at an incident angles $\phi$ of 10° and 60° was measured. As measurement conditions, the slit was 2 nm (for visible)/automatic control (for infrared), the gain was set to 2, and the scanning speed was set to 600 nm/minute. A sample was cut out of the central part in the width direction of the film by 5 cm×10 cm to be measured.

Measurement of Emission Intensity of Light Source

An optical fiber with an NA of 0.22 was attached to a mini-spectrometer (C10083MMD) manufactured by Hamamatsu Photonics K.K., and the light of the light source was measured.

Luminance Measurement

As a light source unit including a light source to be evaluated, the backlight of Kindle Fire HDX 7 was used. The peak wavelength in the emission of this backlight was 446 nm. Using this light source unit, luminance when being made into a light diffusion plate, a laminated film, a color conversion film (that may be a laminated member including a laminated film and a color conversion film), a prism sheet, and a polarization reflective film was measured using a spectral radiance meter manufactured by Konica Minolta Sensing, Inc. Table 2 lists relative luminance when the luminance in Comparative Example 1 was 100, and Table 3 lists relative luminance when the luminance in Comparative Example 3 was 100. Each relative luminance in Examples 26 to 33 is a value for which the luminance measurement was performed by the present method of measurement and compared with the Example 22.

Calculation of Color Gamut

From emission spectral data obtained in the luminance measurement and the spectral data of the transmittance of a color filter, a color gamut in the (u', v') color space when color purity was improved by the color filter was calculated. The area of the calculated color gamut in the (u', v') color space was evaluated by a proportion when the color gamut area of the BT. 2020 standards was set at 100%. When this proportion is higher, color reproducibility is more favorable.

Radical Measurement on Color Conversion Film

For the measurement of radicals generated in the color conversion film during ultraviolet irradiation, an electron spin resonance apparatus JES-X3 (manufactured by JEOL Ltd.) was used. The illuminance at a wavelength of 365 nm of a super-high pressure mercury lamp USH-250D (manufactured by Ushio Lighting, Inc.) was set at 80 mW/cm$^2$. The super-high pressure mercury lamp, the laminated film, and the color conversion film were arranged in this order, and ultraviolet rays were then applied thereto at a temperature of liquid nitrogen for 10 minutes. The color conversion film was then put into the electron spin resonance apparatus adjusted at a temperature of 40 K, and a g value and the amount of radicals generated were measured.

The g value referred to this disclosure is a value peculiar to radical species and is determined by substituting a microwave frequency (v) and a resonance magnetic field (H) obtained by experiment into the following conditional expression:

$$g=(h\nu)/(\mu_B H)$$

where h is Planck's constant, and $\mu_B$ is Bohr magneton.

Light Resistance Test

As a light source unit including a light source to be evaluated, the light source unit and the liquid crystal display of KD-65X9500B manufactured by Sony Corporation were used. The emission band of the emission of this backlight is 430 nm or longer and 485 nm or shorter. This liquid crystal display was subjected to a test with the light source turned on in a 50° C. atmosphere for 1,000 hours, and color tone and luminance before and after the test were evaluated using a spectral radiance meter manufactured by Konica Minolta Sensing, Inc. The criteria are as follows:

A: Au'v' of smaller than 0.03 and a luminance change of smaller than 3% before and after the test B: Au'v' of smaller than 0.10 and a luminance change of smaller than 10% before and after the test C: Au'v' of 0.10 or larger and a luminance change of 10% or larger before and after the test

Synthesis Example 1

The following describes a method for synthesizing Compound G-1 in Synthesis Example 1 in the present invention. In the method for synthesizing Compound G-1, a flask was charged with 3,5-dibromobenzaldehyde (3.0 g), 4-t-butylphenylboric acid (5.3 g), tetrakis(triphenylphosphine)palladium(0) (0.4 g), and potassium carbonate (2.0 g) and was substituted with nitrogen. Degassed toluene (30 mL) and degassed water (10 mL) were added thereto, and the mixture was refluxed for 4 hours. This reaction solution was cooled to room temperature, and its organic phase was separated and was then washed with a saturated saline solution. This organic phase was dried with magnesium sulfate and was filtered, and the solvent was distilled off. The resultant reaction product was purified by silica gel chromatography to obtain 3,5-bis(4-t-butylphenyl)benzaldehyde (3.5 g) as a white solid.

Next, 3,5-bis(4-t-butylphenyl)benzaldehyde (1.5 g) and 2,4-dimethylpyrrole (0.7 g) were put into a reaction solution, and dehydrated dichloromethane (200 mL) and trifluoroacetic acid (one drop) were added thereto, and the reaction solution was stirred for 4 hours in a nitrogen atmosphere. Subsequently, a dehydrated dichloromethane solution of 2,3-dichloro-5,6-dicyano-1,4-benzoquinone (0.85 g) was added thereto, and the reaction solution was further stirred for 1 hour. After the end of reaction, boron trifluoride diethyl ether complex (7.0 mL) and diisopropylethylamine (7.0 mL) were added to the reactant, and the mixture was stirred for 4 hours. Water (100 mL) was further added thereto, the mixture was stirred, and the organic phase was separated. This organic phase was dried with magnesium sulfate and was filtered, and the solvent was distilled off. The resultant reaction product was purified by silica gel chromatography to obtain a compound (0.4 g) (yield: 18%). The $^{1}$H-NMR analysis result of this obtained compound was as follows, and this compound was identified as Compound G-1.

$^{1}$H-NMR ($CDCl_3$, ppm): 7.95 (s, 1H), 7.63-7.48 (m, 10H), 6.00 (s, 2H), 2.58 (s, 6H), 1.50 (s, 6H) and 1.37 (s, 18H).

Figure 11:
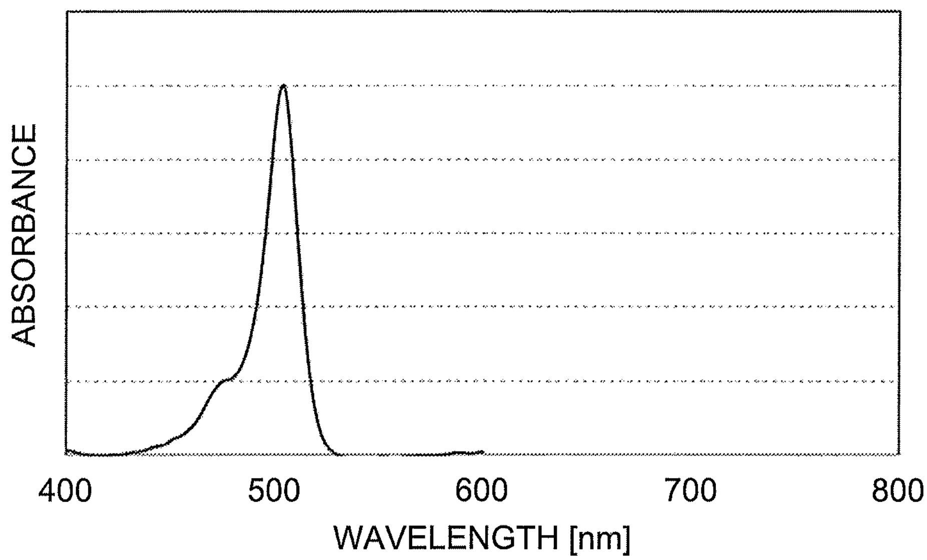
FIG. 11 is a diagram exemplifying an absorption spectrum of a compound of Synthesis Example 1 in examples of the present invention.
Figure 12:
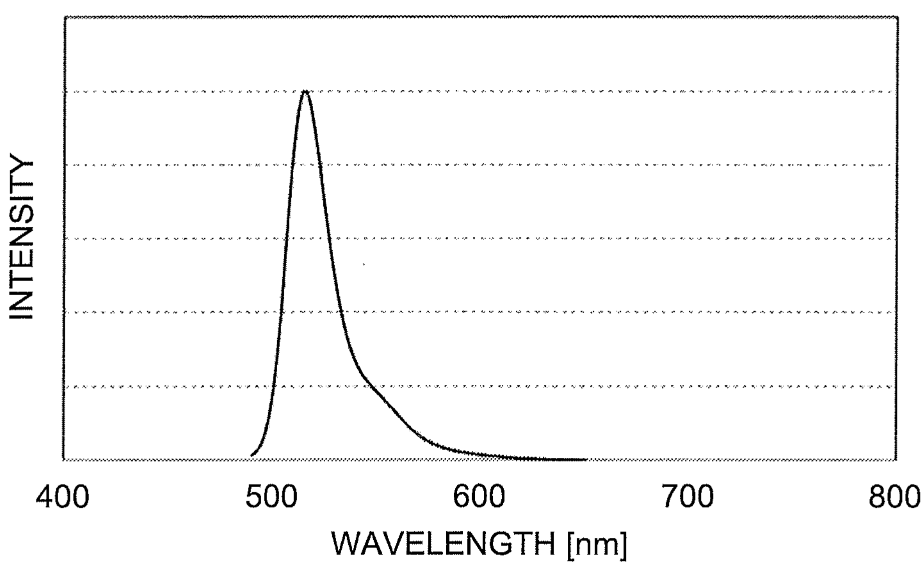
FIG. 12 is a diagram exemplifying an emission spectrum of the compound of Synthesis Example 1 in the examples of the present invention.

The absorption spectrum of this compound G-1 was as illustrated in FIG. 11, which exhibited light absorption characteristics against a blue light source (460 nm). The fluorescence spectrum of this compound G-1 was as illustrated in FIG. 12, which exhibited a sharp emission peak in the green range. A fluorescence quantum yield of 83% was exhibited, and this compound G-1 was a compound that enabled efficient color conversion.

Synthesis Example 2

The following describes a method for synthesizing Compound R-1 in Synthesis Example 2 in the present invention. In the method for synthesizing Compound R-1, a mixed solution of 4-(4-t-butylphenyl)-2-(4-methoxyphenyl)pyrrole (300 mg), 2-methoxybenzoyl chloride (201 mg), and toluene (10 mL) was heated at 120° C. for 6 hours in a nitrogen stream. This heated solution was cooled to room temperature, was evaporated, was subsequently washed with ethanol (20 ml), and was dried in a vacuum to obtain 2-(2-methoxybenzoyl)-3-(4-t-butylphenyl)-5-(4-methoxyphenyl)pyrrole (260 mg).

Next, a mixed solution of 2-(2-methoxybenzoyl)-3-(4-t-butylphenyl)-5-(4-methoxyphenyl)pyrrole (260 mg), 4-(4-t-butylphenyl)-2-(4-methoxyphenyl)pyrrole (180 mg), methanesulfonic acid anhydride (206 mg), and degassed toluene (10 mL) was heated at 125° C. for 7 hours in a nitrogen stream. This heated solution was cooled to room temperature, water (20 mL) was injected thereto, and the organic phase was extracted with dichloromethane (30 mL). This organic phased was washed with water (20 mL) twice, was evaporated, and was dried in a vacuum to obtain a pyrromethene body.

Next, diisopropylethylamine (305 mg) and boron trifluoride diethyl ether complex (670 mg) were added to a mixed solution of the obtained pyrromethene body and toluene (10 mL) in a nitrogen stream, and the mixture was stirred at room temperature for 3 hours. Water (20 mL) was then injected thereto, and the organic phase was extracted with dichloromethane (30 mL). This organic phase was washed with water (20 mL) twice, was dried with magnesium sulfate, was evaporated, was purified by silica gel chromatography, and was dried in a vacuum to obtain reddish violet powder (0.27 g). The $^{1}$H-NMR analysis result of the obtained reddish violet powder was as follows, and the reddish violet powder obtained as described above was identified as Compound R-1.

$^{1}$H-NMR ($CDCl_3$, ppm): 1.19 (s, 18H), 3.42 (s, 3H), 3.85 (s, 6H), 5.72 (d, 1H), 6.20 (t, 1H), 6.42-6.97 (m, 16H), and 7.89 (d, 4H).

Figure 13:
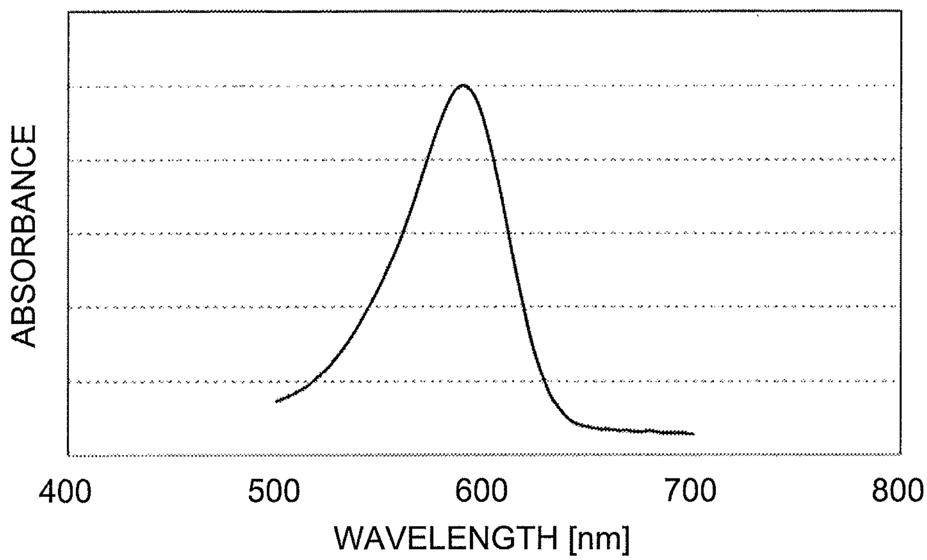
FIG. 13 is a diagram exemplifying an absorption spectrum of a compound of Synthesis Example 2 in the examples of the present invention.
Figure 14:
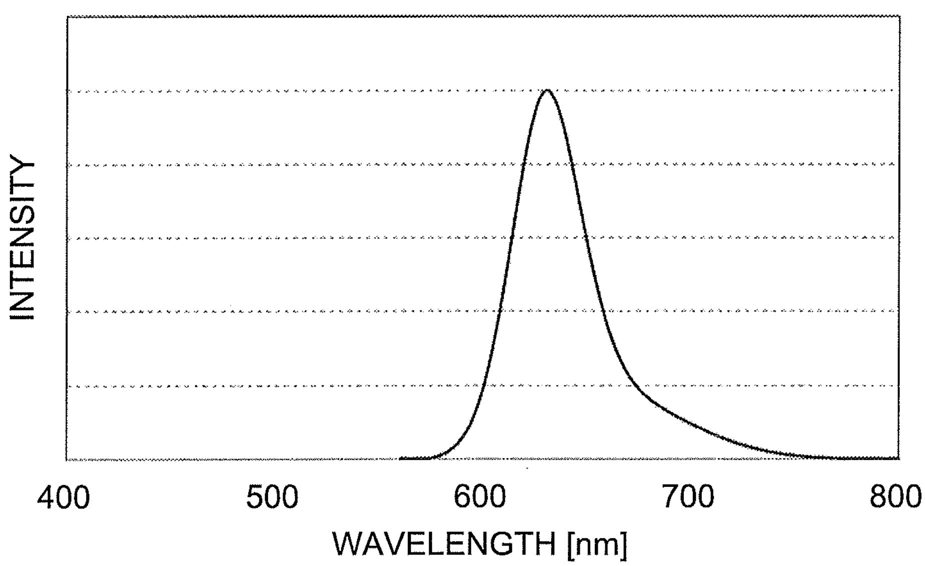
FIG. 14 is a diagram exemplifying an emission spectrum of the compound of Synthesis Example 2 in the examples of the present invention.

The absorption spectrum of this compound R-1 was as illustrated in FIG. 13, which exhibited light absorption characteristics against blue and green light sources. The fluorescence spectrum of this compound R-1 was as illustrated in FIG. 14, which exhibited a sharp emission peak in the red range. A fluorescence quantum yield of 90% was exhibited, and this compound R-1 was a compound that enabled efficient color conversion.

Example 1

A laminated film was obtained by the following method.

Polyethylene terephthalate (PET) with a melting point of 258° C. was used as Thermoplastic Resin X. Ethylene terephthalate (PE/SPG.T/CHDC) obtained by copolymerizing 25 mol % of spiroglycol as an amorphous resin having no melting point and 30 mol % of cyclohexane dicarboxylic acid was used as Thermoplastic Resin Y. Prepared crystalline polyester and Thermoplastic Resin Y were separately charged into two single screw extruders, were melted at 280° C., and were kneaded. Next, they were each passed through five FSS type leaf disk filters and were merged by a laminating apparatus with a slit number of 11 while being weighed by a gear pump to form a laminate alternately laminated by 11 layers in the thickness direction. The method for making the laminate was performed in accordance with the description of Paragraphs [0053] to [0056] of Japanese Patent Application Laid-open No. 2007-307893. In this process, the slit lengths and intervals were all constant. The obtained laminate included six layers of Thermoplastic Resin X and five layers of Thermoplastic Resin Y and had a laminated structure alternately laminated in the thickness direction. A value obtained by dividing a film width direction length of a die lip by a film width direction length at an inflow port of the die as a widening ratio inside the die was set to 2.5.

The obtained cast film was heated by a roll group set at 80° C., was then stretched by 3.3 times in the film longitudinal direction in a stretching section length of 100 mm while being rapidly heated by radiation heaters from both sides of the film, and was then once cooled. Subsequently, the both sides of this uniaxially stretched film were subjected to corona discharge treatment in the air to make the wet tension of the base film 55 mN/m. A lamination forming film coating liquid formed of (a polyester resin with a glass transition temperature of 18° C.)/(a polyester resin with a glass transition temperature of 82° C.)/(silica particles with an average particle diameter of 100 nm) was applied to the treated surfaces to form transparent, slippery, and easily adhesive layers. The refractive index of the easily adhesive layer was 1.57.

This uniaxially stretched film was guided to a tenter, was preliminarily heated with hot air at 100° C., and was stretched by 3.6 times in the film width direction at a temperature of 110° C. The stretching speed and temperature in this process were set constant. The stretched film was subjected to heat treatment with hot air at 240° C. in the tenter as it was, was then subjected to relaxation treatment by 2% in the width direction at the same temperature condition, was rapidly cooled to 100° C., was subjected to relaxation treatment by 5% in the width direction, and was then wound to obtain a laminated film.

Subsequently, the color conversion film containing the organic luminous material and the laminated member were obtained by the following method.

A polyester resin (SP value=10.7 $(cal/cm^3)^{0.5}$) was used as a binder resin, and 0.20 part by weight of Compound G-1 as Organic Luminous Material (a), 0.08 part by weight of Compound R-1 as Organic Luminous Material (b), 300 parts by weight of toluene as a solvent relative to 100 parts by weight of the binder resin were mixed and were stirred and deaerated at 300 rpm for 20 minutes using a planetary stirring/deaerating apparatus "Mazerustar KK-400" (manufactured by Kurabo Industries Ltd.) to obtain a member to be the color conversion layer as a film manufacturing resin liquid.

The member to be the color conversion layer was applied to the laminated film obtained as described above using a slit die coater and was heated and dried at 100° C. for 1 hour to obtain the color conversion layer with an average film thickness of 10 μm.

Next, a PET film ("Lumirror" U48, thickness: 50 μm) was heat-laminated on the color conversion layer to obtain the laminated member including the color conversion film.

Table 2 lists the evaluation results of this laminated member and the light source unit including it. Slight improvement in luminance was shown compared with Comparative Example 1 that did not include the laminated film.

Example 2

The laminated film, the color conversion film, and the laminated member were obtained similarly to Example 1 except that the number of layers of Layer X formed of Thermoplastic Resin X was 51 and that the number of layers of Layer Y formed of Thermoplastic Resin Y was 50.

Table 2 lists the evaluation results of this laminated member and the light source unit including it. Although marked improvement in luminance was shown compared with Example 1 that was fewer in the number of layers, slightly lower uniformity in color tone and luminance was shown.

Example 3

The laminated film, the color conversion film, and the laminated member were obtained similarly to Example 1 except that the number of layers of Layer X formed of Thermoplastic Resin X was 101 and that the number of layers of Layer Y formed of Thermoplastic Resin Y was 100.

Table 2 lists the evaluation results of this laminated member and the light source unit including it. Marked improvement in luminance was observed compared with Example 2 that was fewer in the number of layers, and besides excellent uniformity in color tone and luminance was shown.

Example 4

The laminated film, the color conversion film, and the laminated member were obtained similarly to Example 1 except that the number of layers of Layer X formed of Thermoplastic Resin X was 301 and that the number of layers of Layer Y formed of Thermoplastic Resin Y was 300.

Table 2 lists the evaluation results of this laminated member and the light source unit including it. Marked improvement in luminance was observed, and besides excellent uniformity in color tone and luminance was shown.

Example 5

The laminated film, the color conversion film, and the laminated member were obtained similarly to Example 4 except that the easily adhesive layer was not provided by in-line coating.

Table 2 lists the evaluation results of this laminated member and the light source unit including it. Although a higher luminance improvement rate relative to Comparative Example 1 was shown, a slightly lower luminance was shown reflecting that the reflectance at the light source wavelength was higher than that of Example 4.

Example 6

The member to be the color conversion layer, which was manufactured similarly to Example 9, was applied to a PET film ("Lumirror" U48, thickness: 50 μm) and was heated and dried at 100° C. for 1 hour to obtain the color conversion layer with an average film thickness of 10 μm. Next, a PET film ("Lumirror" U48, thickness: 50 μm) was heat-laminated on the color conversion layer to obtain the laminated member including the color conversion film. The laminated film and the color conversion film were obtained similarly to Example 5 except that the laminated film and the color conversion film were not laminated on each other so as not to make the laminated member.

Table 2 lists the evaluation results of the laminated film, the color conversion film, and the light source unit including them. Although a higher luminance improvement rate relative to Comparative Example 1 was shown, a slightly lower luminance than that of Example 5 was shown reflecting that the laminated film and the color conversion film were used without being laminated on each other.

Example 7

Surface unevenness was provided by the following method on the laminated film obtained similarly to Example 4.

First, Coating Agent 1 was applied to the laminated film to form a coating film with a film thickness of 5 μm.

(Coating Agent 1)

Adekaoptomer KRM-2199 (manufactured by Adeka Corporation) 10 parts by mass

Aron Oxetane OXT-221 (manufactured by Toagosei Co., Ltd.) 1 part by mass

Adekaoptomer SP170 (manufactured by Adeka Corporation) 0.25 part by mass

A mold with a plurality of grooves the sectional shape perpendicular to the longitudinal direction of which was concavely engraved was pressed against the face coated with Coating Agent 1, and the back of the coated face was irradiated with a super-high pressure mercury lamp at 1 J/m$^2$ to cure the coating agent. The mold was then removed to obtain a lenticular shape. The lenticular shape obtained in this process had a prismatic shape with a pitch of 2 μm and a height of 1 μm.

Subsequently, the laminated member including the color conversion film was prepared with the formed lenticular shape as an upper face. Table 2 lists the evaluation results of this laminated member and the light source unit including it. A higher luminance than that of Example 4 was shown reflecting that the prismatic shape was formed.

Example 8

The laminated film, the color conversion film, and the laminated member were obtained similarly to Example 3 except that PEN was used as Thermoplastic Resin X. Table 2 lists the evaluation results of this laminated member and the light source unit including it. Although a reflectance at the emission wavelength of the luminous material comparable to that of Example 3 was shown, a slightly lower luminance was shown reflecting the highness of the reflectance at the light source wavelength.

Comparative Example 1

The light source unit was formed using the color conversion film similarly to Example 1 except that the laminated film was not used.

Table 2 lists the evaluation result of the light source unit, which showed a lower luminance than any of Examples 1 to 8.

Comparative Example 2

The laminated film and the color conversion film were obtained similarly to Example 6 using a color conversion film formed of an inorganic material originally installed in Kindle Fire HDX 7 as the color conversion film.

Table 2 lists the evaluation results of the laminated film, the color conversion film, and the light source unit including them. A decreased luminance was shown relative to Example 6, which showed that a combination with the organic luminous material was excellent.

Example 9

First, the laminated film was obtained by a method similar to that of Example 1. Subsequently, the color conversion film containing the organic luminous material and the laminated member were obtained by the following method.

An acrylic resin (SP value=9.5 $(cal/cm^3)^{0.5}$) was used as a binder resin, and 0.25 part by weight of Compound G-1 as Organic Luminous Material (a) and 400 parts by weight of toluene as a solvent relative to 100 parts by weight of the binder resin were mixed and were stirred and deaerated at 300 rpm for 20 minutes using the planetary stirring/deaerating apparatus "Mazerustar KK-400" (manufactured by Kurabo Industries Ltd.) to obtain a color conversion composition for manufacturing Layer (A).

Similarly, a polyester resin (SP value=10.7 $(cal/cm^3)^{0.5}$) was used as a binder resin, and 0.017 part by weight of Compound R-1 as Organic Luminous Material (b) and 300 parts by weight of toluene as a solvent relative to 100 parts

TABLE 2

| | | | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|---|
| Light source wavelength | | nm | 430 to 485 | | | | | | | | | |
| Emission wavelength | Organic Luminous Material (a) | nm | 506 to 529 | | | | | | | | | 518 to 550 |
| | Organic Luminous Material (b) | nm | 611 to 653 | | | | | | | | | 612 to 648 |
| Laminated film reflectance @incident angle of 10° | Reflectance for light from light source | % | 9 | 9 | 9 | 9 | 12 | 12 | 9 | 16 | — | 9 |
| | Reflectance for light made incident from light source on Organic Luminous Material (a) to be subjected to wavelength conversion | % | 18 | 71 | 73 | 95 | 95 | 95 | 96 | 75 | — | 95 |
| | Reflectance for light made incident from light source on Organic Luminous Material (b) to be subjected to wavelength conversion | % | 9 | 9 | 72 | 96 | 95 | 95 | 95 | 72 | — | 95 |
| Laminated film reflectance @incident angle of 60° | Reflectance for light made incident from light source on Organic Luminous Material (a) to be subjected to wavelength conversion | % | 21 | 83 | 84 | 100 | 100 | 100 | 100 | 88 | — | 100 |
| | Reflectance for light made incident from light source on Organic Luminous Material (b) to be subjected to wavelength conversion | % | 11 | 11 | 83 | 100 | 100 | 100 | 100 | 86 | — | 100 |
| Difference between incident angle and exit angle | | % | 0 | 0 | 0 | 0 | 0 | 0 | 5 | 0 | 0 | 0 |
| Relative luminance | | % | 101 | 103 | 105 | 108 | 107 | 105 | 110 | 104 | 100 | 95 |

by weight of the binder resin were mixed and were stirred and deaerated at 300 rpm for 20 minutes using the planetary stirring/deaerating apparatus "Mazerustar KK-400" (manufactured by Kurabo Industries Ltd.) to obtain a color conversion composition for manufacturing Layer (B).

Next, the color conversion composition for manufacturing Layer (A) was applied to the laminated film obtained as described above using a slit die coater and was heated and dried at 100° C. for 20 minutes to form Layer (A) with an average film thickness of 16 μm.

Similarly, the color conversion composition for manufacturing Layer (B) was applied to a PET base layer side of a light diffusion film "Chemical Matte" 125PW (manufactured by Kimoto Co., Ltd., thickness: 138 μm) as Base Layer B and was heated and dried at 100° C. for 20 minutes to form Layer (B) with an average film thickness of 48 μm.

Next, the above two units were heat-laminated so as to cause Layer (A) and Layer (B) to be directly laminated on each other, whereby a color conversion film with a configuration of "laminated film/Layer (A)/Layer (B)/base layer/light diffusion layer" was manufactured.

Table 3 lists the evaluation results of this laminated member and the light source unit including it. A slightly improved luminance was shown compared with Comparative Example 3 that did not use the laminated film. Slightly low uniformity in in-plane color tone and luminance was shown. The area of the color gamut in the (u', v') color space was 95% relative to the color gamut area of the BT. 2020 standards, which showed an excellent characteristic.

Example 10

The laminated film, the color conversion film, and the laminated member were obtained similarly to Example 9 except that the number of layers of Layer X formed of Thermoplastic Resin X was 51 and that the number of layers of Layer Y formed of Thermoplastic Resin Y was 50.

Table 3 lists the evaluation results of this laminated member and the light source unit including it. Marked improvement in luminance was shown compared with Example 9 that was fewer in the number of layers, and besides improvement in uniformity in in-plane color tone and luminance was shown. A color gamut area comparable to that of Example 9 was shown.

Example 11

The laminated film, the color conversion film, and the laminated member were obtained similarly to Example 9 except that the number of layers of Layer X formed of Thermoplastic Resin X was 101 and that the number of layers of Layer Y formed of Thermoplastic Resin Y was 100.

Table 3 lists the evaluation results of this laminated member and the light source unit including it. Marked improvement in luminance was shown compared with Example 10 that was fewer in the number of layers, and besides excellent uniformity in color tone and luminance was shown. A color gamut area comparable to that of Example 9 was shown.

Example 12

The laminated film, the color conversion film, and the laminated member were obtained similarly to Example 9 except that the number of layers of Layer X formed of Thermoplastic Resin X was 301 and that the number of layers of Layer Y formed of Thermoplastic Resin Y was 300.

Table 3 lists the evaluation results of this laminated member and the light source unit including it. Marked improvement in luminance was shown, and besides excellent uniformity in color tone and luminance was shown. A color gamut area comparable to that of Example 9 was shown.

Example 13

The laminated film, the color conversion film, and the laminated member were obtained similarly to Example 12 except that the easily adhesive layer was not provided by in-line coating.

Table 3 lists the evaluation results of this laminated member and the light source unit including it. Although a higher luminance improvement rate relative to Comparative Example 3 was shown, a slightly lower luminance was shown reflecting that the reflectance at the light source wavelength was higher than that of Example 12. A color gamut area comparable to that of Example 9 was shown.

Example 14

The color conversion composition for manufacturing Layer (A), which was manufactured similarly to Example 9, was applied to a PET film ("Lumirror" U48, thickness: 50 μm) using a slit die coater and was heated and dried at 100° C. for 20 minutes to form Layer (A) with an average film thickness of 16 μm. Similarly, the color conversion composition for manufacturing Layer (B), which was manufactured similarly to Example 9, was applied to a PET base layer side of a light diffusion film "Chemical Matte" 125PW (manufactured by Kimoto Co., Ltd., thickness: 138 μm) as Base Layer B and was heated and dried at 100° C. for 20 minutes to form Layer (B) with an average film thickness of 48 μm. Next, the above two units were heat-laminated so as to cause Layer (A) and Layer (B) to be directly laminated on each other, whereby a color conversion film with a configuration of "PET film/Layer (A)/Layer (B)/base layer/light diffusion layer" was manufactured. The laminated film and the color conversion film were obtained similarly to Example 13 except that the laminated film and the color conversion film were not laminated on each other so as not to make the laminated member.

Table 3 lists the evaluation results of the laminated film, the color conversion film, and the light source unit including them. Although a higher luminance improvement rate relative to Comparative Example 3 was shown, a slightly lower luminance than that of Example 13 was shown reflecting that the laminated film and the color conversion film were used without being laminated on each other. A color gamut area comparable to that of Example 9 was shown.

Example 15

The laminated film, the color conversion film, and the laminated member were obtained similarly to Example 12 except that Compound G-2 was used as Organic Luminous Material (a) of the color conversion film.

Table 3 lists the evaluation results of this laminated member and the light source unit including it. Marked improvement in luminance was shown similarly to Example 12, and besides excellent uniformity in color tone and luminance was shown. A color gamut area comparable to that of Example 9 was shown.

Example 16

The laminated film, the color conversion film, and the laminated member were obtained similarly to Example 12 except that Compound R-2 was used as Organic Luminous Material (b) of the color conversion film.

Table 3 lists the evaluation results of this laminated member and the light source unit including it. Marked improvement in luminance was shown similarly to Example 12, and besides excellent uniformity in color tone and luminance was shown. The area of the color gamut in the (u', v') color space was 96% relative to the color gamut area of the BT. 2020 standards, which showed an excellent characteristic.

Example 17

The laminated film, the color conversion film, and the laminated member were obtained similarly to Example 12 except that Compound G-3 was used as Organic Luminous Material (a) of the color conversion film.

Table 3 lists the evaluation results of this laminated member and the light source unit including it. A slightly lower luminance and a slightly smaller color gamut area were shown reflecting that the reflectance at the light source wavelength was higher than that of Example 12.

Example 18

The laminated film, the color conversion film, and the laminated member were obtained similarly to Example 12 except that a PET film "Lumirror" U48 (manufactured by Toray Industries, Inc., thickness: 50 μm) was used in place of the light diffusion film.

Table 3 lists the evaluation results of this laminated member and the light source unit including it evaluated without using the prism sheet. Although slight improvement in luminance was shown compared with Comparative Example 3 that did not use the laminated film, bluish white light was obtained, and the color gamut area was slightly smaller.

Example 19

The laminated film, the color conversion film, and the laminated member were obtained similarly to Example 12 except that a blue LED with a peak wavelength of 458 nm was used as the light source.

Table 3 lists the evaluation results of this laminated member and the light source unit including it. More marked improvement in luminance than Example 12 was shown, and besides excellent uniformity in color tone and luminance was shown. The area of the color gamut in the (u', v') color space was 96% relative to the color gamut area of the BT. 2020 standards, which showed an excellent characteristic.

Comparative Example 3

The light source unit was formed using the color conversion film similarly to Example 9 except that the laminated film was not used.

Table 3 lists the evaluation results of the light source unit, which showed a lower luminance than any of Examples 9 to 19.

Comparative Example 4

The laminated film and the color conversion film were obtained similarly to Example 14 using a color conversion film formed of an inorganic material originally installed in Kindle Fire HDX 7 as the color conversion film.

Table 3 lists the evaluation results of the laminated film, the color conversion film, and the light source unit including them. A decreased luminance was shown relative to Example 14, which showed that a combination with the organic luminous material was excellent.

Comparative Example 5

The laminated film and the color conversion film were obtained similarly to Example 12 except that $Y_3Al_5O_{12}$ (YAG) and $CaAlSiN_3$ (CASN) were used as the luminous materials of the color conversion film. Table 3 lists the evaluation results thereof. A decreased color gamut area was shown relative to Example 12, which showed that a combination with the organic luminous material was excellent.

TABLE 3

| | | | Example 9 | Example 10 | Example 11 | Example 12 | Example 13 | Example 14 | Example 15 |
|---|---|---|---|---|---|---|---|---|---|
| Maximum emission wavelength of-light source | | nm | | | | | 446 | | |
| Organic luminous material | Layer (A) | | | | | G-1 | | | G-2 |
| | Layer (B) | | | | | R-1 | | | R-1 |
| Peak wavelength | Green | nm | | | | 527 | | | 528 |
| | Red | nm | | | | | 641 | | |
| Full width at half maximum | Green | nm | | | | 27 | | | 28 |
| | Red | nm | | | | | 49 | | |
| Laminated film reflectance @incident angle of 10° | Reflectance for light from light source | % | 9 | 9 | 9 | 9 | 12 | 12 | 12 |
| | Reflectance for light made incident from light source on Organic Luminous Material (a) to be subjected to wavelength conversion | % | 18 | 71 | 73 | 95 | 95 | 95 | 95 |

TABLE 3-continued

| | | | | | | | | | |
|---|---|---|---|---|---|---|---|---|---|
| | Reflectance for light made incident from light source on Organic Luminous Material (b) to be subjected to wavelength conversion | % | 9 | 9 | 72 | 96 | 95 | 95 | 95 |
| Laminated film reflectance @incident angle of 60° | Reflectance for light made incident from light source on Organic Luminous Material (a) to be subjected to wavelength conversion | % | 21 | 83 | 84 | 100 | 100 | 100 | 100 |
| | Reflectance for light made incident from light source on Organic Luminous Material (b) to be subjected to wavelength conversion | % | 11 | 11 | 83 | 100 | 100 | 100 | 100 |
| Relative luminance | | | 101 | 103 | 105 | 108 | 107 | 105 | 108 |
| Color coordinates | X | | 0.25 | 0.25 | 0.25 | 0.25 | 0.25 | 0.25 | 0.25 |
| | Y | | 0.22 | 0.22 | 0.22 | 0.22 | 0.22 | 0.22 | 0.22 |
| Area of color gamut (u', v') | | % | 95% | 95% | 95% | 95% | 95% | 95% | 95% |

| | | | Example 16 | Example 17 | Example 18 | Example 19 | Comparative Example 3 | Comparative Example 4 | Comparative Example 5 |
|---|---|---|---|---|---|---|---|---|---|
| Maximum emission wave-length of-light source | | nm | | 446 | | 458 | | 446 | |
| Organic luminous material | Layer (A) | | G-1 | G-3 | | | G-1 | | YAG |
| | Layer (B) | | R-2 | | | R-1 | | | CASN |
| Peak wavelength | Green | nm | 527 | 498 | | | 527 | | 559 |
| | Red | nm | 643 | | | 641 | | | 650 |
| Full width at half maximum | Green | nm | 27 | 56 | | | 527 | | 120 |
| | Red | nm | 50 | | | 49 | | | 86 |
| Laminated film reflectance @incident angle of 10° | Reflectance for light from light source | % | 12 | 12 | 12 | 12 | — | 9 | 10 |
| | Reflectance for light made incident from light source on Organic Luminous Material (a) to be subjected to wavelength conversion | % | 95 | 95 | 95 | 95 | — | 95 | 94 |
| | Reflectance for light made incident from light source on Organic Luminous Material (b) to be subjected to wavelength conversion | % | 95 | 95 | 95 | 95 | — | 95 | 94 |

TABLE 3-continued

| | | | | | | | | | |
|---|---|---|---|---|---|---|---|---|---|
| Laminated film reflectance @incident angle of 60° | Reflectance for light made incident from light source on Organic Luminous Material (a) to be subjected to wavelength conversion | % | 100 | 100 | 100 | 100 | — | 100 | 100 |
| | Reflectance for light made incident from light source on Organic Luminous Material (b) to be subjected to wavelength conversion | % | 100 | 100 | 100 | 100 | — | 100 | 100 |
| Relative luminance | | | 108 | 107 | 101 | 112 | 100 | 95 | 107 |
| Color coordinates | X | | 0.25 | 0.25 | 0.22 | 0.25 | 0.25 | 0.25 | 0.25 |
| | Y | | 0.22 | 0.21 | 0.19 | 0.23 | 0.22 | 0.22 | 0.22 |
| Area of color gamut (u', v') | | % | 96% | 87% | 88% | 96% | 95% | 95% | 75% |

Example 20

An ultraviolet-blocking type laminated film was obtained by the following method. Polyethylene terephthalate (PET) with a melting point of 258° C. was used as Thermoplastic Resin X. Ethylene terephthalate (PE/SPG.T/CHDC) obtained by copolymerizing 25 mol % of spiroglycol as an amorphous resin having no melting point and 30 mol % of cyclohexane dicarboxylic acid was used as Thermoplastic Resin Y. A benzotriazole-based ultraviolet light absorbent (2,2'-methylenebis(4-(1,1,3,3-tetramethylbutyl)-6-(2H-benzotriazol-2-yl)phenol) with a molecular weight of 650 g/mol and with a maximum absorption wavelength of 346 nm as an ultraviolet light absorbent was added to Thermoplastic Resin Y so as to be 20 wt %.

Prepared Thermoplastic Resin X and Thermoplastic Resin Y were separately charged into two single screw extruders, were melted at 280° C., and were kneaded. Next, they were each passed through five FSS type leaf disk filters and were merged by a laminating apparatus with a slit number of 11 designed so as to make the thickness of the outermost layer 5% of the film thickness while being weighed by a gear pump to form a laminate alternately laminated by 11 layers in the thickness direction. The method for making the laminate was performed in accordance with the description of Paragraphs [0053] to [0056] of Japanese Patent Application Laid-open No. 2007-307893. In this process, the slit lengths and intervals were all constant.

The obtained laminate included six layers of Thermoplastic Resin X and five layers of Thermoplastic Resin Y and had a laminated structure alternately laminated in the thickness direction in which the thickness ratio of adjacent layers were 1:1. A value obtained by dividing a film width direction length of a die lip by a film width direction length at an inflow port of the die as a widening ratio inside the die was set to 2.5.

The obtained cast film was heated by a roll group set at 100° C., was then stretched by 3.3 times in the film longitudinal direction in a stretching section length of 100 mm while being rapidly heated by radiation heaters from both sides of the film, and was then once cooled. Subsequently, the both sides of this uniaxially stretched film were subjected to corona discharge treatment in the air to make the wet tension of the base film 55 mN/m. A lamination forming film coating liquid formed of (a polyester resin with a glass transition temperature of 18° C.)/(a polyester resin with a glass transition temperature of 82° C.)/(silica particles with an average particle diameter of 100 nm) was applied to the treated surfaces to form transparent, slippery, easily adhesive layers. The refractive index of the easily adhesive layer was 1.57.

This uniaxially stretched film was guided to a tenter, was preliminarily heated with hot air at 900° C., and was stretched by 3.5 times at a temperature of 140° C. The stretching speed and temperature in this process were set constant. The stretched film was subjected to heat treatment with hot air at 200° C. in the tenter as it was, was then subjected to relaxation treatment by 3% in the width direction at the same temperature condition, and was then wound to obtain a laminated film with a thickness of 30 μm.

The obtained laminated film was arranged so as to arrange the light source, the laminated film, and the color conversion film in this order, and the light resistance test was carried out thereon. Table 4 lists the evaluation results. A marked light resistance improvement effect was revealed compared with Comparative Example 6 that was low in ultraviolet blocking performance.

Radical measurement was carried out on the color conversion film using the obtained laminated film, with no radical detected.

Example 21

The laminated film and the color conversion film were obtained similarly to Example 20 except that the number of layers of Layer X formed of Thermoplastic Resin X was 301 and that the number of layers of Layer Y formed of Thermoplastic Resin Y was 300.

The obtained laminated film and color conversion film were arranged so as to arrange the light source, the laminated film, and the color conversion film in this order, and the light resistance test was carried out thereon. Table 4 lists the evaluation results. Although the light resistance improvement effect was comparable to that of Example 20, a precipitate observed in a minute amount in Example 20 was not observed at all.

Radical measurement was carried out on the color conversion film using the obtained laminated film, with no radical detected.

Example 22

The laminated film and the color conversion film were obtained similarly to Example 21 except that a triazine-based ultraviolet light absorbent (2,4,6-tris(2-hydroxy-4-hexyloxy-3-methylphenyl)-s-triazine) with a molecular weight of 700 g/mol and with a maximum absorption wavelength of 355 nm was added so as to be 16 wt % relative to the entire Thermoplastic Resin Y.

The obtained laminated film and color conversion film were arranged so as to arrange the light source, the laminated film, and the color conversion film in this order, and the light resistance test was carried out thereon. Table 4 lists the evaluation results. Longer wavelength ultraviolet rays could be cut than Example 21, which showed excellent light resistance.

Radical measurement was carried out on the color conversion film using the obtained laminated film, with no radical detected.

Example 23

The laminated film and the color conversion film were obtained similarly to Example 21 except that a triazine-based ultraviolet light absorbent (2,4,6-tris(2-hydroxy-4-hexyloxy-3-methylphenyl)-s-triazine) with a molecular weight of 700 g/mol and with a maximum absorption wavelength of 355 nm was added so as to be 3 wt % relative to the entire Thermoplastic Resin Y.

A hard coat agent was prepared by adding an indole-based dye with a maximum absorption wavelength of 393 nm to an active energy ray-curable acrylic resin (AICAAITRON Z-850 manufactured by Aica Kogyo Co., Ltd. [refractive index: 1.518]) so as to be 3 wt % relative to the entire resin composition forming the curable resin-containing layer and was uniformly applied to the obtained laminated film using a bar coater. The solid content of the hard coat agent was adjusted as appropriate so as to be 30 wt % in total by adding a methyl ethyl ketone solvent. The prepared hard coat layer was applied thereto by a wire bar, was dried in an oven maintained at 80° C. for 1 to 2 minutes to volatilize the methyl ethyl ketone solvent, was then irradiated with ultraviolet rays with an integral irradiation intensity of 180 $mJ/cm^2$ by a condensing type high pressure mercury lamp (H04-L41 manufactured by Eye Graphics Co., Ltd.) having an irradiation intensity of 120 $W/cm^2$ set at a height of 13 centimeters above the surface of the curable resin layer, and was cured to obtain a laminated film with a hard coat layer laminated on the laminated film with a coating film thickness of 2 μm.

The obtained laminated film and color conversion film were arranged so as to arrange the light source, the laminated film, and the color conversion film in this order, and the light resistance test was carried out thereon. Table 4 lists the evaluation results. Longer wavelength ultraviolet rays could be cut than Example 21, which showed excellent light resistance.

Radical measurement was carried out on the color conversion film using the obtained laminated film, with no radical detected.

Example 24

The laminated film was obtained similarly to Example 23 except that, in Example 23, 2,4-bis(2-hydroxy-4-butoxyphenyl)-6-(2,4-dibutoxyphenyl)-s-triazine was added to the curable resin-containing layer in an amount of 3 wt %, and that, in Example 23, a azomethine-based dye with a maximum absorption wavelength of 378 nm was added to Thermoplastic Resin Y in an amount of 3 wt %.

The obtained laminated film and color conversion film were arranged so as to arrange the light source, the laminated film, and the color conversion film in this order, and the light resistance test was carried out thereon. Table 4 lists the evaluation results. Longer wavelength ultraviolet rays could be cut than Example 21, which showed excellent light resistance.

Radical measurement was carried out on the color conversion film using the obtained laminated film, with no radical detected.

Example 25

The laminated film was obtained similarly to Example 23 except that, in Example 23, a triazine-based ultraviolet light absorbent (2,4,6-tris(2-hydroxy-4-hexyloxy-3-methylphenyl)-s-triazine) (an amount added to the entire Thermoplastic Resin Y was 1 wt %) and a benzotriazole-based ultraviolet light absorbent (2,2'-methylenebis(4-(1,1,3,3-tetramethylbutyl)-6-(2H-benzotriazol-2-yl)phenol) (an amount added to the entire Thermoplastic Resin Y was 1 wt %) were added to Thermoplastic Resin Y, and that, in Example 23, an indole-based visible light absorbing dye (an amount added to the entire curable resin was 1 wt %) and an anthraquinone-based visible light absorbing dye with a maximum absorption wavelength of 384 nm (an amount added to the entire curable resin was 7 wt %) were added to the curable resin.

The obtained laminated film and color conversion film were arranged so as to arrange the light source, the laminated film, and the color conversion film in this order, and the light resistance test was carried out thereon. Table 4 lists the evaluation results. Longer wavelength ultraviolet rays could be cut than Example 21, which showed excellent light resistance.

Radical measurement was carried out on the color conversion film using the obtained laminated film, with no radical detected.

Example 26

The laminated film was obtained similarly to Example 22 except that the film thickness was 65 μm, and that the amount of the triazine-based ultraviolet light absorbent added to Thermoplastic Resin Y was 6 wt %.

The obtained laminated film and color conversion film were arranged so as to arrange the light source, the laminated film, and the color conversion film in this order, and the light resistance test was carried out thereon. Table 4 lists the evaluation results. The laminated film showed reflection in the wavelength range of 490 nm or longer and 810 nm or shorter other than the ultraviolet range. Reflecting the effect, a luminance higher by 14% was shown while showing comparable light resistance compared with Example 22, which was further suitable for the use as liquid crystal displays.

Radical measurement was carried out on the color conversion film using the obtained laminated film, with no radical detected.

Example 27

The laminated film was obtained similarly to Example 22 except that the thickness ratio between adjacent layers was 1.5, and that the amount of the triazine-based ultraviolet light absorbent added to Thermoplastic Resin Y was 4 wt %.

The obtained laminated film and color conversion film were arranged so as to arrange the light source, the laminated film, and the color conversion film in this order, and the light resistance test was carried out thereon. Table 4 lists the evaluation results. The laminated film showed reflectance in the wavelength range of 490 nm or longer and 810 nm or shorter other than ultraviolet range. Reflecting that the thickness ratio between adjacent layers was 1.5, reflection occurred also in the ultraviolet range, whereby the result comparable to Example 26 was obtained even when the amount of the ultraviolet light absorbent added was reduced. A luminance higher by 14% was shown while showing comparable light resistance compared with Example 22 similarly to Example 26, which was further suitable for the use as liquid crystal displays.

Radical measurement was carried out on the color conversion film using the obtained laminated film, with no radical detected.

Example 28

The laminated film was obtained similarly to Example 25 except that the film thickness was 65 μm, and that a triazine-based ultraviolet light absorbent (2,4,6-tris(2-hydroxy-4-hexyloxy-3-methylphenyl)-s-triazine) (an amount added to the entire Thermoplastic Resin Y was 0.4 wt %) and a benzotriazole-based ultraviolet light absorbent (2,2'-methylenebis(4-(1,1,3,3-tetramethylbutyl)-6-(2H-benzotriazol-2-yl)phenol) (an amount added to the entire Thermoplastic Resin Y was 0.4 wt %) were added to Thermoplastic Resin Y.

The obtained laminated film and color conversion film were arranged so as to arrange the light source, the laminated film, and the color conversion film in this order, and the light resistance test was carried out thereon. Table 4 lists the evaluation results. The laminated film showed reflection in the wavelength range of 490 nm or longer and 810 nm or shorter other than the ultraviolet range. Reflecting the effect, a luminance higher by 14% was shown while showing comparable light resistance compared with Example 22, which was further suitable for the use as liquid crystal displays.

Radical measurement was carried out on the color conversion film using the obtained laminated film, with no radical detected.

TABLE 4

| | | | | Example 20 | Example 21 | Example 22 | Example 23 | Example 24 |
|---|---|---|---|---|---|---|---|---|
| Measurement result of electron spin resonance apparatus | Layer A | Radical attribution | | Non-detection | Non-detection | Non-detection | Non-detection | Non-detection |
| | | g value | | — | — | — | — | — |
| | | Radical quantitative value | Number of radicals/$cm^2$ | — | — | — | — | — |
| | Layer B | Radical attribution | | Non-detection | Non-detection | Non-detection | Non-detection | Non-detection |
| | | g value | | — | — | — | — | — |
| | | Radical quantitative value | Number of radicals/$cm^2$ | — | — | — | — | — |
| Laminated film | Average transmittance in emission band | | % | 90 | 90 | 90 | 90 | 85 |
| | Maximum reflectance in light exit band | | % | 10 | 10 | 10 | 10 | 10 |
| | Average reflectance in light exit band | | % | 10 | 10 | 10 | 10 | 10 |
| | Maximum transmittance | Wavelength 300 nm or longer and 380 nm or shorter | % | 0 | 0 | 0 | 3 | 0 |
| | | Wavelength 380 nm or longer and 410 nm or shorter | % | 74 | 74 | 10 | 4 | 4 |
| | Maximum reflectance | Wavelength 300 nm or longer and 380 nm or shorter | % | 9 | 90 | 81 | 73 | 74 |
| | Light resistance test | | | B | B | A | A | A |

TABLE 4-continued

| | | | | Example 25 | Example 26 | Example 27 | Example 28 |
|---|---|---|---|---|---|---|---|
| Measurement result of electron spin resonance apparatus | Layer A | Radical attribution g value | | Non-detection | Non-detection | Non-detection | Non-detection |
| | | | | — | — | — | — |
| | | Radical quantitative value | Number of radicals/$cm^2$ | — | — | — | — |
| | Layer B | Radical attribution g value | | Non-detection | Non-detection | Non-detection | Non-detection |
| | | | | — | — | — | — |
| | | Radical quantitative value | Number of radicals/$cm^2$ | — | — | — | — |
| Laminated film | Average transmittance in emission band | | % | 88 | 90 | 90 | 90 |
| | Maximum reflectance in light exit band | | % | 10 | 97 | 97 | 97 |
| | Average reflectance in light exit band | | % | 10 | 96 | 96 | 96 |
| | Maximum transmittance | Wavelength 300 nm or longer and 380 nm or shorter | % | 3 | 0 | 0 | 3 |
| | | Wavelength 380 nm or longer and 410 nm or shorter | % | 2 | 9 | 8 | 2 |
| | Maximum reflectance | Wavelength 300 nm or longer and 380 nm or shorter | % | 65 | 51 | 48 | 53 |
| | Light resistance test | | | A | A | A | A |

Example 29

A laminated film obtained similarly to Example 22 was named a first laminated film. A laminated film obtained similarly to Example 22 with a film thickness of 65 μm using no ultraviolet light absorbent was named a second laminated film.

The obtained first and second laminated films and color conversion film were arranged so as to arrange the light source, the first laminated film, the second laminated film, and the color conversion film in this order, and the light resistance test was carried out thereon. Table 5 lists the evaluation results. The second laminated film showed reflection in the wavelength range of 490 nm or longer and 810 nm or shorter, and a luminance higher by 13% was shown while showing comparable light resistance compared with Example 22 similarly to Example 26, which was further suitable for the use as liquid crystal displays.

Example 30

A laminated film obtained similarly to Example 22 with a film thickness of 65 μm using no ultraviolet light absorbent was named a first laminated film. A laminated film obtained similarly to Example 22 was named a second laminated film.

The obtained first and second laminated films and color conversion film were arranged so as to arrange the light source, the first laminated film, the color conversion film, and the second laminated film in this order, and the light resistance test was carried out thereon. Table 5 lists the evaluation results. The first laminated film showed reflection in the wavelength range of 490 nm or longer and 810 nm or shorter, and a luminance higher by 13% was shown while showing comparable light resistance compared with Example 22 similarly to Example 26, which was further suitable for the use as liquid crystal displays. Meanwhile, although excellent light resistance was shown compared with Comparative Example 6, the function of cutting ultraviolet rays from the light source was not included, and light resistance tended to slightly decrease.

Example 31

The first and second laminated films and the color conversion film obtained in Example 30 were arranged so as to arrange the light source, the first laminated film, the color conversion film, and the second laminated film in this order, and the light resistance test was carried out thereon with the second laminated film in particular pasted on the outside of a liquid crystal display via an adhesive film. Table 5 lists the evaluation results. Luminance improvement performance and light resistance comparable to those of Example 30 were shown.

Example 32

In manufacturing the color conversion film, the color conversion film was obtained using the laminated film obtained in Example 26 in place of the PET film.

The color conversion film including the obtained laminated film was arranged so as to arrange the light source, the laminated film, and the color conversion film in this order, and the light resistance test was carried out thereon. Table 5 lists the evaluation results. The laminated film showed reflection in the wavelength range of 490 nm or longer and 810 nm or shorter other than the ultraviolet range. Reflecting the effect, a luminance higher by 15% was shown while showing comparable light resistance compared with Example 22, which was further suitable for the use as liquid crystal displays.

Example 33

In manufacturing the color conversion, the color conversion film was obtained using the laminated film (a first laminated film) obtained in Example 15 in place of the PET film, and further the laminated film (a second laminated film) obtained in Example 22 was laminated thereon via an adhesive film.

The color conversion film including the obtained first and second laminated films was arranged so as to arrange the light source, the first laminated film, the color conversion film, and the second laminated film in this order, and the light resistance test was carried out thereon. Table 5 lists the evaluation results. The first laminated film showed reflection in the wavelength range of 490 nm or longer and 810 nm or shorter, and a luminance higher by 15% was shown while showing comparable light resistance compared with Example 22 similarly to Example 26, which was further suitable for the use as liquid crystal displays. In addition, both the light source's and external ultraviolet rays up to 410 nm were cut, which showed excellent light resistance.

Comparative Example 6

The light source unit was formed using the color conversion film similarly to Example 20 except that the laminated film was not used, and the light resistance test was carried out thereon. Table 5 lists the evaluation results. Extremely low light resistance was shown, which was not suitable for practical use.

Radical measurement was carried out on the color conversion film using the obtained laminated film, with carbon radicals originating from Layer A and peroxide radicals originating from Layer B of the color conversion film detected. Substances causing the deterioration of the organic luminous material were detected in both layers.

Comparative Example 7

In place of the laminated film, a benzotriazole-based ultraviolet light absorbent was added to polyethylene terephthalate (PET) in an amount of 10 wt % to obtain a single-layer film with a thickness of 30 μm similarly to Example 20 as a one-layer film.

Table 5 lists the evaluation results. Radical measurement was carried out on the color conversion film using the obtained laminated film, with no radical detected.

However, when the obtained single-layer film and color conversion film were arranged so as to arrange the light source, the single-layer film, and the color conversion film in this order, and the light resistance test was carried out thereon, a great many precipitates appeared on the surface during the light resistance test, which was not suitable for practical use.

TABLE 5

| | | | | Example 29 | Example 30 | Example 31 | Example 32 | Example 33 | Comparative Example 6 | Comparative Example 7 |
|---|---|---|---|---|---|---|---|---|---|---|
| Measurement result of electron spin resonance apparatus | Layer A | Radical attribution | | — | — | — | — | — | Carbon radical | Non-detection |
| | | g value | | — | — | — | — | — | 2.0021 | — |
| | | Radical quantitative value | Number of radicals/$cm^2$ | — | — | — | — | — | $5.5 \times 10^{13}$ | — |
| | Layer B | Radical attribution | | — | — | — | — | — | Peroxide radical | Non-detection |
| | | g value | | — | — | — | — | — | 2.034, 2.0055 | — |
| | | Radical quantitative value | Number of radicals/$cm^2$ | — | — | — | — | — | $1.4 \times 10^{14}$ | — |
| First laminated film | Average transmittance in emission band | | % | 90 | 91 | 91 | 90 | 90 | — | 90 |
| | Maximum reflectance in light exit band | | % | 10 | 97 | 97 | 97 | 97 | — | 10 |
| | Average reflectance in light exit band | | % | 10 | 96 | 96 | 96 | 96 | — | 10 |
| | Maximum transmittance | Wavelength 300 nm or longer and 380 nm or shorter | % | 0 | 73 | 73 | 3 | 3 | — | 0 |
| | | Wavelength 380 nm or longer and 410 nm or shorter | % | 10 | 81 | 81 | 2 | 2 | — | 74 |
| | Maximum reflectance | Wavelength 300 nm or longer and 380 nm or shorter | % | 81 | 63 | 63 | 53 | 53 | — | 9 |
| Second laminated film | Average transmittance in emission band | | % | 91 | 90 | 90 | — | 90 | — | — |
| | Maximum reflectance in light exit band | | % | 97 | 10 | 10 | — | 10 | — | — |
| | Average reflectance in light exit band | | % | 96 | 10 | 10 | — | 10 | — | — |
| | Maximum transmittance | Wavelength 300 nm or longer and 380 nm or shorter | % | 73 | 0 | 0 | — | 0 | — | — |

TABLE 5-continued

| | | | Example 29 | Example 30 | Example 31 | Example 32 | Example 33 | Comparative Example 6 | Comparative Example 7 |
|---|---|---|---|---|---|---|---|---|---|
| | Wavelength 380 nm or longer and 410 nm or shorter | % | 81 | 10 | 10 | — | 10 | — | — |
| Maximum reflectance | Wavelength 300 nm or longer and 380 nm or shorter | % | 63 | 81 | 81 | — | 81 | — | — |
| Light resistance test | | | A | B | B | A | A | C | C |

INDUSTRIAL APPLICABILITY

As described above, the light source unit and the laminated film according to the present invention are excellent in color reproducibility, are low in power consumption, and can be thereby suitably used for displays and lighting apparatuses.

REFERENCE SIGNS LIST

1 Light source unit
2 Light source
3 Laminated film
4 Color conversion film
5 Laminated member
6 Light-guiding plate
31 Example of uneven shape
32 Example of uneven shape
33 Functional layer
41 Base layer
42 Color conversion layer
43 Barrier film

What is claimed is:

1. A light source unit comprising:
a light source;
a color conversion film containing an organic luminous material that converts incident light made incident from the light source into light with a longer wavelength than that of the incident light; and
a laminated film comprising a constitution in which 11 or more layers of different thermoplastic resins are alternately laminated with each other,
wherein the laminated film satisfies the following Numerical Formula (6):

$$|\lambda 1-\lambda 2|\leq 50 \quad (6)$$

where $\lambda 1<\lambda 2$
$\lambda 1$: Wavelength (nm) at which the reflectance is ¼ of the maximum reflectance near the shorter wavelength end of the reflection band of the reflection film, and
$\lambda 2$: Wavelength (nm) at which the reflectance is ¾ of the maximum reflectance near the shorter wavelength end of the reflection band of the reflection film.

2. The light source unit according to claim 1, wherein the laminated film satisfies the following Numerical Formula (7):

$$|\lambda 1-\lambda 2|\leq 30 \quad (7)$$

where $\lambda 1<\lambda 2$.

3. The light source unit according to claim 1, wherein the laminated film is a laminated film having a reflectance of incident light made incident from the light source on the laminated film being 20% or lower at an incident angle of 10°.

4. The light source unit according to claim 1, wherein the organic luminous material contains a pyrromethene derivative.

5. The light source unit according to claim 1, wherein the organic luminous material contains a compound represented by General Formula (1):

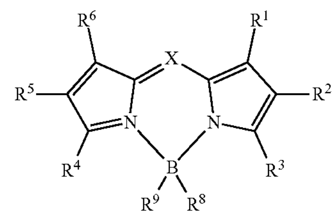

(1)

where X is C—$R^7$ or N; and $R^1$ to $R^9$ are optionally the same or different from each other and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, phosphine oxide group, and a condensed ring and an aliphatic ring formed between adjacent substituents.

6. The light source unit according to claim 5, wherein in General Formula (1) X is C—$R^7$ in which $R^7$ is a group represented by General Formula (2);

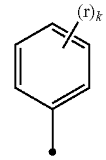

(2)

where r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, and phosphine oxide group; k is an integer of 1 to 3; and when k is 2 or more, r is optionally the same or different from each other.

7. The light source unit according to claim 5, wherein in General Formula (1) $R^1$, $R^3$, $R^4$, and $R^6$ are optionally the same or different from each other and are each a substituted or unsubstituted phenyl group.

8. The light source unit according to claim 5, wherein in General Formula (1) $R^1$, $R^3$, $R^4$, and $R^6$ are optionally the same or different from each other and are each a substituted or unsubstituted alkyl group.

9. The light source unit according to claim 1, exhibiting emission in which a peak wavelength of the organic luminous material is observed in a range of 500 nm or longer and 580 nm or shorter.

10. The light source unit according to claim 1, wherein the organic luminous material includes the following organic luminous materials (a) and (b):

(a) an organic luminous material that exhibits emission a peak wavelength of which is observed in a range of 500 nm or longer and 580 nm or shorter by being excited by the incident light made incident from the light source; and (b) an organic luminous material that exhibits emission a peak wavelength of which is observed in a range of 580 nm or longer and 750 nm or shorter by being excited by at least one of the incident light made incident from the light source and the emission from the organic luminous material (a).

11. The light source unit according to claim 10, wherein either the organic luminous material (a) or (b) or both are compounds represented by General Formula (1):

(1)

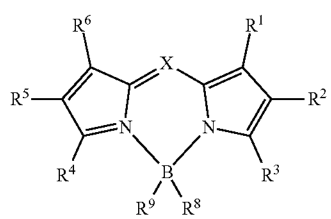

where X is C—$R^7$ or N; and $R^1$ to $R^9$ are optionally the same or different from each other and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, oxycarbonyl group, carbamoyl group, amino group, nitro group, silyl group, siloxanyl group, boryl group, phosphine oxide group, and a condensed ring and an aliphatic ring formed between adjacent substituents.

12. The light source unit according to claim 1, wherein the color conversion film is a laminate including at least the following layers (A) and (B):

(A) a layer containing organic luminous material (a) that exhibits emission a peak wavelength of which is observed in a range of 500 nm or longer and 580 nm or shorter by being excited by the incident light made incident from the light source; and (B) a layer containing organic luminous material (b) that exhibits emission a peak wavelength of which is observed in a range of 580 nm or longer and 750 nm or shorter by being excited by at least one of the incident light made incident from the light source and the emission from the organic luminous material (a).

13. The light source unit according to claim 1, comprising a laminate including the color conversion film and the laminated film.

14. The light source unit according to claim 1, wherein the different thermoplastic resins comprise polyethylene terephthalate (PE) and ethylene terephthalate (PE/SPG.T/CHDC) obtained by copolymerizing spiroglycol and cyclohexane dicarboxylic acid, or polyethylene naphthalate (PEN) and ethylene terephthalate (PE/SPG.T/CHDC) obtained by copolymerizing spiroglycol and cyclohexane dicarboxylic acid.

15. A display or a lighting apparatus comprising the light source unit according to claim 1.

16. The light source unit according to claim 1, comprising a functional layer provided on a surface of the color conversion film or the laminated film, a refractive index n3 of the functional layer being between n1 and n2, where n1 is a refractive index of the laminated film, and n2 is a refractive index of the color conversion film.

17. The light source unit according to claim 1, wherein a surface of the laminated film or the color conversion film has an uneven shape.

18. The light source unit according to claim 1, wherein the laminated film or the color conversion film has a difference between an incident angle of the incident light made incident from the light source on the laminated film or the color conversion film and an exit angle of exit light being 5° or larger.

19. The light source unit according to claim 3, wherein the laminated film has a reflectance of light with a wavelength of 300 nm or longer and 410 nm or shorter being 20% or higher at an incident angle of 10° or with an absorbance of light with a wavelength of 300 nm or longer and 410 nm or shorter being 10% or higher at an incident angle of 10°.

20. The light source unit according to claim 3, wherein the laminated film contains an ultraviolet light absorbent.

21. A laminated member comprising:

a color conversion film containing an organic luminous material that converts incident light into light with a longer wavelength than that of the incident light; and a laminated film comprising a constitution in which 11 or more layers of different thermoplastic resins are alternately laminated with each other, wherein the laminated film satisfies the following Numerical Formula (6):

$$||1-\lambda 2| \leq 50 \quad (6)$$

where $\lambda 1<\lambda 2$, $\lambda 1$: Wavelength (nm) at which the reflectance is ¼ of the maximum reflectance near the shorter wavelength end of the reflection band of the reflection film, and $\lambda 2$: Wavelength (nm) at which the reflectance is ¾ of the maximum reflectance near the shorter wavelength end of the reflection band of the reflection film.

22. The laminated member according to claim 21, wherein the laminated film satisfies the following Numerical Formula (7):

$$|\lambda 1-\lambda 2| \leq 30 \quad (7)$$

where $\lambda 1<\lambda 2$.

23. The laminated member according to claim 21, wherein the different thermoplastic resins comprise polyethylene terephthalate (PE) and ethylene terephthalate (PE/SPG.T/CHDC) obtained by copolymerizing spiroglycol and cyclohexane dicarboxylic acid, or polyethylene naphthalate (PEN) and ethylene terephthalate (PE/SPG.T/CHDC) obtained by copolymerizing spiroglycol and cyclohexane dicarboxylic acid.

* * * * *